(12) United States Patent
Nii et al.

(10) Patent No.: US 6,921,591 B2
(45) Date of Patent: Jul. 26, 2005

(54) LUMINESCENT DEVICE MATERIAL, LUMINESCENT DEVICE USING THE SAME, AND AMINE COMPOUND

(75) Inventors: Kazumi Nii, Kanagawa (JP); Terukazu Yanagi, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/686,663

(22) Filed: Oct. 17, 2003

(65) Prior Publication Data

US 2004/0086748 A1 May 6, 2004

Related U.S. Application Data

(62) Division of application No. 09/499,460, filed on Feb. 7, 2000, now Pat. No. 6,689,491.

(30) Foreign Application Priority Data

| Feb. 8, 1999 | (JP) | ................................. P. 11-30190 |
| Mar. 12, 1999 | (JP) | ................................. P. 11-66923 |
| Jul. 23, 1999 | (JP) | ................................. P. 11-209820 |
| Aug. 24, 1999 | (JP) | ................................. P. 11-237266 |

(51) Int. Cl.[7] ................... H05B 33/14; C07C 211/00
(52) U.S. Cl. ................... 428/690; 428/917; 428/704; 313/504; 313/506; 252/301.16; 252/301.32; 257/40; 257/103; 564/305
(58) Field of Search ................. 428/690, 917, 428/704; 313/504, 506; 252/301.16, 301.32; 257/40, 103; 564/305

(56) References Cited

U.S. PATENT DOCUMENTS

| 4,469,768 A | 9/1984 | Horie et al. |
| 5,521,041 A | 5/1996 | Miyamoto et al. |

FOREIGN PATENT DOCUMENTS

| JP | 3-163189 A | 7/1991 |
| JP | 06-017046 A | 1/1994 |
| JP | 07-120947 | * 5/1995 | ............ G03G/5/06 |
| JP | 8-97465 A | 4/1996 |
| JP | 11-329728 A | 11/1999 |

OTHER PUBLICATIONS

Translation of JP–06–017046.*
Translation of JP–07–120947.*

* cited by examiner

Primary Examiner—Stephen Stein
Assistant Examiner—Ling Xu
(74) Attorney, Agent, or Firm—Sughrue Mion, PLLC

(57) ABSTRACT

An organic luminescent device material, comprising an amine compound represented by the following formula (I):

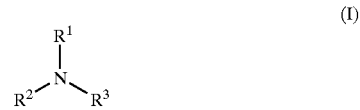

(I)

wherein $R^1$, $R^2$ and $R^3$, which are the same or different, each represents an unsubstituted or substituted aryl group, an unsubstituted or substituted heterocyclic group or an unsubstituted or substituted aliphatic hydrocarbon group, provided that at least two among $R^1$, $R^2$ and $R^3$ are each an unsubstituted or substituted aryl or heterocyclic group; or any two among $R^1$, $R^2$ and $R^3$ combine with each other to complete a ring; provided that at least one among $R^1$, $R^2$ and $R^3$ has a moiety represented by the following formula (II),

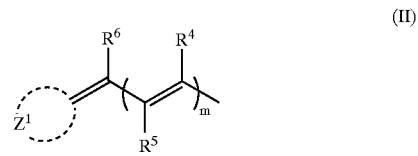

(II)

wherein $R^4$, $R^5$ and $R^6$ each represents a hydrogen atom or a substituent group, $Z^1$ represents atoms forming a 5, 6 or 7-membered ring, and m represents 0, 1 or 2.

16 Claims, No Drawings

LUMINESCENT DEVICE MATERIAL, LUMINESCENT DEVICE USING THE SAME, AND AMINE COMPOUND

CROSS REFERENCE TO RELATED APPLICATION

This is a Divisional Application of prior application Ser. No. 09/499,460 filed Feb. 7, 2000 now U.S. Pat. No. 6,689,491; the disclosure of which is incorporated herein by reference.

FIELD OF THE INVENTION

The present invention relates to an organic luminescent device material used for a plane light source and a plane display, and to an organic luminescent device having high luminance. More specifically, the invention is concerned with a luminescent material capable of emitting a high-luminance light in the green to red region with high efficiency under a low applied voltage and a luminescent device using such a material. Further, the invention relates to novel compounds capable of producing fluorescence.

BACKGROUND OF THE INVENTION

The organic luminescence devices utilizing organic substances have favorable prospects for the use as low-priced large-size full color display device of solid luminophor type, and have been developed in large numbers. In general, an organic luminescent device is constituted of a luminescent layer and a pair of facing electrodes between which the luminescent layer is sandwiched. The luminescence is a phenomenon that, when an electric field is impressed between both electrodes, the negative electrode emits electrons and the positive electrode emits positive holes and these electrons and positive holes are injected into a luminescent layer and recombined therein to return the energy level to the valence electron band from the conduction band, thereby liberating the energy as light.

Although conventional organic luminescent devices require high driving voltage and have low luminance and low luminous efficiency, the organic EL device comprising a lamination of thin films containing organic compounds which luminesce with high fluorescent quantum efficiency when a low voltage of 10 V or below is impressed thereon has recently been proposed (*Applied Physics Letters*, 51, p.913 (1987)) and much attention has been focused thereon. More specifically, such a device produces green luminescence of high luminance by using a metallic chelate complex in the electron-transporting layer, a fluorescent substance in the luminescent layer and an amine compound in a positive hole-transporting layer. Further, when the utilization of organic luminescent devices as full color display or light source is intended, the devices are required to give the three primary colors or white color from a practical point of view. Such being the case, the devices doped with fluorescent dyes to emit light of a desired color were reported (*Journal of Applied Physics*, vol. 65, p. 3610 (1989)). The technique adopted therein is effective particularly in the case of red luminescence where the density quenching is so serious that it is difficult to form a luminous layer with a fluorescent dye alone, and satisfactory color purity and high luminance are achieved thereby. However, it bears a problem such that, in producing the device doped with a dye by the use of an evaporation technique, a host material and a slight amount of fluorescent dye are co-evaporated; as a result, the operation is complicated and the devices produced tend to be uneven in performance. From the viewpoint of simplifying the production process and ensuring even performance for the products, therefore, it has been desired to develop luminescent materials having satisfactory color purity and enabling the formation of a luminescent layer with a dye alone, especially a red luminescent material which can achieve satisfactory chromaticity and high luminance even when it form a luminescent layer by itself.

On the other hand, although the organic luminescent devices which are successful in achieving high-luminance luminescence are devices comprising organic substances laminated by vacuum evaporation, the production of devices in accordance with a coating method is advantageous from the viewpoints of simplicity of the production process, processability and easiness of size expansion. However, the devices produced by conventional coating methods are inferior to the devices produced by evaporation methods in luminance and luminous efficiency, and so the big problem which confronts them is to achieve highly efficient luminescence having high luminance. Further, the device comprising a coating of the organic low molecular compound dispersed in an organic polymer medium has a problem that, when the device is made to luminesce for a long time, the planar luminescence of even quality becomes hard to obtain due to aggregation of the organic low molecular weight compound.

In recent years, various substances having fluorescence have also been used for filter dyes, color conversion filters, dyes for a photographic material, sensitizing dyes, pulp coloring dyes, laser dyes, fluorescent drugs for medical diagnosis and organic luminescent device materials, and the demands therefor have been growing. However, there are known only few red fluorescent dyes having strong fluorescence intensity and high color purity, and so the development of new materials has been desired.

SUMMARY OF THE INVENTION

A first object of the invention is to provide a luminescent device material and a luminescent device which can give off red luminescence of high color purity.

A second object of the invention is to provide a luminescent device material and a luminescent device which can give off high-luminance, even-quality, planar luminescence in the green to red region with high efficiency when it is driven at a low voltage, and further ensure steady performance upon repeated use.

A third object of the invention is to provide a device capable of ensuring consistent performance in every product thereof and a material which enables the production of such a device and the luminescence in the green to red region.

A fourth object of the invention is to provide a luminescent device material which enables the device to luminesce with high luminance and high efficiency even when it is produced by a coating method and a luminescent device using such a material.

A fifth object of the invention is to provide a compound capable of giving off fluorescence of high intensity in the green to red region.

A sixth object of the invention is to provide a luminescent device having a high thermal durability.

Embodiments [1]–[19] are set forth below:

[1] A luminescent device material, comprising a compound represented by the following formula (I):

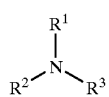

(I)

wherein $R^1$, $R^2$ and $R^3$, which are the same or different, each represents an unsubstituted or substituted aryl group, an unsubstituted or substituted heterocyclic group or an unsubstituted or substituted aliphatic hydrocarbon group, provided that at least two among $R^1$, $R^2$ and $R^3$ are each an unsubstituted or substituted aryl or heterocyclic group; any two among $R^1$, $R^2$ and $R^3$ may combine with each other to complete a ring; provided that at least one among $R^1$, $R^2$ and $R^3$ has a moiety represented by the following formula (II),

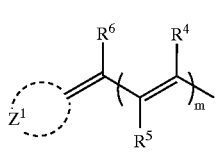

(II)

wherein $R^4$, $R^5$ and $R^6$ each represents a hydrogen atom or a substituent group, $Z^1$ represents atoms (an atomic group) forming a 5, 6 or 7-membered ring, and m represents 0, 1 or 2.

[2] A luminescent device material according to Embodiment [1], wherein the compound of formula (I) is a compound represented by the following formula (III):

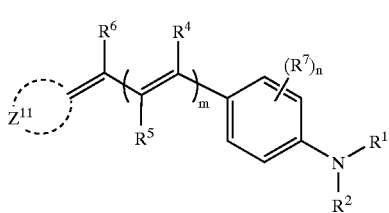

(III)

wherein $R^1$ and $R^2$, which are the same or different, each represents an aryl group, a heterocyclic group or an aliphatic hydrocarbon group, provided that at least either of them is an aryl group or a heterocyclic group, or $R^1$ and $R^2$ combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $Z^{11}$ represents atoms forming a 5, 6 or 7-membered ring; and m represents 0, 1 or 2.

[3] A luminescent device material according to Embodiment [2], wherein the compound of formula (III) is a compound represented by the following formula (IV):

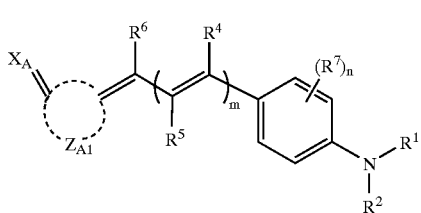

(IV)

wherein $R^1$ and $R^2$, which are the same or different, each represents an aryl group, a heterocyclic group or an aliphatic hydrocarbon group, provided that at least either of them is an aryl group or a heterocyclic group, or $R^1$ and $R^2$ combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $X_{A1}$ represents an oxygen atom, a sulfur atom, N—$R_A1$ or $CR_A2R_A3$; $R_A1$, $R_A2$ and $R_A3$ each represent an hydrogen atom or a substituent group; $Z_{A1}$ represents atoms forming a 5, 6 or 7-membered ring; and m represents 0, 1 or 2.

[4] A luminescent device material according to Embodiment [3], wherein the compound of formula (IV) is a compound represented by the following formula (V):

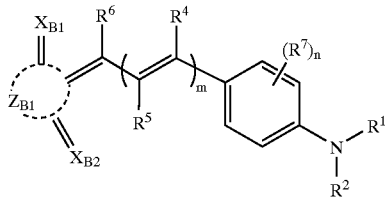

(V)

wherein $R^1$ and $R^2$, which are the same or different, each represents an aryl group, a heterocyclic group or an aliphatic hydrocarbon group, provided that at least either of them is an aryl group or a heterocyclic group, or $R^1$ and $R^2$ combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $X_{B1}$ and $X_{B2}$ each represent an oxygen atom, a sulfur atom, N—$R_B1$ or $CR_B2R_B3$; $R_B1$, $R_B2$ and $R_B3$ each represent a hydrogen atom or a substituent group; $Z_{B1}$ represents atoms forming a 5, 6 or 7-membered ring, provided that the 5-membered ring formed by $Z_{B1}$ is a substituted 1,3-indanedione nucleus, a heterocyclic ring-condensed cyclopenta-1,3-dione nucleus or a 3,5-pyrazolidinedione nucleus; and m represents 0, 1 or 2.

[5] A luminescent device material according to Embodiment [3], wherein the compound of formula (IV) is a compound represented by the following formula (VI):

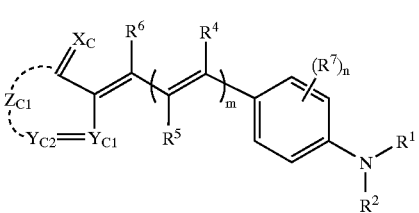

(VI)

wherein $R^1$ and $R^2$, which are the same or different, each represents an aryl group, a heterocyclic group or an aliphatic hydrocarbon group, provided that at least either of them is an aryl group or a heterocyclic group, or $R^1$ and $R^2$ combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $X_C$ represents an oxygen atom, a sulfur atom, N—$R_C1$ or $CR_C2R_C3$; $R_C1$, $R_C2$ and $R_C3$ each represent a hydrogen atom or a substituent group; $Y_{C1}$ and $Y_{C2}$ each represent a nitrogen atom or C—$R_C4$; $R_C4$ represents a hydrogen atom or a substituent group; $Z_{C1}$ represents atoms completing a 5, 6 or 7-membered ring, provided that the 5-membered ring completed by $Z_{C1}$ is an isooxazolinone nucleus, an oxazolinone nucleus, a furanone nucleus, an oxyindole nucleus or an imidazolidone nucleus; and m represents 0, 1 or 2.

[6] A luminescent device material according to Embodiment [3], wherein the compound of formula (IV) is a compound represented by the following formula (VII):

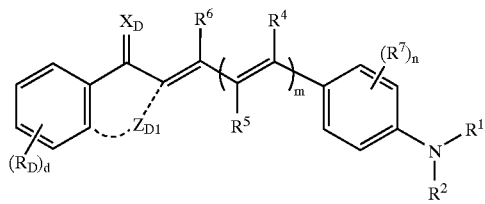

(VII)

wherein $R^1$ and $R^2$, which are the same or different, each represents an aryl group, a heterocyclic group or an aliphatic hydrocarbon group, provided that at least either of them is an aryl group or a heterocyclic group; $R^1$ and $R^2$ may combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $X_D$ represents an oxygen atom, a sulfur atom, N—$R_D1$ or $CR_D2R_D3$; $R_D1$, $R_D2$ and $R_D3$ each represent a hydrogen atom or a substituent group; $Z_{D1}$ represents atoms completing a 5, 6 or 7-membered ring; m represents 0, 1 or 2: and $R_D$ represents a substituent group and d represents an integer of 0 to 4, wherein when d is 2, 3 or 4 the $R_D$ groups are the same or different.

[7] A luminescent device material according to Embodiment [3], wherein the compound of formula (IV) is a compound represented by the following formula (VIII):

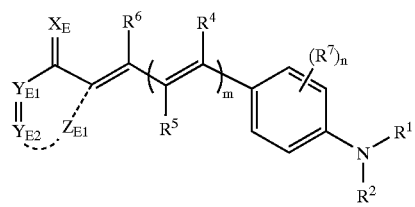

(VIII)

wherein $R^1$ and $R^2$, which are the same or different, each represents an aryl group, a heterocyclic group or an aliphatic hydrocarbon group, provided that at least either of them is an aryl group or a heterocyclic group; $R^1$ and $R^2$ may combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $X_E$ represents an oxygen atom, a sulfur atom, N—$R_E1$ or $CR_E2R_E3$; $R_E1$, $R_E2$ and $R_E3$ each represent a hydrogen atom or a substituent group; $Y_{E1}$ and $Y_{E2}$ each represent a nitrogen atom or C—$R_E4$; $R_E4$ represents a hydrogen atom or a substituent group; $Z_{E1}$ represents atoms completing a 5, 6 or 7-membered ring; and m represents 0, 1 or 2.

[8] A luminescent device material according to Embodiment [3], wherein the compound of formula (IV) is a compound represented by the following formula (IX):

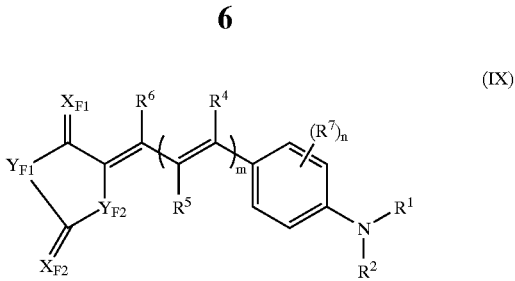

(IX)

wherein $R^1$ and $R^2$, which are the same or different, each represents an aryl group, a heterocyclic group or an aliphatic hydrocarbon group, provided that at least either of them is an aryl group or a heterocyclic group, $R^1$ and $R^2$ may combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $X_{F1}$ and $X_{F2}$ each represents an oxygen atom, a sulfur atom, N—$R_F1$ or $CR_F2R_F3$; $R_F1$, $R_F2$ and $R_F3$ each represent a hydrogen atom or a substituent group; $Y_{F1}$ and $Y_{F2}$ each represent an oxygen atom, a sulfur atom or N—$R_F5$; $R_F5$ represents a hydrogen atom or a substituent group; and m represents 0, 1 or 2.

[9] A luminescent device material according to Embodiment [3], wherein the compound of formula (IV) is a compound represented by the following formula (X):

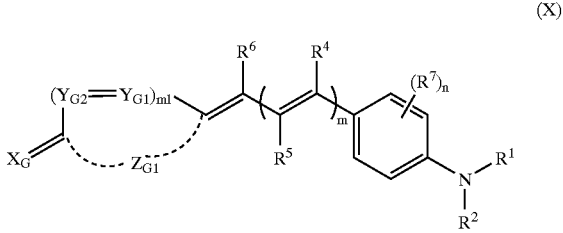

(X)

wherein $R^1$ and $R^2$, which are the same or different, each represents an aryl group, a heterocyclic group or an aliphatic hydrocarbon group, provided that at least either of them is an aryl group or a heterocyclic group, or $R^1$ and $R^2$ combine with each other to complete a ring; $R^7$ represents a substituent group and n represents an integer of 0 to 4, wherein when n is 2, 3 or 4 the $R^7$ groups are the same or different; $R^4$, $R^5$ and $R^6$ each represent a hydrogen atom or a substituent group; $X_G$ represents an oxygen atom, a sulfur atom, N—$R_G1$ or $CR_G2R_G3$; $R_G1$, $R_G2$ and $R_G3$ each represent a hydrogen atom or a substituent group; $Y_{G1}$ and $Y_{G2}$ each represent a nitrogen atom or C—$R_G4$; $R_G4$ represents a hydrogen atom or a substituent group; $m_1$ represents 1 or 2; $Z_{G1}$ represents atoms completing a 5, 6 or 7-membered ring; and m represents 0, 1 or 2.

[10] A styrylamine compound having a structure represented by the following formula (XI):

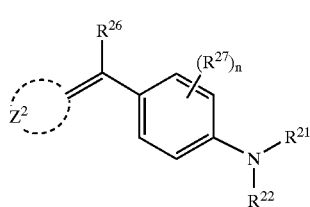

(XI)

wherein $R^{21}$ and $R^{22}$, which are the same or different, each represent an aryl group or a heterocyclic group, $R^{21}$ and $R^{22}$ may combine with each other to form a ring; $R^{27}$ represents a substituent group and n represents an integer of 0 to 4, wherein when n is 2, 3 or 4 the $R^{27}$ groups are the same or different; $R^{26}$ represents a hydrogen atom, an alkyl group, an alkenyl group, an acyl group, a sulfonyl group, an alkoxycarbonyl group, a carbonamido group or a cyano group; and $Z^2$ represents a 1,3-indanedione nucleus having substituent groups which combine with each other to complete a condensed ring or which are each an alkyl, aryl, heterocyclic, alkenyl or silyl group, a furanone nucleus, an oxyindole nucleus, an imidazolidone nucleus, a dioxobenzothophene-3-one nucleus, a coumaranone nucleus, a 1-indanone nucleus substituted at the 3-position by an alkyl, aryl or heterocyclic group, a benzofuran-3-one nucleus, a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, 2,4-imidazolidinedione nucleus, 2-thio-2,4-imidazolidinedione nucleus, a 2-imidazoline-5-one nucleus or a nucleus formed by replacing the carbonyl oxygen or the thiocarbonyl sulfur attached to the cyclic skeleton constituting $Z^2$ with N—$R^{2a}$ or $CR^{2b}R^{2c}$, wherein $R^{2a}$, $R^{2b}$ and $R^{2c}$ each represent a hydrogen atom or a substituent group.

[11] A luminescent device material according to Embodiment [1], wherein the compound of formula (I) is a compound represented by the following formula (XII):

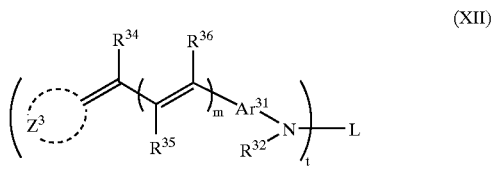

(XII)

wherein $Ar^{31}$ represents an arylene group or a divalent heterocyclic group; $R^{32}$ represents an aryl group, a heterocyclic group or an aliphatic hydrocarbon group; $R^{34}$, $R^{35}$ and $R^{36}$ each represent a hydrogen atom or a substituent group; $Z^3$ represents atoms forming a 5, 6 or 7-membered ring; m represents 0, 1 or 2; t is an integer of at least 2, and one combination made with $Ar^{31}$, $R^{32}$, $R^{34}$, $R^{35}$, $R^{36}$, $Z^3$ and m is the same as or different from another combination made therewith; and L represents a t-valent linkage group.

[12] A luminescent device material according to Embodiment [1], wherein the compound of formula (I) is a compound represented by the following formula (XIII):

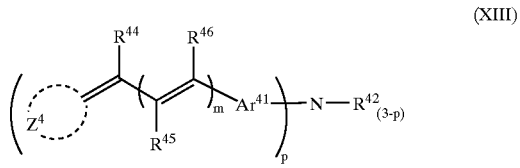

(XIII)

wherein $Ar^{41}$ represents an arylene group or a divalent heterocyclic group; $R^{42}$ represents an aryl group, a heterocyclic group or an aliphatic hydrocarbon group; $R^{44}$, $R^{45}$ and $R^{46}$ each represent a hydrogen atom or a substituent group; $Z^4$ represents atoms forming a 5, 6 or 7-membered ring; m represents 0, 1 or 2; p represents 2 or 3, and two or three combinations made with $Ar^{41}$, $R^{42}$, $R^{44}$, $R^{45}$, $R^{46}$, $Z^4$ and m are the same or different.

[13] A luminescent device material according to Embodiment [11], wherein the compound of formula (XII) is a compound represented by the following formula (XIV):

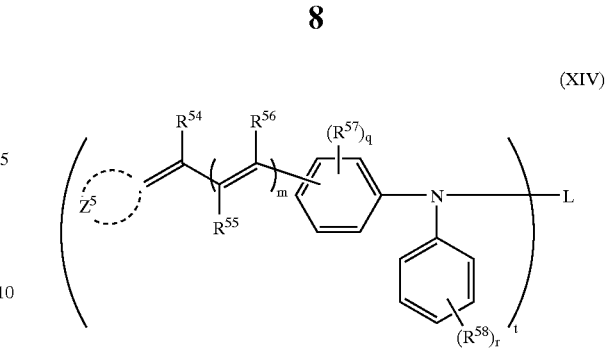

(XIV)

wherein $R^{54}$, $R^{55}$ and $R^{56}$ each represent a hydrogen atom or a substituent group; $R^{57}$ and $R^{58}$ each represent a substituent group; q represents an integer of 0 to 4, and when q is 2, 3 or 4 the $R^{57}$ groups are the same or different; r represents an integer of 0 to 5, and when r is 2, 3, 4 or 5 the $R^{58}$ groups are the same or different; $Z^5$ represents atoms forming a 5, 6 or 7-membered ring; m represents 0, 1 or 2; t represents an integer of at least 2, and one combination made with $R^{54}$, $R^{55}$, $R^{56}$, $R^{57}$, $R^{58}$, $Z^5$, m, q and r is the same as or different from another combination made therewith; and L represents a t-valent linkage group.

[14] A luminescent device material according to Embodiment [12], wherein the compound of formula (XIII) is a compound represented by the following formula (XV):

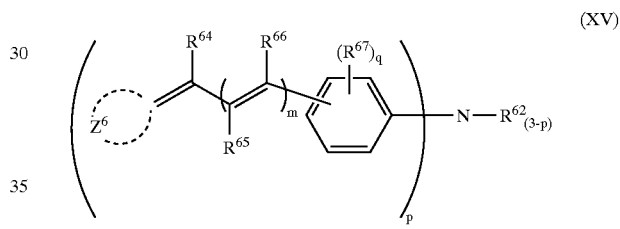

(XV)

wherein $R^{62}$ represents an aryl group, a heterocyclic group or an aliphatic hydrocarbon group; $R^{64}$, $R^{65}$ and $R^{66}$ each represent a hydrogen atom or a substituent group; $R^{67}$ represents a substituent group; q represents an integer of 0 to 4, and when q is 2, 3 or 4 the $R^{67}$ groups are the same or different; $Z^6$ represents atoms forming a 5, 6 or 7-membered ring; m represents 0, 1 or 2; p represents 2 or 3, and two or three combinations made with $R^{62}$, $R^{64}$, $R^{65}$, $R^{66}$, $R^{67}$, $Z^6$, m and q are the same or different.

[15] A luminescent device material according to Embodiment [13], wherein the compound of formula (XIV) is a compound represented by the following formula (XVI):

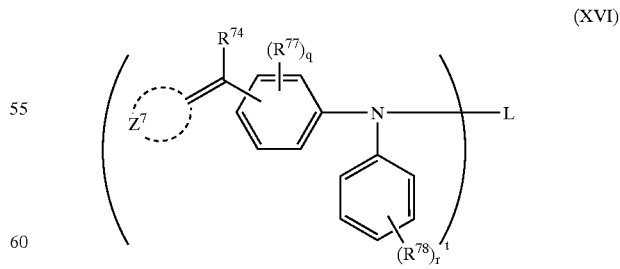

(XVI)

wherein $R^{74}$ represents a hydrogen atom or a substituent group; $R^{77}$ and $R^{78}$ each represent a substituent group; q represents an integer of 0 to 4, and when q is 2, 3 or 4 the $R^{77}$ groups are the same or different; r represents an integer of 0 to 5, and when r is 2, 3, 4 or 5 the $R^{78}$ groups are the same or different; $Z^7$ represents atoms forming a 5, 6 or 7-membered ring; t represents an integer of at least 2, and one combination made with $R^{74}$, $R^{77}$, $R^{78}$, $Z^7$, q and r is the same as or different from another combination made therewith; and L represents a t-valent linkage group.

[16] A luminescent device material according to Embodiment [15], wherein the compound of formula (XVI) is a compound represented by the following formula (XVII):

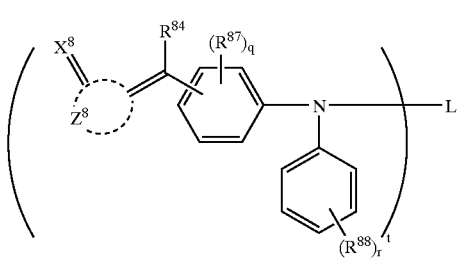

(XVII)

wherein $R^{84}$ represents a hydrogen atom or a substituent group; $R^{87}$ and $R^{88}$ each represent a substituent group; q represents an integer of 0 to 4, and when q is 2, 3 or 4 the $R^{87}$ groups are the same or different; r represents an integer of 0 to 5, and when r is 2, 3, 4 or 5 the $R^{88}$ groups are the same or different; $Z^8$ represents atoms forming a 5, 6 or 7-membered ring; $X^8$ represents an oxygen atom, a sulfur atom, N—$R^{A1}$ or $CR^{A2}R^{A3}$; $R^{A1}$, $R^{A2}$ and $R^{A3}$ each represent a hydrogen atom or a substituent group; t represents an integer of at least 2, and one combination made with $R^{84}$, $R^{87}$, $R^{88}$, $Z^8$, $X^8$, q and r is the same as or different from another combination made therewith; and L represents a t-valent linkage group.

[17] A styrylamine compound having a structure represented by the following formula (XVIII):

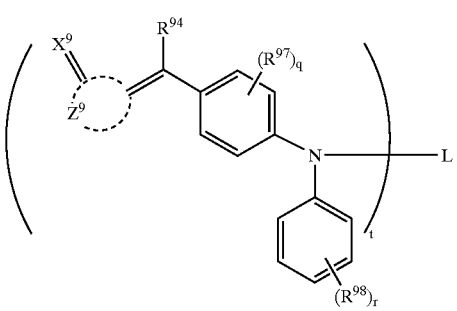

(XVIII)

wherein $R^{94}$ represents a hydrogen atom or a substituent group; $R^{97}$ and $R^{98}$ each represent a substituent group; q represents an integer of 0 to 4, and when q is 2, 3 or 4 the $R^{97}$ groups are the same or different; r represents an integer of 0 to 5, and when r is 2, 3, 4 or 5 the $R^{98}$ groups are the same or different; $Z^9$ represents atoms forming a 5, 6 or 7-membered ring; $X^9$ represents an oxygen atom, a sulfur atom, N—$R^{A1}$ or $CR^{A2}R^{A3}$; $R^{A1}$, $R^{A2}$ and $R^{A3}$ each represent a hydrogen atom or a substituent group; t represents an integer of at least 2, and one combination made with $R^{94}$, $R^{97}$, $R^{98}$, $Z^9$, $X^9$, q and r is the same as or different from another combination made therewith; and L represents a t-valent linkage group.

[18] A luminescent device having at least one layer of an organic thin film between electrodes, with the device comprising at least one of the compounds represented by formulae (I) and (III) to (XVIII) as defined in Embodiments [1] to [17] respectively.

[19] A luminescent device having at least one layer of an organic thin film between electrodes, with the device comprising at least one layer wherein at least one of the compounds represented by formulae (I) and (III) to (XVIII) as defined in Embodiments [1]–[17] respectively is dispersed in a polymer.

DETAILED DESCRIPTION OF THE INVENTION

Firstly, the compound represented by the foregoing formula (I) is described below in detail.

$R^1$, $R^2$ and $R^3$ in formula (I) may be the same or different. And each of them represents an aryl group, a heterocyclic group or an aliphatic hydrocarbon group, provided that at least two of them are each an aryl group or a heterocyclic group.

Suitable examples of an aryl group represented by $R^1$, $R^2$ and $R^3$ each include monocyclic and bicyclic aryl groups containing 6 to 30 carbon atoms (such as phenyl and naphthyl groups), preferably phenyl and naphthyl groups containing 6 to 20 carbon atoms, particularly preferably phenyl and naphthyl groups containing 6 to 14 carbon atoms.

The heterocyclic group represented by $R^1$, $R^2$ and $R^3$ each is a 3- to 10-membered, saturated or unsaturated heterocyclic group containing at least one nitrogen, oxygen or sulfur atom. Such a heterocyclic ring may be a single ring, or a condensed ring formed by fusing together with another ring.

Suitable examples of a heterocyclic group include 5- to 6-membered aromatic heterocyclic groups, preferably nitrogen, oxygen or/and sulfur-containing 5- to 6-membered aromatic heterocyclic groups, particularly preferably 5- to 6-membered aromatic heterocyclic groups containing one to two nitrogen atoms or/and one to two sulfur atoms. Examples of such a heterocyclic ring include pyrrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthylizine, quinoxaline, quinazoline, cinnoline, pteridine, acridine, phenanthroline, phenazine, tetrazole, benzimidazole, benzoxazole, benzothiazole, benzotriazole and tetraazaindene. Of these heterocyclic rings, thiophene, pyridine and quinoline are preferred over the others.

The aliphatic hydrocarbon groups represented by $R^1$, $R^2$ and $R^3$ each include straight-chain, branched or cyclic alkyl groups (containing preferably 1 to 20 carbon atoms, more preferably 1 to 12 carbon atoms, particularly preferably 1 to 8 carbon atoms, such as methyl, ethyl, isopropyl, t-butyl, n-octyl, n-decyl, n-hexadecyl, cyclopropyl, cyclopentyl and cyclohexyl), alkenyl groups (containing preferably 2 to 20 carbon atoms, more preferably 2 to 12 carbon atoms, particularly preferably 2 to 8 carbon atoms, such as vinyl, allyl, 2-butenyl and 3-pentenyl) and alkynyl groups (containing preferably 2 to 20 carbon atoms, more preferably 2 to 12 carbon atoms, particularly preferably 2 to 8 carbon atoms, such as propargyl and 3-pentynyl). Of these groups, alkyl groups are preferred over the others.

The aryl, heterocyclic, or aliphatic hydrocarbon group represented by $R^1$, $R^2$ and $R^3$ each may have a substituent group. Examples of such a substituent group include alkyl groups (containing preferably 1 to 20 carbon atoms, more preferably 1 to 12 carbon atoms, particularly preferably 1 to 8 carbon atoms, such as methyl, ethyl, iso-propyl, tert-butyl, n-octyl, n-decyl, n-hexadecyl, cyclopropyl, cyclopentyl and cyclohexyl), alkenyl groups (containing preferably 2 to 20 carbon atoms, more preferably 2 to 12 carbon atoms, particularly preferably 2 to 8 carbon atoms, such as vinyl, allyl, 2-butenyl and 3-pentenyl), alkynyl groups (containing preferably 2 to 20 carbon atoms, more preferably 2 to 12 carbon atoms, particularly preferably 2 to 8 carbon atoms, such as propargyl and 3-pentynyl), aryl groups (containing preferably 6 to 30 carbon atoms, more preferably 6 to 20 carbon atoms, particularly preferably 6 to 12 carbon atoms, such as phenyl, p-methylphenyl and naphthyl), amino groups (including an unsubstituted amino group and amino groups substituted, e.g., by alkyl, alkenyl, aralkyl, aryl or/and heterocyclic groups, and each containing preferably 0 to 20 carbon atoms, more preferably 0 to 10 carbon atoms, particularly preferably 0 to 6 carbon atoms, such as amino, methylamino, dimethylamino, diethylamino, dibenzylamino and phenylamino), alkoxy groups (containing preferably 1 to 20 carbon atoms, more preferably 1 to 12 carbon atoms, particularly preferably 1 to 8 carbon atoms, such as methoxy, ethoxy and butoxy), aryloxy groups (containing preferably 6 to 20 carbon atoms, more preferably 6 to 16 carbon atoms, particularly preferably 6 to 12 carbon atoms, such as phenoxy and 2-naphthyloxy), acyl groups (containing preferably 1 to 20 carbon atoms, more preferably 1 to 16 carbon atoms, particularly preferably 1 to 12 carbon atoms, such as acetyl, benzoyl, formyl and pivaroyl), alkoxycarbonyl groups (containing preferably 2 to 20 carbon atoms, more preferably 2 to 16 carbon atoms, particularly preferably 2 to 12 carbon atoms, such as methoxycarbonyl and ethoxycarbonyl), aryloxycarbonyl groups (containing preferably 7 to 20 carbon atoms, more preferably 7 to 16 carbon atoms, particularly preferably 7 to 10 carbon atoms, such as phenyloxycarbonyl), acyloxy groups (containing preferably 2 to 20 carbon atoms, more preferably 2 to 16 carbon atoms, particularly preferably 2 to 10 carbon atoms, such as acetoxy and benzoyloxy), acylamino groups (containing preferably 2 to 20 carbon atoms, more preferably 2 to 16 carbon atoms, particularly preferably 2 to 10 carbon atoms, such as acetylamino and benzoylamino), alkoxycarbonylamino groups (containing preferably 2 to 20 carbon atoms, more preferably 2 to 16 carbon atoms, particularly preferably 2 to 12 carbon atoms, such as methoxycarbonylamino), aryloxycarbonylamino groups (containing preferably 7 to 20 carbon atoms, more preferably 7 to 16 carbon atoms, particularly preferably 7 to 12 carbon atoms, such as phenyloxycarbonylamino), sulfonylamino groups (containing preferably 1 to 20 carbon atoms, more preferably 1 to 16 carbon atoms, particularly preferably 1 to 12 carbon atoms, such as methanesulfonylamino and benzenesulfonylamino), sulfamoyl groups (containing preferably 0 to 20 carbon atoms, more preferably 0 to 16 carbon atoms, particularly preferably 0 to 12 carbon atoms, such as sulfamoyl, methylsulfamoyl, dimethylsulfamoyl and phenylsulfamoyl), carbamoyl groups (containing preferably 1 to 20 carbon atoms, more preferably 1 to 16 carbon atoms, particularly preferably 1 to 12 carbon atoms, such as carbamoyl, methylcarbamoyl, diethylcarbamoyl and phenylcarbamoyl), alkylthio groups (containing preferably 1 to 20 carbon atoms, more preferably 1 to 16 carbon atoms, particularly preferably 1 to 12 carbon atoms, such as methylthio and ethylthio), arythio groups (containing preferably 6 to 20 carbon atoms, more preferably 6 to 16 carbon atoms, particularly preferably 6 to 12 carbon atoms, such as phenylthio), sulfonyl groups (containing preferably 1 to 20 carbon atoms, more preferably 1 to 16 carbon atoms, particularly preferably 1 to 12 carbon atoms, such as mesyl and tosyl), sulfinyl groups (containing preferably 1 to 20 carbon atoms, more preferably 1 to 16 carbon atoms, particularly preferably 1 to 12 carbon atoms, such as methanesulfinyl and benzenesulfinyl), ureido groups (containing preferably 1 to 20 carbon atoms, more preferably 1 to 16 carbon atoms, particularly preferably 1 to 12 carbon atoms, such as ureido, methylureido and phenylureido), phosphoric acid amido groups (containing preferably 1 to 20 carbon atoms, more preferably 1 to 16 carbon atoms, particularly preferably 1 to 12 carbon atoms, such as diethylphosphoric acid amido and phenylphosphoric acid amido), a hydroxyl group, a mercapto group, halogen atoms (such as fluorine, chlorine, bromine and iodine atoms), a cyano group, a sulfo group, a carboxyl group, a nitro group, a hydroxamic acid group, a sulfino group, a hydrazino group, an imino group, heterocyclic groups (containing preferably 1 to 20 carbon atoms, more preferably 1 to 12 carbon atoms, and further containing nitrogen, oxygen or/and sulfur atoms as hetero atom(s), such as groups derived from pyrrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthylizine, quinoxaline, quinazoline, cinnoline, pteridine, acridine, phenanthroline, phenazine, tetrazole, benzimidazole, benzoxazole, benzothiazole, benzotriazole and tetraazaindene) and silyl groups (containing preferably 3 to 40 carbon atoms, more preferably 3 to 30 carbon atoms, particularly preferably 3 to 24 carbon atoms, such as trimethylsilyl and triphenylsilyl). These substituent groups each may further be substituted. When two or more substituent groups are present, they may be the same or different and, if possible, may form a ring by combining with each other.

Of the substituent groups recited above, alkyl, alkenyl, aralkyl, aryl, alkoxy, amino, acyl, alkoxycarbonyl, aryloxycarbonyl, carbonylamino, sulfonylamino, sulfamoyl, carbamoyl, hydroxyl, silyl and heterocyclic groups are preferred over the other. Among these groups, alkyl, alkenyl, aralkyl, aryl, alkoxy, amino, carbonylamino, sulfonylamino, silyl and heterocyclic groups are more favorable. In particular, alkyl, alkenyl, aryl, alkoxy, substituted amino and silyl groups are advantageous over the others.

The term "substituted amino group" as used herein refers to the group represented by —$NR_a(R_b)$, wherein $R_a$ and $R_b$ may be the same or different and they each represent an alkyl group, an alkenyl group, an aralkyl group, an aryl group or a heterocyclic group.

Moreover, at least one among the groups $R^1$, $R^2$ and $R^3$ contains a moiety represented by the following formula (II).

The expression "contains a moiety represented by formula (II)" as used herein means that the substituent group of an aryl, heterocyclic or aliphatic hydrocarbon group represented by $R^1$, $R^2$ and $R^3$ each may be the moiety of formula (II) or may further be substituted by the moiety of formula (II).

The formula (II) is as follows:

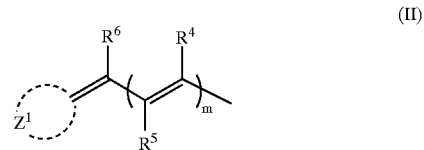

(II)

wherein $R^4$, $R^5$ and $R^6$ each represent a hydrogen atom or a substituent group, $Z^1$ represents atoms forming a 5, 6 or 7-membered ring, and m represents 0, 1 or 2.

Further, any two among $R^4$, $R^5$ and $R^6$ may combine with each other to complete a ring, or each of them may combine with $R^1$, $R^2$ or $R^3$ to complete a ring. Examples of a substituent group represented by $R^4$, $R^5$ and $R^6$ each include the groups recited above as substituent groups which the aryl, heterocyclic or aliphatic hydrocarbon group represented by $R^1$, $R^2$ and $R^3$ each may have. It is desirable for m to be 0 or 1, particularly 0.

$Z^1$ represents atoms forming a 5, 6 or 7-membered ring, which may have another ring in a fused state. Suitable examples of a ring formed by $Z^1$ include rings employed as acidic nuclei in conventional merocyanine dyes.

The ring preferred as acidic nucleus represented by $Z^1$ is a ring represented by the following formula (A):

(A)

wherein $X^A$ represents an oxygen atom, a sulfur atom, N—$R^{A1}$ or $CR^{A2}R^{A3}$, $R^{A1}$, $R^{A2}$ and $R^{A3}$ each represent a hydrogen atom or a substituent group, and $Z^A$ represents atoms completing a 5, 6 or 7-membered ring, preferably constituted of any of carbon, nitrogen, oxygen and sulfur atoms.

The 5, 6 or 7-membered ring completed by $Z^A$ may further form a condensed ring.

To be concrete, $R^{A1}$ represents a hydrogen atom, an aliphatic hydrocarbon group, an aryl group or a heterocyclic group.

The aliphatic hydrocarbon group represented by $R^{A1}$ is a straight-chain, branched or cyclic alkyl group (containing preferably 1 to 30 carbon atoms, more preferably 1 to 20 carbon atoms, particularly preferably 1 to 12 carbon atoms, such as methyl, ethyl, iso-propyl, tert-butyl, n-octyl, n-decyl, n-hexadecyl, cyclopropyl, cyclopentyl or cyclohexyl), an alkenyl group (containing preferably 2 to 30 carbon atoms, more preferably 2 to 20 carbon atoms, particularly preferably 2 to 12 carbon atoms, such as vinyl, allyl, 2-butenyl or 3-pentenyl) or an alkynyl group (containing preferably 2 to 30 carbon atoms, more preferably 2 to 20 carbon atoms, particularly preferably 2 to 12 carbon atoms, such as propargyl or 3-pentynyl) preferably an alkyl group or an alkenyl group, particularly preferably a methyl group, an ethyl group, a propyl group, a butyl group or an allyl group.

The aryl group suitable for $R^{A1}$ is a monocyclic or bicyclic aryl group containing 6 ro 30 carbon atoms (e.g., phenyl or naphthyl), preferably a phenyl group containing 6 to 20 carbon atoms, particularly preferably a phenyl group containing 6 to 12 carbon atoms.

The heterocyclic group represented by $R^{A1}$ is a group derived from a 3- to 10-membered saturated or unsaturated heterocyclic ring containing at least one nigrogen, oxygen or sulfur atom. Such a ring may be a single ring or a condensed ring formed by fusion with another ring.

The heterocyclic group suitable for $R^{A1}$ is a 5 or 6-membered aromatic heterocyclic group, preferably a 5 or 6-membered nitrogen-containing aromatic heterocyclic group, particularly preferably a 5 or 6-membered aromatic heterocyclic group containing one or two nitrogen atoms. Examples of such a heterocyclic ring include pyrrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthylizine, quinoxaline, quinazoline, cinnoline, pteridine, acridine, phenanthroline, phenazine, tetrazole, benzimidazole, benzoxazole, benzothiazole, benzotriazole and tetraazaindene. Of these rings, pyrrole, imidazole, pyrazole, pyridine, pyrazine, pyridazine, triazole, triazine, indole, indazole, thiadiazole, oxadiazole, quinoline, phthalazine, quinoxaline, quinazoline, cinnoline, tetrazole, thiazole, oxazole, benzimidazole, benzoxazole, benzothiazole and benzotriazole are preferred over the others. In particular, pyridine and quinoline are advantageous over the others.

The aliphatic hydrocarbon group, the aryl group and the heterocyclic group represented by $R^{A1}$ may have a substituent group, and examples of such a substituent group include those recited above as the substituent groups which $R^1$, $R^2$ and $R^3$ can have.

The group preferred as $R^{A1}$ is an alkyl group, an alkenyl group or an aryl group, especially an alkyl group or a phenyl group.

The substituent group represented by $R^{A2}$ and $R^{A3}$ each include those recited above as the substituent groups which $R^1$, $R^2$ and $R^3$ each can have.

$R^{A2}$ and $R^{A3}$ each preferably represent a hydrogen atom, a cyano group, an oxycarbonyl group, an acyl group, a sulfonyl group, a thioether group, a carbamoyl group or a sulfamoyl group. Therein, however, the case of $R^{A2}=R^{A3}=$ hydrogen atom is not included.

The oxycarbonyl group, the acyl group, the sulfonyl group and the thioether group which $R^{A2}$ and $R^{A3}$ each can represent are respectively oxycarbonyl, acyl, sulfonyl and thioether groups substituted by an aliphatic hydrocarbon, aryl or heterocyclic group. This aliphatic hydrocarbon, aryl or heterocyclic moiety of such groups each has the same meaning as the aliphatic hydrocarbon, aryl or heterocyclic group respectively which is illustrated above as a group represented by $R^{A1}$.

The carbamoyl group and the sulfamoyl group which $R^{A2}$ and $R^{A3}$ each can represent are unsubstituted or aliphatic hydrocarbon, aryl or heterocyclic group-substituted carbamoyl and sulfamoyl groups respectively. This substituted moiety of such groups each, namely an aliphatic hydrocarbon, aryl or heterocyclic group, has the same meaning as the aliphatic hydrocarbon, aryl or heterocyclic group respectively which is illustrated above as a group represented by $R^{A1}$.

Of the acidic nuclei represented by the foregoing formula (A), the nuclei represented by the following formula (B), (C), (D), (E), (F) or (G) are employed to advantage.

Formula (B):

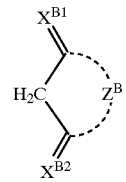

wherein $X^{B1}$ and $X^{B2}$ each represent an oxygen atom, a sulfur atom, N—$R^{B1}$ or $CR^{B2}R^{B3}$, $R^{B1}$, $R^{B2}$ and $R^{B3}$ each represent a hydrogen atom or a substituent group, and $Z^B$ represents atoms completing a 5, 6 or 7-membered ring, preferably constituted of any of carbon, nitrogen, oxygen and sulfur atoms. The 5- to 7-membered ring completed by $Z^B$ may further form a condensed ring. $R^{B1}$, $R^{B2}$ and $R^{B3}$ have the same meanings as $R^{A1}$, $R^{A2}$ and $R^{A3}$ respectively. Examples of an acidic nucleus represented by formula (B) include 1,3-indanedione nuclei, heterocyclic ring-condensed cyclopenta-1,3-dione nuclei, 3,5-pyrazolinedione nuclei, 1,3-cyclohexanedione nuclei, 1,3-dioxane-4,6-dione nuclei and 2,4,6-triketohexahydropyrimidine nuclei (including barbituric or 2-thiobarbituric acid and derivatives thereof, such as a 1-alkyl body of barbituric or 2-thiobarbituric, e.g., the 1-methyl or 1-ethyl body thereof, a 1,3-dialkyl body of barbituric or 2-thiobarbituric acid, e.g., the 1,3-dimethyl, 1,3-diethyl or 1,3-dibutyl body thereof, a 1,3-diaryl body of barbituric or 2-thiobarbituric acid, e.g., the 1,3-diphenyl, 1,3-di(p-chlorophenyl) or 1,3-di(p-ethoxycarbonylphenyl) body thereof, a 1-alkyl-1-aryl body of barbituric or 2-thiobarbituric acid, e.g., the 1-ethyl-3-phenyl body thereof, and barbituric or 2-thiobarbituric acid substituted by heterocyclic groups at the 1- and 3-positions, e.g., the 1,3-di(2-pyridyl) body of barbituric or 2-thiobarbituric acid).

More specifically, the nuclei illustrated below and derivatives thereof are suitable examples of acidic nuclei represented by formula (B):

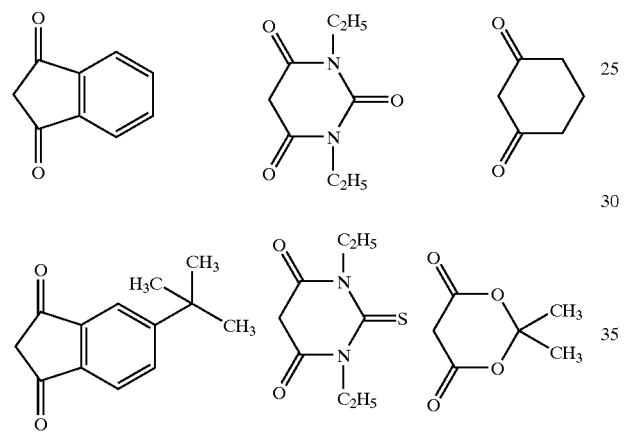

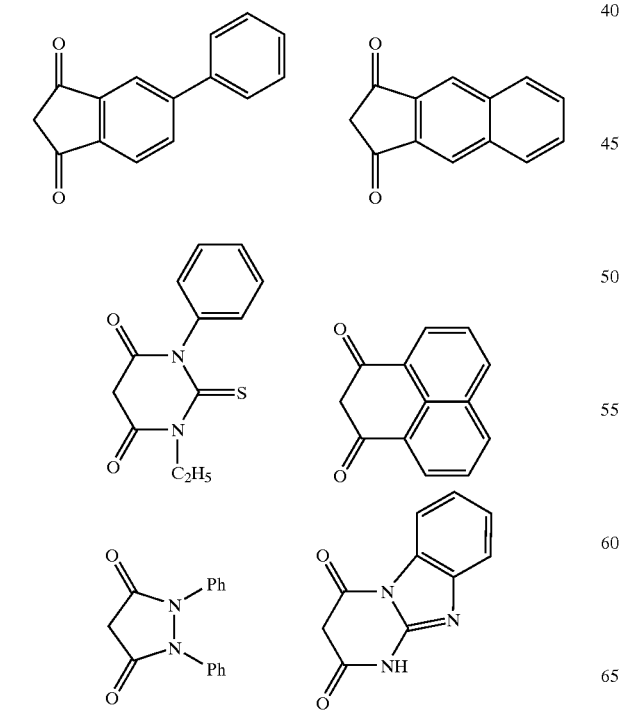

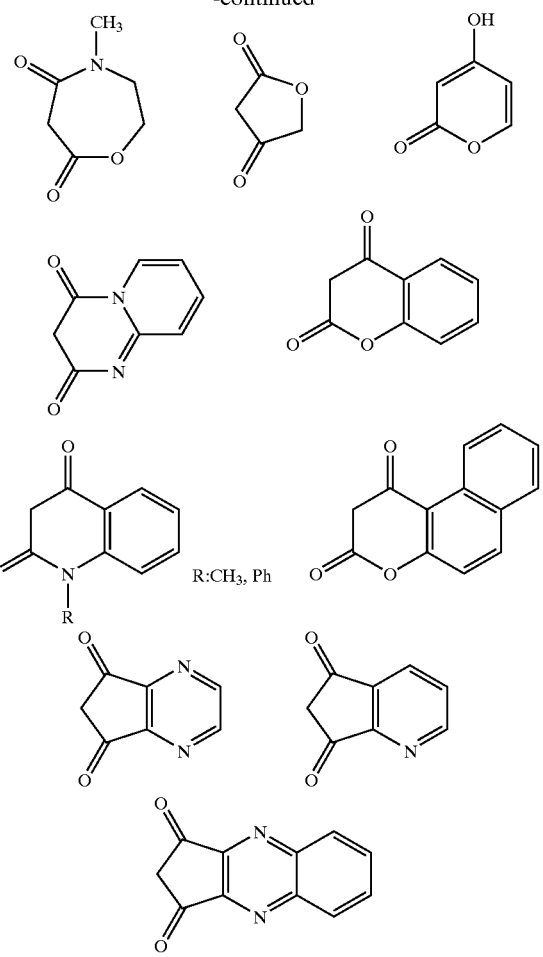

Formula (C):

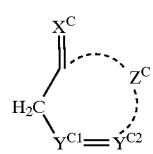

wherein $X^C$ represents an oxygen atom, a sulfur atom, $N-R^{C1}$ or $CR^{C2}R^{C3}$; $R^{C1}$, $R^{C2}$ and $R^{C3}$ each represent a hydrogen atom or a substituent group; $Y^{C1}$ and $Y^{C2}$ each represent a nitrogen atom or $C-R^{C4}$; $R^{C4}$ represents a hydrogen atom or a substituent group, examples of which include the groups recited above as substituent groups of $R^1$, $R^2$ and $R^3$ each; and $Z^C$ represents atoms completing a 5, 6 or 7-membered ring, preferably constituted of any of carbon, nitrogen, oxygen and sulfur atoms, which may further form a condensed ring. Additionally, $R^{C1}$, $R^{C2}$ and $R^{C3}$ have the same meanings as the foregoing $R^{A1}$, $R^{A2}$ and $R^{A3}$ respectively.

Examples of an acidic nucleus represented by formula (C) include pyrazolone nuclei, isooxazolinone nuclei, oxazolinone nuclei, furanone nuclei, oxyindole nuclei, imidazolidone nuclei and 1,2,3,6-tetrahydropyridine-2,6-dione nuclei.

More specifically, the nuclei illustrated below and derivatives thereof are recited as acidic nuclei of formula (C):

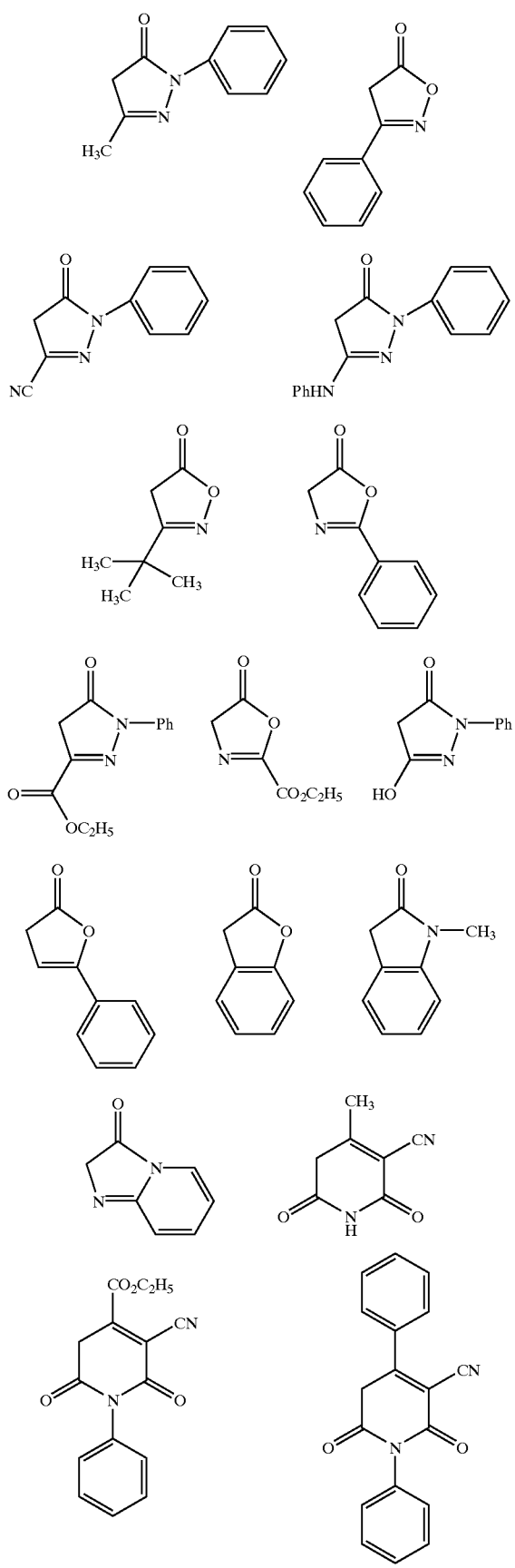

Formula (D):

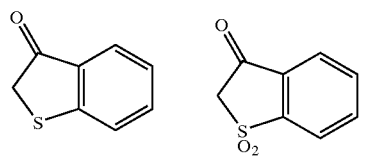

wherein $X^D$ represents an oxygen atom, a sulfur atom, $N-R^{D1}$ or $CR^{D2}R^{D3}$, $R^{D1}$, $R^{D2}$ and $R^{D3}$ each represents a hydrogen atom or a substituent group, and $Z^D$ represents atoms completing a 5, 6 or 7-membered ring, preferably constituted of any of carbon, nitrogen, oxygen and sulfur atoms. Additionally, $R^{D1}$, $R^{D2}$ and $R^{D3}$ have the same meanings as the foregoing $R^{A1}$, $R^{A2}$ and $R^{A3}$ respectively.

Examples of an acidic nucleus represented by formula (D) include the nuclei illustrated below and derivatives thereof.

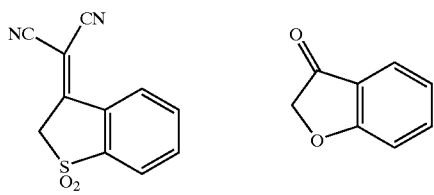

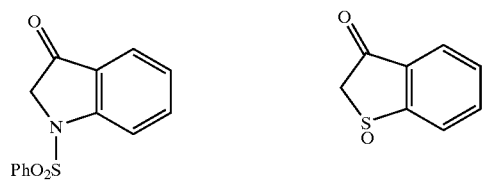

-continued

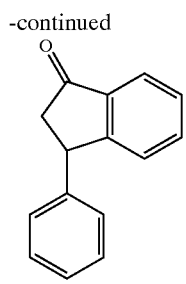

Formula (E):

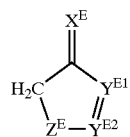

wherein $X^E$ represents an oxygen atom, a sulfur atom, $N-R^{E1}$ or $CR^{E2}R^{E3}$; $R^{E1}$, $R^{E2}$ and $R^{E3}$ each represent a hydrogen atom or a substituent group; $Y^{E1}$ and $Y^{E2}$ each represent a nitrogen atom or $C-R^{E4}$; $R^{E4}$ represents a hydrogen atom or a substituent group, examples of which include the groups recited above as substituent groups of $R^1$, $R^2$ and $R^3$ each; and $Z^E$ represents atoms completing a 5, 6 or 7-membered ring, preferably constituted of any of carbon, nitrogen, oxygen and sulfur atoms, which may further form a condensed ring. Additionally, $R^{E1}$, $R^{E2}$ and $R^{E3}$ have the same meanings as the foregoing $R^{A1}$, $R^{A2}$ and $R^{A3}$ respectively.

Examples of an acidic nucleus represented by formula (E) include the nuclei illustrated below and derivatives thereof.

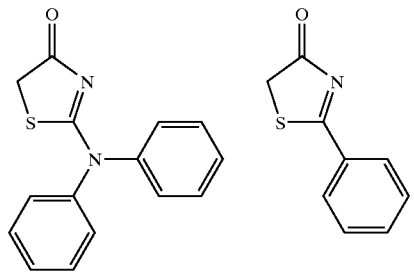

Formula (F):

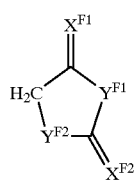

wherein $X^{F1}$ and $X^{F2}$ each represent an oxygen atom, a sulfur atom, $N-R^{F1}$ or $CR^{F2}R^{F3}$, $R^{F1}$, $R^{F2}$ and $R^{F3}$ each represent a hydrogen atom or a substituent group, and $Y^{F1}$ and $Y^{F2}$ each represent a nitrogen atom or $C-R^{F5}$. Additionally, $R^{F1}$ and $R^{F5}$ each have the same meaning as the foregoing $R^{A1}$, and $R^{F2}$ and $R^{F3}$ have the same meanings as $R^{A2}$ and $R^{A3}$ respectively. Examples of an acidic nucleus of formula (F) include 2-thio-2,4-thiazolidinedione nuclei (such as rhodanine and derivatives thereof, with examples including rhodanines substituted by an aliphatic hydrocarbon group at the 3-position, such as 3-methylrhodanine, 3-ethylrhodanine and 3-allylrhodanine, those substituted by an aryl group at the 3-position, such as 3-phenylrhodanine, and those substituted by a heterocyclic group at the 3-position, such as 3-(2-pyridyl)rhodanine), 2-thio-2,4-oxazolidinedinone nuclei, 2-thio-2,4-(3H,5H)-oxazoledione nuclei, 2-thio-2,5-thiazolidinedione nuclei, 2,4-thiazolidinedione nuclei, thiazoline-4-one nuclei, 4-thiazolidinone nuclei, 2,4-imidazolidinedione (hydantoin) nuclei, imidazoline-5-one nuclei, and analogues thereof. More specifically, the nuclei illustrated below are recited as acidic nuclei of formula (F).

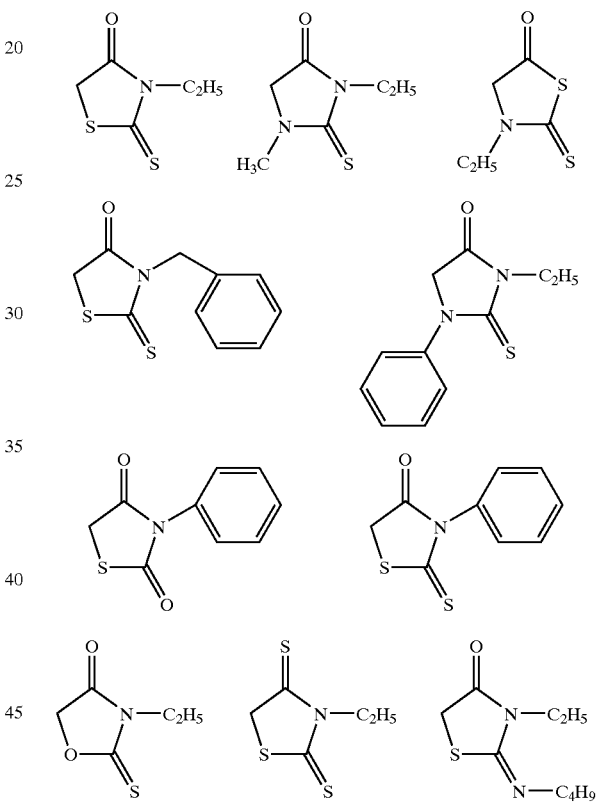

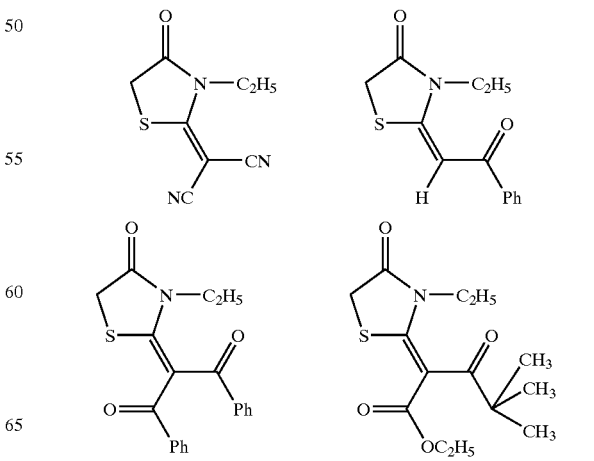

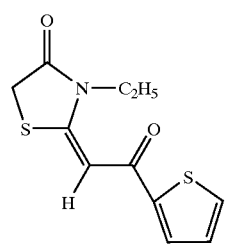

Formula (G):

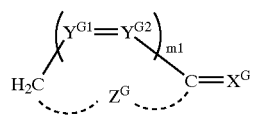

wherein $X^G$ represents an oxygen atom, a sulfur atom, $N-R^{G1}$ or $CR^{G2}R^{G3}$; $R^{G1}$, $R^{G2}$ and $R^{G3}$ each represent a hydrogen atom or a substituent group; $Y^{G1}$ and $Y^{G2}$ each represent a nitrogen atom or $C-R^{G4}$; $R^{G4}$ represents a hydrogen atom or a substituent group, examples of which include the groups recited above as substituent groups of $R^1$, $R^2$ and $R^3$ each; $m_1$ represents 1 or 2; and $Z^G$ represents atoms completing a 5, 6 or 7-membered ring, preferably constituted of any of carbon, nitrogen, oxygen and sulfur atoms, which may further form a condensed ring. Additionally, $R^{G1}$, $R^{G2}$ and $R^{G3}$ have the same meanings as the foregoing $R^{A1}$, $R^{A2}$ and $R^{A3}$ respectively.

Examples of an acidic nucleus represented by formula (G) include the nuclei illustrated below.

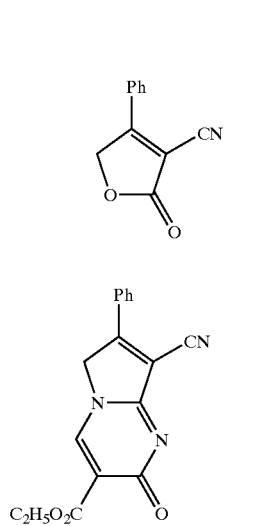

Further, one of acidic nuclei represented by formula (A) and another of them may undergo condensation at the site of $=X^A$. To take the case of a rhodanine nucleus represented by formula (F) in illustration, the following nuclei can be adduced as examples of such condensation.

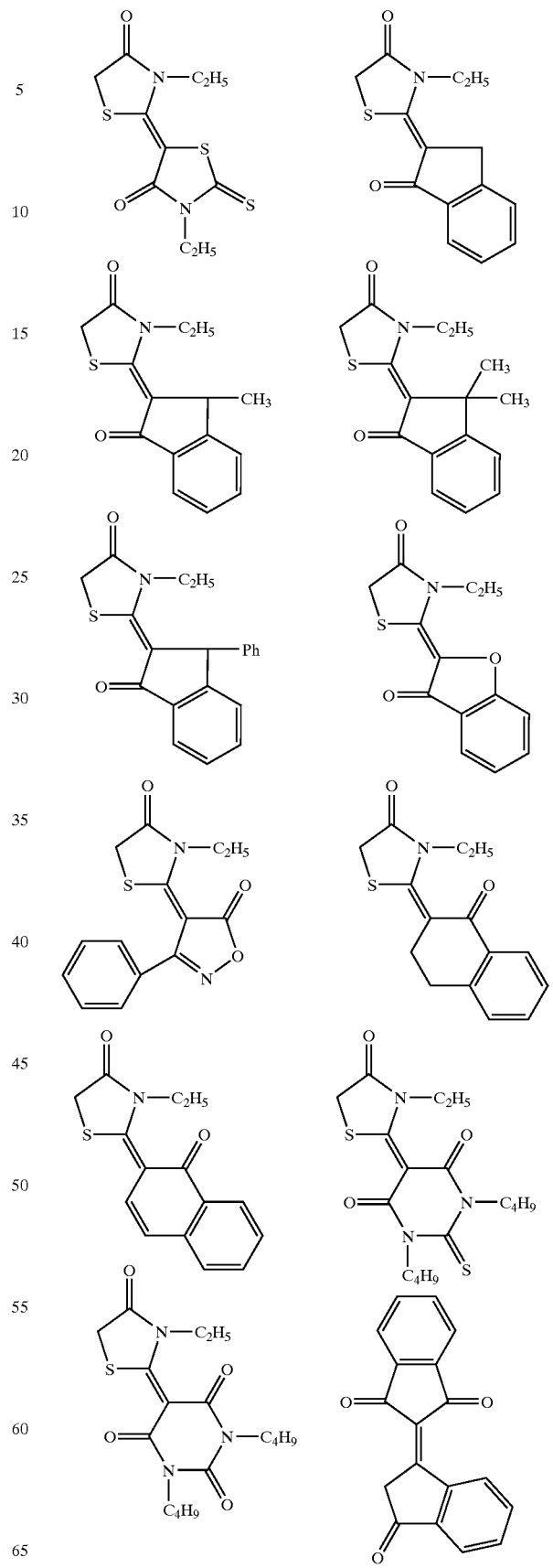

As suitable examples of acidic nuclei represented by formula (A), preferably including acidic nuclei of formulae (B) to (G), mention may be made of 1,3-indanedione nuclei, 3,5-pyrazolinedione nuclei, 1,3-cyclohezanedione nuclei (including their thioketone bodies), 1,3-dioxane-4,6-dione nuclei, 2,4,6-triketohexahydropyrimidine nuclei (including their thioketone bodies), pyrazolone nuclei, isooxazolinone nuclei, oxazolinone nuclei, furanone nuclei, oxyindole nuclei, inidazolidone nuclei, 1,2,3,6-tetrahydropyridine-2,6-dione nuclei, benzothiophene-3-one nuclei, oxobenzothiophene-3-one nuclei, dioxobenzothiophene-3-one nuclei, coumaranone nuclei, 1-indanone nuclei, α-tetralone nuclei, 2-thio-2,4-thiazolidinedione nuclei, 2-thio-2,4-oxazolidinedione nuclei, 2-thio-2,5-thiazolidinedione nuclei, 2,4-thiazolidinedione nuclei, 2,4-imidazolidinedione nuclei, 2-thio-2,4-imidazolidinedione nuclei and 2-imidzoline-5-one nuclei. Of these nuclei, 1,3-indanedione nuclei, 2,4,6-triketohexahydropyrimidine nuclei (including their thioketone bodies), pyrazolone nuclei, isooxazolinone nuclei, oxazolinone nuclei, furanone nuclei, oxyindole nuclei, 1-indaznone nuclei, imidazolidone nuclei, 1,2,3,6-tetrahydropyridine-2,6-dione nuclei, benzothiophene-3-one nuclei, oxobenzothiophene-3-one nuclei, dioxobenzothiophene-3-one nuclei, coumaranone nuclei, 2-thio-2,4-thiazolidinedione nuclei, 2-thio-2,4-oxazolidinedione nuclei, 2-thio-2,5-thiazolidinedione nuclei and 2,4-thiazolidinedione nuclei are preferred over the others. In particular, 1,3-indanedione nuclei, barbituric acid derivatives, 2-thiobarbituric acid derivatives, pyrazolone nuclei, isooxazolinone nuclei, oxazolinone nuclei, furanone nuclei, 1-indanone nuclei, imidazolidone nuclei, 1,2,3,6-tetrahydropyridine-2,6-dione nuclei, oxobenzothiophene-3-one nuclei, dioxobenzothiophene-3-one derivatives, 2-thio-2,4-thiazolidinedione nuclei and 2-thio-2,4-oxazolidinedione nuclei are advantageous over the others.

Next, the compound represented by formula (III) is described below in detail.

$R^1$ and $R^2$ in Formula (III) may be the same or different, and they each represent an aryl group, a heterocyclic group or an aliphatic hydrocarbon group, provided that at least either of them represents an aryl or heterocyclic group.

The aryl group, heterocyclic group or aliphatic hydrocarbon group represented by $R^1$ and $R^2$ in Formula (III) is the same as the aryl group, heterocyclic group or aliphatic hydrocarbon group represented by $R^1$, $R^2$ and $R^3$ in Formula (I)

Additionally, $R^1$ and $R^2$ may combine with each other to complete a 5, 6 or 7-membered ring.

$R^7$ represents a substituent group and n represents an integer of 0 to 4. When n is 2, 3 or 4, two to four $R_3$ groups may be the same or different. $R^4$, $R^5$ and $R^6$ each represent a hydrogen atom or a substituent group. Any two of the substituent groups $R^4$, $R^5$, $R^6$ and $R^7$ may be combined with each other to complete a ring. Examples of these substituent groups include the groups recited above as the substituent groups which the aryl, heterocyclic or aliphatic hydrocarbon group represented by $R^1$ and $R^2$ each can have. m represents 0, 1 or 2.

It is desirable that m be 0 or 1, preferably 0.

$Z^{11}$ represents atoms forming a 5, 6 or 7-membered ring, which may have another ring in a fused state. Suitable examples of the ring formed include rings employed as acidic nuclei in conventional merocyanine dyes. Of such nuclei, the acidic nuclei represented by formulae (A1) to (G1) respectively, which are illustrated hereinafter, are preferred over the others.

Next, the compound represented by formula (IV) is illustrated below.

$R^1$, $R^2$, $R^4$ to $R^7$, m and n in formula (IV) have the same meanings as in formula (III), respectively. The acidic nucleus in formula (IV), which is derived from a cyclic compound of the following formula (A1), is a preferable one among all the acidic nuclei which can be represented by $Z^{11}$ in formula (III);

(A1)

wherein $X_A$ represents an oxygen atom, a sulfur atom, N—$R_A1$ or $CR_A2R_A3$; $R_A1$, $R_A2$ and $R_A3$ each represent a hydrogen atom or a substituent group; and $Z_{A1}$ represents atoms forming a 5, 6 or 7-membered ring, preferably a 5, 6 or 7-membered ring constituted of any of carbon, nitrogen, oxygen and sulfur atoms.

It is desirable that the substituent group represented by $R_A1$ be an aliphatic hydrocarbon group, an aryl group or a heterocyclic group.

The aliphatic hydrocarbon group represented by $R_A1$ is a straight-chain, branched or cyclic alkyl group (containing preferably 1 to 30 carbon atoms, more preferably 1 to 20 carbon atoms, particularly preferably 1 to 12 carbon atoms, such as methyl, ethyl, iso-propyl, tert-butyl, n-octyl, n-decyl, n-hexadecyl, cyclopropyl, cyclopentyl or cyclohexyl), an alkenyl group (containing preferably 2 to 30 carbon atoms, more preferably 2 to 20 carbon atoms, particularly preferably 2 to 12 carbon atoms, such as vinyl, allyl, 2-butenyl or 3-pentenyl) or an alkynyl group (containing preferably 2 to 30 carbon atoms, more preferably 2 to 20 carbon atoms, particularly preferably 2 to 12 carbon atoms, such as propargyl or pentynyl), preferably an alkyl group or an alkenyl group, more preferably methyl, ethyl, propyl, butyl or allyl group.

The aryl group represented by $R_A1$ is preferably a monocyclic or bicyclic aryl group containing 6 to 30 carbon atoms (such as phenyl or naphtyl), more preferably a phenyl group containing 6 to 20 carbon atoms, particularly preferably a phenyl group containing 6 to 12 carbon atoms.

The heterocyclic group represented by $R_A1$ is a saturated or unsaturated 3- to 10-membered heterocyclic group containing at least one N, O or S atom. The heterocyclic ring therein may be a single ring or may further be fused with another ring to form a condensed ring.

It is desirable that the heterocyclic group be a 5 or 6-membered aromatic heterocyclic group, preferably a nitrogen-containing 5 or 6-membered aromatic heterocyclic group, particularly preferably a 5 or 6-membered aromatic heterocyclic group containing one to two nitrogen atoms.

As examples of heterocyclic rings from which the foregoing heterocyclic groups are derived, mention may be made of pyrrolidine, piperidine, piperazine, morpholine, thiophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthylizine, quinoxaline, quinazoline, cinnoline, pteridine, acridine, phenanthroline, phenazine, tetrazole, benzimidazole, benzoxazole, benzothiazole, benzotriazole and tetraazaindene. Of these heterocyclic rings, pyrrole, imidazole, pyrazole, pyridine, pyrazine, pyridazine, triazole, triazine, indole, indazole, thiadiazole, oxadiazole, quinoline, phthalazine, quinoxaline, quinazoline, cinnoline, tetrazole, thiazole, oxazole, benzimidazole, benzoxazole, benzothiazole and benzotriazole are preferred over the others. Further, imidazole, pyridine, quinoline, thiazole, oxazole, benzoimidazole, benzoxazole, benzothiazole and benzotriazole, especially pyridine and quinoline, are advantageous.

The aliphatic hydrocarbon, aryl or heterocyclic group represented by $R_A1$ may have a substituent group. Examples of such a substituent group include the groups recited above as a substituent group which $R^1$ and $R^2$ each can have.

The groups preferred as $R_A1$ are an alkyl group, an alkenyl group and an aryl group, especially alkyl and phenyl groups.

$R_A2$ and $R_A3$ each are preferably a hydrogen atom, a cyano group, an oxycarbonyl group, an acyl group, a sulfonyl group, a thioether group, a carbamoyl group or a sulfamoyl group (excluding the case of $R_A2=R_A3=$a hydrogen atom).

The oxycarbonyl, acyl, sulfonyl or thioether group represented by $R_A2$ and $R_A3$ each is respectively an oxycarbonyl, acyl, sulfonyl or thioether group substituted by an aliphatic hydrocarbon, aryl or heterocyclic group. These aliphatic hydrocarbon, aryl and heterocyclic substituents have the same meanings as the foregoing aliphatic hydrocarbon, aryl and heterocyclic groups $R_A1$ can represent, respectively.

The carbamoyl or sulfamoyl group represented by $R_A2$ and $R_A3$ each is respectively a carbamoyl or sulfamoyl group having no substituent or an aliphaptic hydrocarbon, aryl or heterocyclic substituent. These aliphatic hydrocarbon, aryl and heterocyclic substituents have the same meanings as the foregoing aliphatic hydrocarbon, aryl and heterocyclic groups $R_A1$ can represent, respectively.

Next, the compound represented by formula (V) is illustrated below.

$R^1$, $R^2$, $R^4$ to $R^6$, m and n in formula (V) have the same meanings as in formula (III), respectively. The acidic nucleus in formula (V), which is derived from a cyclic compound represented by the following formula (B1), is favorable one among all the acidic nuclei which can be represented by formula (A1):

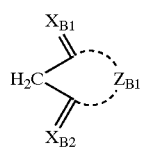

(B1)

wherein $X_{B1}$ and $X_{B2}$ each represent an oxygen atom, a sulfur atom, N—$R_B1$ or $CR_B2R_B3$; $R_B1$, $R_B2$ and $R_B3$ each represent a hydrogen atom or a substituent group; and $Z_{B1}$ represents atoms forming a 5, 6 or 7-membered ring, preferably a 5, 6 or 7-membered ring constituted of any of carbon, nitrogen, oxygen and sulfur atoms. $R_B1$, $R_B2$ and $R_B3$ have the same meanings as the aforementioned $R_A1$, $R_A2$ and $R_A3$ respectively. Examples of an acidic nucleus represented by formula (B1) include substituted 1,3-indanedione nuclei, heterocyclic ring-condensed cyclopenta-1,3-dione nuclei (the heterocyclic ring of which is, e.g., pyridine, pyrazine or thiophene), 3,5-pyrazolinedione nuclei, 1,3-cyclohexanedione nuclei, 1,3-dioxane-4,6-dione nuclei, 2,4,6-triketohexahydropyrimidine nuclei [e.g., barbituric acid, 2-thiobarbituric acid, and derivatives thereof, such as those substituted by an alkyl group (e.g., methyl, ethyl) at the 1-position, those substituted by alkyl groups (e.g., methyl, ethyl, butyl) at the 1- and 3-positions respectively, those substituted by aryl groups (e.g., phenyl, p-chlorophenyl), p-ethoxycarbonylphenyl) at the 1- and 3-positions respectively, those substituted by alkyl and aryl groups at the 1- and 3-positions (e.g., 1-ethyl-3-phenylbarbituric acid, 1-ethyl-3-phenyl-2-thiobarbituric acid), and those substituted by heterocyclic groups at the 1- and 3-positions respectively (e.g., 1,3-di(2-pyridyl) barbituric acid, 1,3-di(2-pyridyl)-2-thiobarbituric acid)].

More specifically, the acidic nucleus represented by formula (B1) include the compounds illustrated below and derivatives thereof. Additionally, the term "a substituted 1,3-indanedione nucleus" refers to the 1,3-indanedione nucleus having a substituent group or another ring condensed thereon.

Examples of such a substituent group include an alkyl group, an aryl group, a heterocyclic group, an alkenyl group and a silyl group.

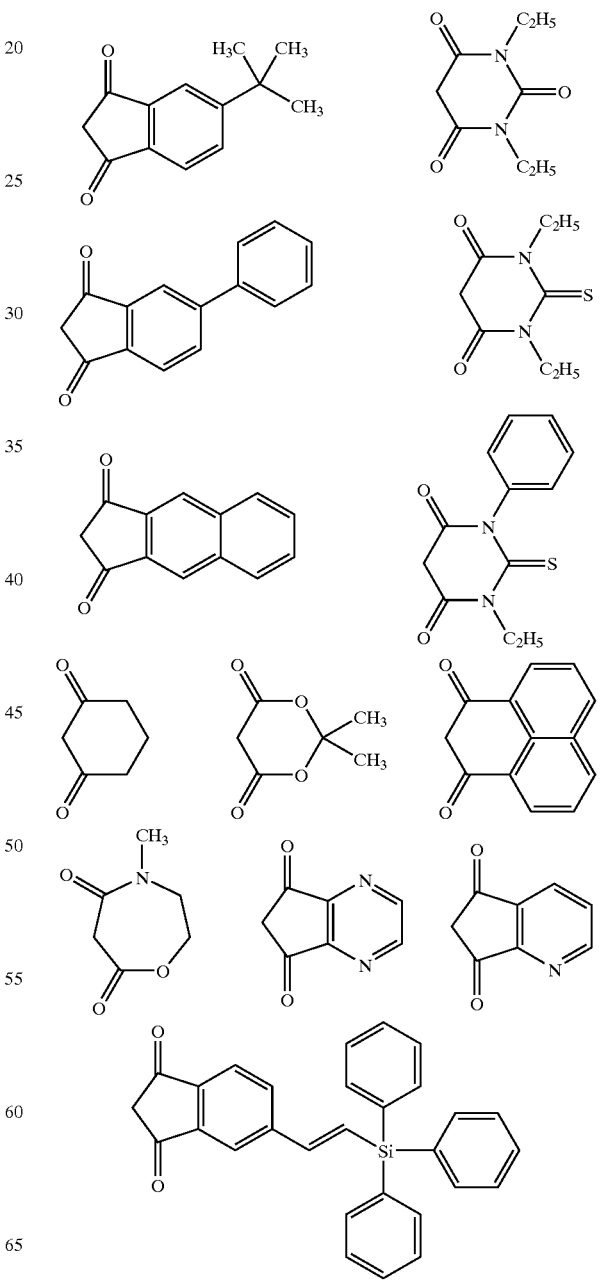

-continued

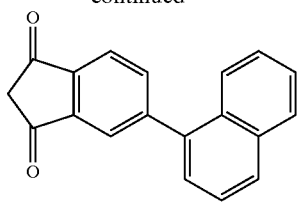

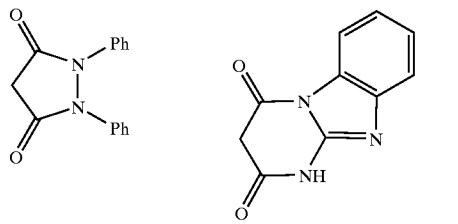

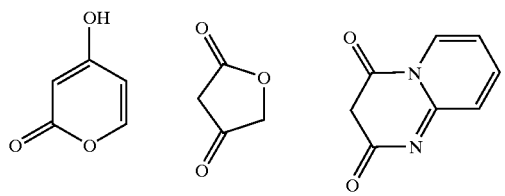

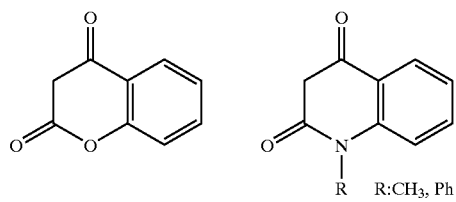

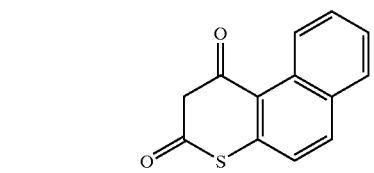

R:CH₃, Ph

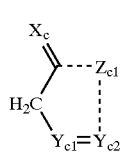

Next, the compound represented by formula (VI) is illustrated below.

$R^1$, $R^2$, $R^4$ to $R^6$, m and n in formula (VI) have the same meanings as in formula (III), respectively. The acidic nucleus in formula (VI), which is derived from a cyclic compound represented by the following formula (C1), is favorable one among all the acidic nuclei which can be represented by formula (A1):

$$X_C \atop H_2C \diagdown \diagup Z_{c1} \atop Y_{c1} = Y_{c2}$$

(C1)

wherein $X_C$ represents an oxygen atom, a sulfur atom, N—$R_C1$ or $CR_C2R_C3$; $R_C1$, $R_C2$ and $R_C3$ each represent a hydrogen atom or a substituent group; $Y_{C1}$ and $Y_{C2}$ each represent a nitrogen atom or C—$R_C4$; $R_C4$ represents a hydrogen atom or a substituent group, examples of which include the groups recited hereinbefore as substituent groups $R_1$ and $R_2$ may have; and $Z_{C1}$ represents atoms completing a 5, 6 or 7-membered ring, preferably a 5, 6 or 7-membered ring constituted of any of carbon, nitrogen, oxygen and sulfur atoms. $R_C1$, $R_C2$ and $R_C3$ have the same meanings as $R_A1$, $R_A2$ and $R_A3$ respectively.

Examples of an acidic nucleus represented by formula (C1) include an isooxazolinone nucleus, an oxazolinone nucleus, a furanone nucleus, an oxyindole nucleus, an imidazolidone nucleus and a 1,2,3,6-tetrahydropyridine-2,6-dione nucleus. More specifically, these nuclei include the compounds illustrated below and derivatives thereof.

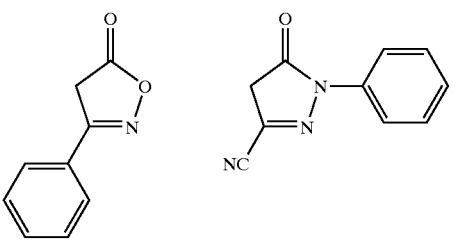

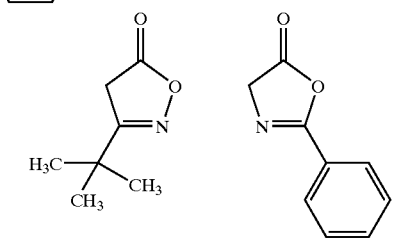

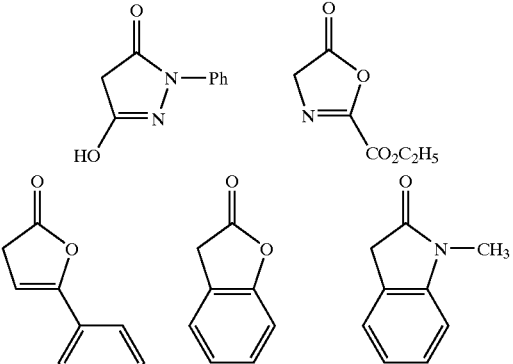

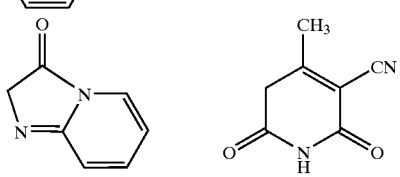

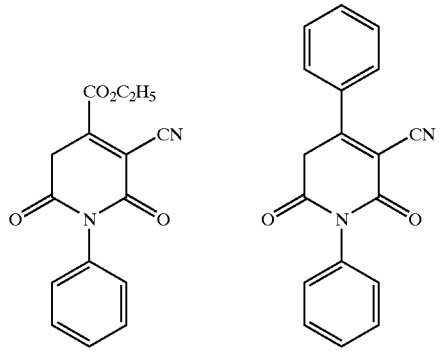

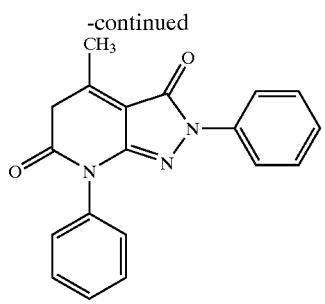

Further, the compound represented by formula (VII) is illustrated below.

$R^1$, $R^2$, $R^4$ to $R^6$, n and m in formula (VII) have the same meanings as in formula (III), respectively. The acidic nucleus in formula (VII), which is derived from a cyclic compound represented by the following formula (D1), is favorable one among all the acidic nuclei which can be represented by formula (A1):

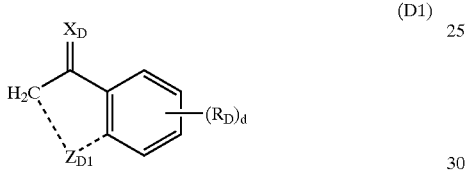

(D1)

wherein $X_D$ represents an oxygen atom, a sulfur atom, N—$R_D1$ or $CR_D2R_D3$; $R_D1$, $R_D2$ and $R_D3$ each represent a hydrogen atom or a substituent group, and they have the same meaning as $R_A1$, $R_A2$ and $R_A3$ respectively; $Z_{D1}$ represents atoms completing a 5, 6 or 7-membered ring, preferably a 5, 6 or 7-membered ring constituted of any of carbon, nitrogen, oxygen and sulfur atoms; and $R_D$ represents a substituent group, including the substituent groups recited hereinbefore $R^1$ and $R^2$ may have; and d represents an integer of 0 to 4, wherein when d is 2, 3 or 4 the $R_D$ groups are the same or different. Examples of an acidic nucleus represented by formula (D1) include the following cyclic compounds and derivatives thereof.

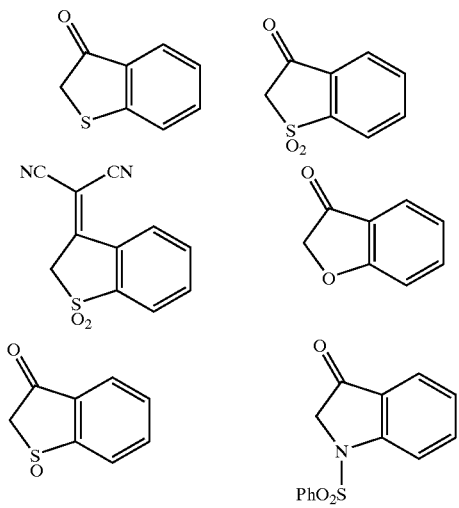

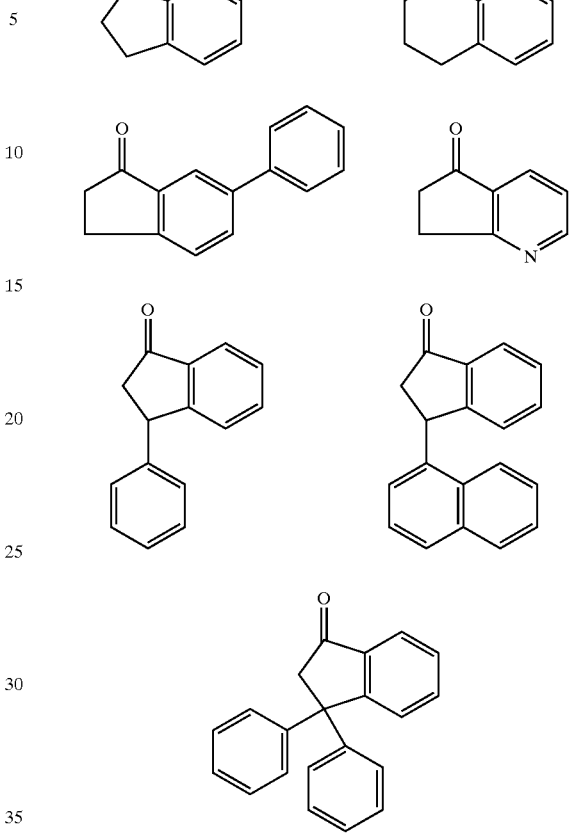

Furthermore, the compound represented by formula (VIII) is illustrated below.

$R^1$, $R^2$, $R^4$ to $R^6$, n and m in formula (VIII) have the same meanings as in formula (III), respectively. The acidic nucleus in formula (VIII), which is derived from a cyclic compound represented by the following formula (E1), is favorable one among all the acidic nuclei which can be represented by formula (A1):

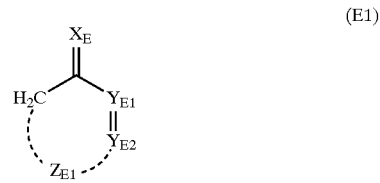

(E1)

wherein $X_E$ represents an oxygen atom, a sulfur atom, N—$R_E1$ or $CR_E2R_E3$; $R_E1$, $R_E2$ and $R_E3$ each represent a hydrogen atom or a substituent group; $Y_{E1}$ and $Y_{E2}$ each represent a nitrogen atom or C—$R_E4$; $R_E4$ represents a hydrogen atom or a substituent group, examples of which include the groups recited hereinbefore as substituent groups $R_1$ and $R_2$ may have; and $Z_{E1}$ represents atoms completing a 5, 6 or 7-membered ring, preferably a 5, 6 or 7-membered ring constituted of any of carbon, nitrogen, oxygen and sulfur atoms. $R_E1$, $R_E2$ and $R_E3$ have the same meanings as $R_A1$, $R_A2$ and $R_A3$ respectively.

Examples of an acidic nucleus represented by formula (E1) include the following cyclic compounds and derivatives thereof.

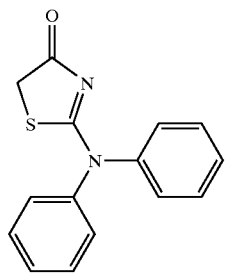 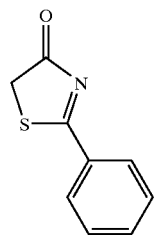 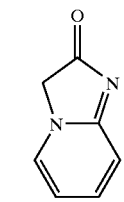

Then, the compound represented by formula (IX) is illustrated below.

$R^1$, $R^2$, $R^4$ to $R^6$, n and m in formula (IX) have the same meanings as in formula (III), respectively. The acidic nucleus in formula (IX), which is derived from a cyclic compound represented by the following formula (F1), is favorable one among all the acidic nuclei which can be represented by formula (A1):

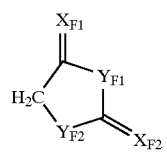

(F1)

wherein $X_{F1}$ and $X_{F2}$ each represents an oxygen atom, a sulfur atom, N—$R_F1$ or $CR_F2R_F3$; $R_F1$, $R_F2$ and $R_F3$ each represent a hydrogen atom or a substituent group; $Y_{F1}$ and $Y_{F2}$ each represent an oxygen atom, a sulfur atom or N—$R_F5$; $R_F1$ and $R_F5$ each have the same meaning as $R_A1$; and $R_F2$ and $R_F3$ have the same meanings as $R_A2$ and $R_A3$ respectively.

As examples of an acidic nucleus represented by formula (F1), mention may be made of 2-thio-2,4-thiazolidinedione nuclei (including rhodanine and derivatives thereof, e.g., a rhodanine substituted by an aliphatic hydrocarbon group at the 3-position, such as 3-methylrhodanine, 3-ethylrhodanine or 3-allylrhodanine, a rhodanine substituted by an aryl group at the 3-position, such as 3-phenylrhodanine, and a rhodanine substituted by a heterocyclic group at the 3-position, such as 3-(2-pyridyl) rhodanine), 2-thio-2,4-oxazolidinedione nuclei, 2-thio-2,4-(3H,5H)-oxazoledione nuclei, 2-thio-2,5-thiazolidinedione nuclei, 2,4-thiazolidinedione nuclei, thiazoline-4-one nuclei, 4-thiazolidinone nuclei, 2,4-imidazolidinedione (hydantoin) nuclei, 2-thio-2,4-imidazolidinedione (2-thiohydantoin) nuclei, imidazoline-5-one nuclei and analogues thereof.

More specifically, the heterocyclic compounds illustrated below are included in the acidic nuclei represented by formula (F1):

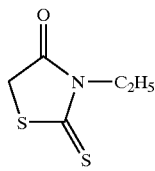 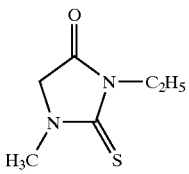 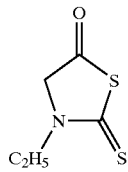

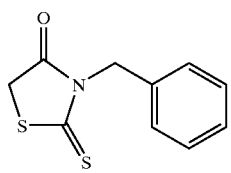 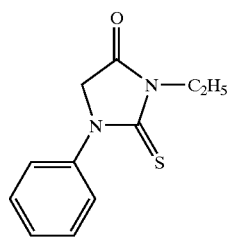

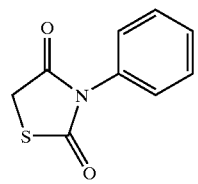 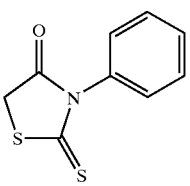

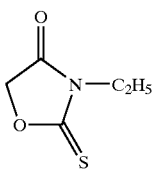 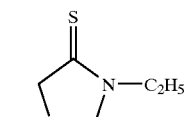 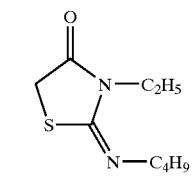

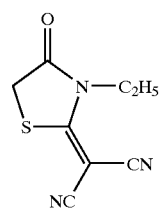 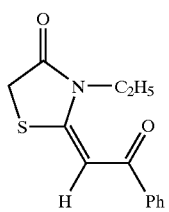

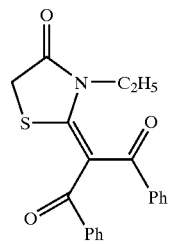 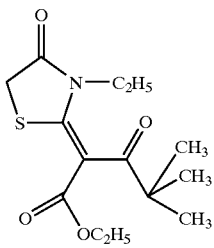

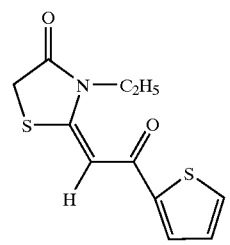

In addition, the compound represented by formula (X) is illustrated below.

$R^1$, $R^2$, $R^4$ to $R^6$, n and m in formula (X) have the same meanings as in formula (III), respectively. The acidic nucleus in formula (X), which is derived from a cyclic compound represented by the following formula (G1), is favorable one among all the acidic nuclei which can be represented by formula (A1):

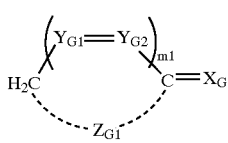

(G1)

wherein $X_G$ represents an oxygen atom, a sulfur atom, $N—R_G1$ or $CR_G2R_G3$; $R_G1$, $R_G2$ and $R_G3$ each represent a hydrogen atom or a substituent group; $Y_{G1}$ and $Y_{G2}$ each represent a nitrogen atom or $C—R_G4$; $R_G4$ represents a hydrogen atom or a substituent group, examples of which include the groups recited hereinbefore as substituent groups $R^1$ and $R^2$ may have; $m_1$ represents 1 or 2; $Z_{G1}$ represents atoms completing a 5, 6 or 7-membered ring, preferably a 5, 6 or 7-membered ring constituted of any of carbon, nitrogen, oxygen and sulfur atoms. Additionally, $R_G1$, $R_G2$ and $R_G3$ have the same meanings as $R_A1$, $R_A2$ and $R_A3$ defined hereinbefore, respectively.

Examples of an acidic nucleus represented by formula (G1) are as follows:

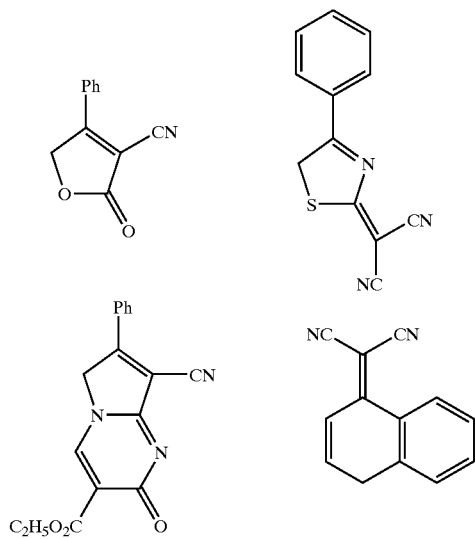

Besides the acidic nuclei as recited above, the 5, 6 or 7-membered ring represented by $Z^{11}$ in formula (III) may be an acidic nucleus formed by condensing the moiety $=X_A$ in formula (A1) and an acidic nucleus represented by formula (A1). To take examples from the rhodanine nuclei represented by formula (F1), the acidic nuclei formed by such a condensation are as follows;

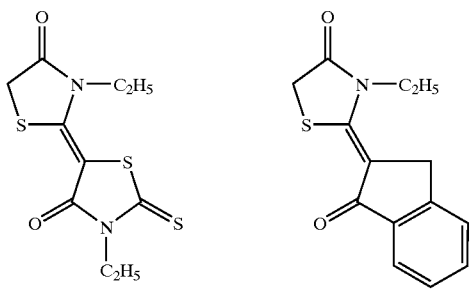

-continued

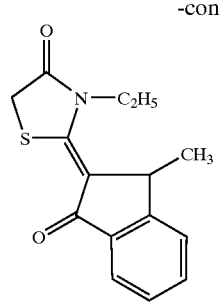
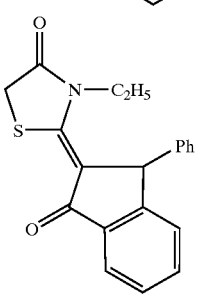
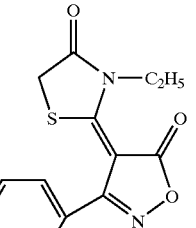
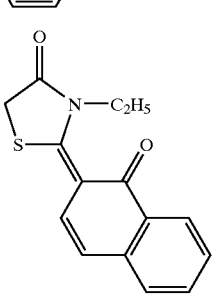
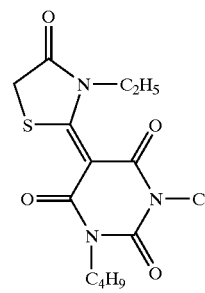
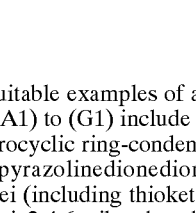

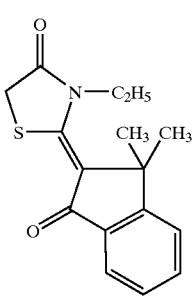
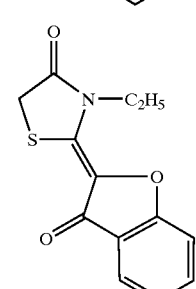
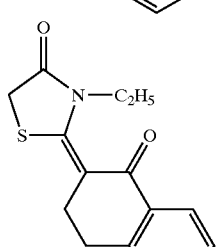
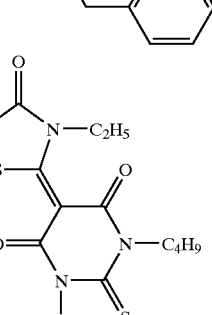
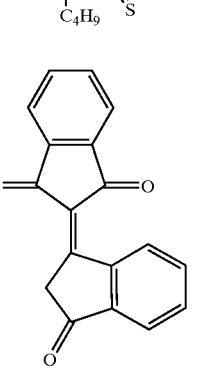

Suitable examples of acidic nuclei represented by formulae (A1) to (G1) include substituted 1,3-indanedione nuclei, heterocyclic ring-condensed cyclopentane-1,3-dione nuclei, 3,5-pyrazolinedionedione nuclei, 1,3-cyclohexanedione nuclei (including thioketone bodies), 1,3-dioxane-4,6-dione nuclei, 2,4,6-triketohexahydropyrimidine nuclei, isooxazolinone nuclei, oxazolinone nuclei, furanone nuclei, oxyindole nuclei, imidazolidone nuclei, 1,2,3,6-tetrahydropyridine-2, 6-dione nuclei, benzothiophene-2-one nuclei, oxobenzothiophene-3-one nuclei, dioxobenzothiophene-3-one nuclei, coumaranone nuclei, 1-indanone nuclei, α-tetralone nuclei, 2-thio-2,4-thiazolidinedione nuclei, 2-thio-2,5-thiazolidinedione nuclei, 2,4-thiazolidinedione nuclei, 2,4-imidazolidinedione nuclei, 2-thio-2,4-imidazoolidinedione nuclei and 2-imidzoline-5-one nuclei. Of these nuclei, the preferable nuclei are substituted 1,3-indanedione nuclei, 2,4,6-triketohexahydropyrimidine nuclei (including thioketo bodies), isooxazolinone nuclei, oxazolinone nuclei, furanone nuclei, oxyindone nuclei, imidazolidone nuclei, 1,2,3,6-tetrahydropyridine-2,6-dione nuclei, benzothiophene-3-one nuclei, oxobenzothiophene-3-one nuclei, dioxobenzothiophene-3-one nuclei, coumaranone nuclei, oxyindole nuclei, 1-indanone nuclei, 2-thio-2,4-thiazolidinedione nuclei, 2-thio-2,4-oxazolidinedione nuclei, 2-thio-2,5-thiazolidinedione nuclei and 2,4-thiazolidinedione nuclei. In particular, substituted 1,3-indanedione nuclei, barbituric acid derivatives, 2-thiobarbituric acid derivatives, isooxazolinone nuclei, oxazolinone nuclei, furanone nuclei, imidazolidone nuclei, 1,2,3,6-tetrahydropyridine-2,6-dione nuclei, oxobenzothiophene-3-one nuclei, dioxoobenzothiophene-3-one nuclei, 1-indanone nuclei, 2-thio-2,4-thiazolidinedione nuclei and 2-thio-2,4-oxazolidinedione nuclei are advantageous.

Next, styrylamine compounds represented by formula (XI) are illustrated below.

$R^{21}$ and $R^{22}$ each in formula (XI) have the same meaning as the aryl or heterocyclic group represented by $R^1$ and $R^2$ each in formula (III). Favorable ranges of these groups are the same in both formulae. $R^{27}$ has the same meaning as $R^7$ in formula (III). $Z^2$ represents a 1,3-indanedione nucleus having one or more substituent groups (which may complete a condensed nucleus or each represent an alkyl, aryl, heterocyclic, alkenyl or silyl group), a furanone nucleus, an oxyindole nucleus, an imidazolidone nucleus, a dioxobenzothiophene-3-one nucleus, a coumaranone nucleus, an oxyindole nucleus, a 1-indanone nucleus having a substituent at the 3-position (wherein the substituent is an alkyl, aryl or heterocyclic group), a benzofuran-3-one nucleus, a 2-thio-2,4-thiazolidinedione nucleus, a 2-thio-2,4-oxazolidinedione nucleus, a 2-thio-2,5-thiazolidinedione nucleus, a 2,4-thiazolidinedione nucleus, a 2,4-imidazolidinedione nucleus, a 2-thio-2,4-imidazolidinedione nucleus or a 2-imidazoline-5-one nucleus. The carbonyl oxygen or the thiocarbonyl sulfur attached to the cyclic skeleton constituting $Z^2$ may be replaced with N—$R^{2a}$ or $CR^{2b}R^{2c}$, wherein $R^{2a}$, $R^{2b}$ and $R^{2c}$ each represent a hydrogen atom or a substituent group, and they have the same meanings as $R_A1$, $R_A2$ and $R_A3$ in formula (IV) respectively.

The nuclei preferred as $Z^2$ include a 1,3-indanedione nucleus having one or more substituent groups (which may complete a condensed ring, such as a carbon or heterocyclic ring containing at most 20 carbon atoms, or each represent a 1–20C alkyl, 6–20C aryl, 1–20C heterocyclic or 2–30C alkenyl group), a dioxobenzothiophene-3-one nucleus, a benzofuran-3-one nucleus, a 1-indanone nucleus having a substituent at the 3-position (the substituent of which is a 1–20C alkyl, 6–20C aryl or 1–20C heterocyclic group) and a 2-thio-2,4-thiazolidinedione nucleus.

Then, the formula (XII) representing an amine compound is illustrated below in detail.

$Ar^{31}$ represents an arylene group or a divalent heterocyclic group, and $R^{32}$ represents an aryl group, a heterocyclic group and an aliphatic hydrocarbon group. These aryl, heterocyclic and aliphatic hydrocarbon groups have the same meanings as those represented by $R^1$, $R^2$ and $R^3$ each in formula (I), respectively. Favorable ranges of these groups are the same in both formulae.

$R^{34}$, $R^{35}$, $R^{36}$ and $Z^3$ have the same meanings as $R^4$, $R^5$, $R^6$ and $Z^1$ in formula (II), respectively. m represents 0, 1 or 2. t represents an integer of at least 2. One combination made with $Ar^{31}$, $R^{32}$, $R^{34}$, $R^{35}$, $R^{36}$, $Z^3$ and m may be the same as or different from another combination made therewith. L represents a t-valent linkage group.

The suitable linkage group for L is a group constituted of at least one fragment selected from the class consisting of an oxygen atom, a nitrogen atom, a sulfur atom, a methylene group, a vinylene group, an acetylene group, a phenylene group, an aniline group and a heterocyclic group. The groups recited above may have a substituent, and those cyclic groups each may form a condensed ring by fusing together with another ring. The suitable number of carbon atoms contained in the foregoing heterocyclic group is from 1 to 20, preferably from 1 to 12, and examples of a hetero atom contained therein include nitrogen, oxygen, sulfur and selenium atoms. To be concrete, such a heterocyclic group includes the groups derived from pyrrolidine, piperidine, piperazine, morpholine, thiophene, selenophene, furan, pyrrole, imidazole, pyrazole, pyridine, pyrazine, pyridazine, triazole, triazine, indole, indazole, purine, thiazoline, thiazole, thiadiazole, oxazoline, oxazole, oxadiazole, quinoline, isoquinoline, phthalazine, naphthylizine, quinoxaline, quinazoline, cinnoline, pteridine, acridine, phenanthroline, phenazine, tetrazole, benzimidazole, benzoxazole, benzothiazole, benzotriazole and tetrazaindene. And the foregoing substituent includes the groups recited as substituent groups which $R^1$, $R^2$ and $R^3$ can have.

It is desirable for L to be a group constituted of at least one fragment selected from the class consisting of an oxygen atom, a nitrogen atom, a sulfur atom, a methylene group, a vinylene group, an acetylene group and groups derived from aniline, benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole and oxadiazole nuclei respectively. These nuclei each may form a condensed ring.

In particular, the mono- to polymers, preferably the mono- to eicosamers, more preferably the mono- to decamers, particularly preferably the mono- to pentamers, of aniline, benzene, thiophene, pyrrole, furan, selenophene, naphthalene, anthracene, pyridine, pyridazine, pyrimidine, azulene, carbazole, arylenevinylene, aryleneetynylene, arylenephenylene and triarylamine respectively (wherein the arylene moiety and the aryl moiety include the groups derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole and oxadiazole respectively) are preferred as L, and thereto an oxygen atom, a nitrogen atom, a sulfur atom or a methylene group may be attached as a linking moiety.

The formula (XIII) representing another amine compound is illustrated below.

$Ar^{41}$ represents an arylene group or a divalent heterocyclic group, and $R^{42}$ represents an aryl group, a heterocyclic group and an aliphatic hydrocarbon group. $R^{44}$, $R^{45}$ and $R^{46}$ each represent a hydrogen atom or a substituent group. These $Ar^{41}$, $R^{42}$, $R^{44}$, $R^{45}$, $R^{46}$ and $Z^4$ have the same meanings as $Ar^{31}$, $R^{32}$, $R^{34}$, $R^{35}$, $R^{36}$ and $Z^3$ in formula (XII), respectively. m represents 0, 1 or 2. p represents 2 or 3. One combination made with $Ar^{41}$, $R^{42}$, $R^{44}$, $R^{45}$, $R^{46}$, $Z^4$ and m may be the same as or different from another combination made therewith.

Then, the formula (XIV) is described below. $R^{54}$, $R^{55}$ and $R^{56}$ each represent a hydrogen atom or a substituent group. $R^{57}$ and $R^{58}$ each represent a substituent group. q represents an integer of 0 to 4, and r represents an integer of 0 to 5. When q is 2, 3 or 4, the $R^{57}$ groups may be the same or different; while, when r is 2, 3, 4 or 5, the $R^{58}$ groups may be the same or different. Examples of a substituent group represented by $R^{54}$, $R^{55}$, $R^{56}$, $R^{57}$ and $R^{58}$ each include the groups recited above as substituents which the aryl, heterocyclic or aliphatic hydrocarbon group represented by $R^1$, $R^2$ and $R^3$ each can have. $Z^5$ represents atoms forming a 5, 6 or 7-membered ring, and has the same meaning as $Z^1$ in formula (II). m represents 0, 1 or 2. t represents an integer of at least 2. One combination made with $R^{54}$, $R^{55}$, $R^{56}$, $R^{57}$, $R^{58}$, $Z^5$, m, q and r may be the same as or different from another combination made therewith. L represents a t-valent linkage group, and has the same meaning as L in formula (XII).

Further, the formula (XV) is described below. $R^{62}$ represents an aryl group, a heterocyclic group or an aliphatic hydrocarbon group, and has the same meaning as the aryl, heterocyclic or aliphatic hydrocarbon group represented by $R^1$, $R^2$ and $R^3$ each in formula (I). $R^{64}$, $R^{65}$ and $R^{66}$ each represent a hydrogen atom or a substituent group. $R^{67}$ represents a substituent group, and q represents an integer of 0 to 4. When q is 2, 3 or 4, the $R^{67}$ groups may be the same or different. $Z^6$ represents atoms forming a 5, 6 or 7-membered ring. $R^{64}$, $R^{65}$, $R^{66}$, $R^{67}$ and $Z^6$ have the same meanings as $R^{54}$, $R^{55}$, $R^{56}$, $R^{67}$ and $Z^5$, respectively. m represents 0, 1 or 2. p represents 2 or 3. One combination made with $R^{62}$, $R^{64}$, $R^{65}$, $R^{66}$, $R^{67}$, $Z^6$, m and q may be the same as or different from another combination made therewith.

Furthermore, the formula (XVI) is described below. $R^{74}$ represents a hydrogen atom or a substituent group. $R^{77}$ and $R^{78}$ each represent a substituent group. q represents an integer of 0 to 4, and r represents an integer of 0 to 5. When q is 2, 3 or 4, the $R^{77}$ groups may be the same or different; while, when r is 2, 3, 4 or 5, the $R^{78}$ groups may be the same or different. $Z^7$ represents atoms forming a 5, 6 or 7-membered ring. $R^{74}$, $R^{77}$, $R^{78}$ and $Z^7$ have the same meanings as $R^{54}$, $R^{57}$, $R^{58}$ and $Z^5$ in formula (XIV), respectively. t represents an integer of at least 2. One combination made with $R^{74}$, $R^{75}$, $R^{76}$, $R^{77}$, $R^{78}$, $Z^7$, q and r may be the same as or different from another combination made therewith. L represents a t-valent linkage group, and has the same meaning as L in formula (XII).

In addition, the formula (XVII) is described below. $R^{84}$ represents a hydrogen atom or a substituent group. $R^{87}$ and $R^{88}$ each represent a substituent group. q represents an integer of 0 to 4, and r represents an integer of 0 to 5. When q is 2, 3 or 4, the $R^{87}$ groups may be the same or different; while, when r is 2, 3, 4 or 5, the $R^{88}$ groups may be the same or different. $R^{84}$, $R^{87}$ and $R^{88}$ have the same meanings as $R^{54}$, $R^{57}$ and $R^{58}$ in formula (XIV), respectively. $Z^8$ represents atoms forming a 5, 6 or 7-membered ring. $X^8$ represents an oxygen atom, a sulfur atom, N—$R^{A1}$ or $CR^{A2}R^{A3}$, and $R^{A1}$, $R^{A2}$ and $R^{A3}$ each represent a hydrogen atom or a substituent group. $Z^8$ and $X^8$ have the same meanings as $Z^A$ and $X^A$ respectively in formula (A), which constitute the acidic nucleus as one preferred example of $Z^1$ in formula (II). t represents an integer of at least 2. One combination made with $R^{84}$, $R^{87}$, $R^{88}$, $Z^8$, $X^8$, q and r may be the same as or different from another combination made therewith. L represents a t-valent linkage group, and has the same meaning as L in formula (XII).

Besides the aforementioned formulae, the formula (XVIII) is described below. $R^{94}$ represents a hydrogen atom or a substituent group. $R^{97}$ and $R^{98}$ each represent a substituent group. q represents an integer of 0 to 4, and r represents an integer of 0 to 5. When q is 2, 3 or 4, the $R^{97}$ groups may be the same or different; while, when r is 2, 3, 4 or 5, the $R^{98}$ groups may be the same or different. $Z^9$ represents atoms forming a 5, 6 or 7-membered ring. $X^9$ represents an oxygen atom, a sulfur atom, N—$R^{A1}$ or $CR^{A2}R^{A3}$, and $R^{A1}$, $R^{A2}$ and $R^{A3}$ each represent a hydrogen atom or a substituent group. $R^{94}$, $R^{97}$, $R^{98}$, $Z^9$ and $X^9$ have the same meanings as $R^{84}$, $R^{87}$, $R^{88}$; $Z^8$ and $X^8$ in formula (XVII) respectively. t represents an integer of at least 2. One combination made with $R^{94}$, $R^{97}$, $R^{98}$, $Z^9$, $X^9$, q and r may be the same as or different from another combination made therewith. L represents a t-valent linkage group, and has the same meaning as L in formula (XII).

The compounds represented by formula (I) or those represented by any of formulae (III) to (XVIII) may be low molecular weight compounds, or may be high molecular weight compounds having a structure that the compound residue is connected to each constitutional unit of the polymer main chain (the weight average molecular weight of which is preferably from 1,000 to 5,000,000, more preferably from 5,000 to 2,000,000, particularly preferably from 10,000 to 1,000,000) or high molecular weight compounds having a structure that the skeletons represented by formula (I) or those represented by any of formulae (III) to (XVIII) are present in their main chain (the weight average molecular weight of which is preferably from 1,000 to 5,000,000, more preferably from 5,000 to 2,000,000, particularly preferably from 10,000 to 1,000,000). Such high molecular weight compounds may be homopolymers, or copolymers of the aforementioned compounds and other monomers.

It is preferable that the compounds represented by formula (I), specifically including the compounds represented by formulae (III) to (XVIII), are low molecular weight compounds. Additionally, the formulae (II) to (XVIII) are each expressed in extreme structure for convenience's sake, and so all the compounds illustrated above may be their respective tautomers.

The desirable combinations of groups constituting a compound represented by formula (I) are described below.

It is desirable that $R^1$, $R^2$ and $R^3$, which may be the same or different, each be a 6–30C monocyclic or bicyclic aryl group (e.g., phenyl, naphthyl), a 5 or 6-membered aromatic heterocyclic group containing as hetero atom(s) any of nitrogen, oxygen and sulfur atoms or a 1–20C alkyl, alkenyl or alkynyl group, provided that at least two among $R^1$, $R^2$ and $R^3$ are each the foregoing aryl or heterocyclic group and at least either of them has a moiety represented by formula (II) as a substituent group. And $R^1$, $R^2$ and $R^3$ each may have a substituent group, such as alkyl, alkenyl, aralkyl, aryl, alkoxy, amino, acyl, alkoxycarbonyl, aryloxycarbonyl, carbonylamino, sulfonylamino, sulfamoyl, carbamoyl, hydroxy or heterocyclic group. These groups each may further be substituted. $R^4$, $R^5$ and $R^6$ in formula (II) are each a hydrogen atom or a substituent group, such as an alkyl group, an alkoxy group, an alkylthio group, an alkenyl group, an acyl group, a sulfonyl group, an alkoxycarbonyl group, a carbonamido group or a cyano group. It is desirable for $Z^1$ to be a ring derived from an acidic nucleus represented by formula (B), (C), (D), (E), (F) or (G).

The preferable combinations of groups constituting the compound represented by formula (I) is represented by formula (III). The desirable combinations of groups constituting the compound represented by formula (III) are described below.

For the compound of formula (III), it is desirable that m is 0, 1 or 2, and $R^1$ and $R^2$, which may be the same or different, each be a 6–30C (carbon atoms: 6–30) monocyclic or bicyclic aryl group or a 5 or 6-membered heterocyclic group which contains nitrogen, oxygen or/and sulfur atoms and may have a substitugen group, such as alkyl, alkenyl, aralkyl, alkoxy, amino, acyl, alkoxycarbonyl, aryloxycarbonyl, carbonylamino, sulfonylamino, sulfamoyl, carbamoyl, hydroxy or heterocyclic group, $R^7$ and $R^4$ each be a hydrogen atom, an alkyl group, an alkoxy group, an alkylthio group, an acyl group, a substituted amino group (the substituent of which is an alkyl, alkenyl, alkynyl, aryl or heterocyclic group), $R^5$ and $R^6$ each be a hydrogen atom, an alkyl group, an alkoxy group, an alkylthio group, an alkenyl group, an acyl group, a sulfonyl group, an alkoxycarbonyl group, a carbonamido group or a cyano group, and $Z^{11}$ be an acidic nucleus derived from a cyclic compound represented by formula (B1), (C1), (D1), (E1), (F1) or (G1).

The desirable combinations of groups constituting the compound represented by formula (IV) are described below.

For the compound of formula (IV), it is desirable that m be 0 or 1, $R^1$ and $R^2$, which may be the same or different, each be an unsubstituted or substituted phenyl or naphthyl group containing up to 30 carbon atoms or an unsubstituted or substituted 5 or 6-membered aromatic heterocyclic group containing one to two nitrogen atoms or/and one to two sulfur atoms (the substituent of which contains 1 to 20 carbon atoms, such as an alkyl, alkenyl, aralkyl, aryl, alkoxy, amino, acyl, carbonylamino, sulfonylamino or heterocyclic group), $R^7$ and $R^4$ each be a hydrogen atom, a 1–20C alkyl group, a 1–20C alkoxy group or a 1–20C substituted amino group (the substituent(s) of which is(are) an alkyl group, an alkenyl group, an alkynyl group, an aryl group or/and a heterocyclic group), $R^5$ and $R^6$ each be a hydrogen atom, a 1–20C alkyl group, a 2–20C alkenyl group, a 1–20C acyl group, a 1–20C sulfonyl group, a 2–20C alkoxycarbonyl group, a 1–20C carbonamido group or a cyano group, and $Z^{11}$ be a substituted 1,3-indanedione nucleus, a 2,4,6-triketohexahydropyrimidine nucleus (including a thioketone body), an isooxazolinone nucleus, an oxazolinone nucleus, a furanone nucleus, an oxyindole nucleus, an imidazolidone nucleus, a 1,2,3,6-tetrahydropyridine-2,6-dione nucleus, a benzothiophene-3-one nucleus, an oxobenzothiophene-3-one nucleus, a dioxobenzothiophene-3-one nucleus, a coumaranone nucleus, a 1-indanone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus, especially a substituted 1,3-indanedione nucleus, a 2,4,6-triketohexahydropyrimidine nucleus, a dioxobenzothiophene-3-one nucleus or a 2-thio-2,5-thiazolidinedione nucleus.

Other desirable combinations of groups constituting a compound represented by formula (I) are those embodied in compounds represented by formulae (XII) and (XIII), respectively.

The desirable combinations of constituent groups in formula (XII) are described below: The $Ar^{31}$ groups, which may be the same or different, each represent a 6–30C monocyclic or bicyclic arylene group (e.g., phenylene or naphthylene) or a divalent 5 or 6-membered aromatic heterocyclic group containing as hetero atom(s) any of nitrogen, oxygen and sulfur atoms. $R^{32}$ represents a 6–30C monocyclic or bicyclic aryl group (e.g., phenyl, naphthyl), a 5 or 6-membered aromatic heterocyclic group containing as hetero atom(s) any of nitrogen, oxygen and sulfur atoms, or a 1–20C alkyl, alkenyl or alkynyl group. The $Ar^{31}$ and $R^{32}$ groups each may have a substituent group, such as an alkyl group, an alkoxy group, an alkylthio group, an acyl group or a substituted amino group (the substituent of which includes alkyl, alkenyl, alkynyl, aryl and heterocyclic groups) $R^{34}$, $R^{35}$ and $R^{36}$ are each a hydrogen atom or a substituent group, such as an alkyl group, an alkoxy group, an alkylthio group, an alkenyl group, an acyl group, a sulfonyl group, an alkoxycarbonyl group, a carbonamido group or a cyano group. $Z^3$ is any of the rings represented by formulae (B) to (G) respectively. And L is a group comprising one nucleus or at least two linked nuclei (polymerized nuclei), preferably a monomeric to eicosameric group, the nucleus or nuclei of which are selected from the family consisting of aniline, benzene, thiophene, pyrrole, furan, selenophene, naphthalene, anthracene, pyridine, pyridazine, pyrimidine, azulene, carbazole, arylenevinylene, aryleneethynylene, arylenephenylene and triarylamine (the arylene or aryl moiety of which is a group derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole or oxadiazole). Such a nuclei or nuclei may further be combined with an oxygen, nitrogen, sulfur or methylene linkage.

The desirable combinations in formula (XIII) are described below: The $Ar^{41}$ groups, which may be the same or different, each represent a 6–30C monocyclic or bicyclic arylene group (e.g., phenylene or naphthylene) or a divalent 5 or 6-membered aromatic heterocyclic group containing as hetero atom(s) any of nitrogen, oxygen and sulfur atoms. $R^{42}$ represents a 6–30C monocyclic or bicyclic aryl group (e.g., phenyl, naphthyl), a 5 or 6-membered aromatic heterocyclic group containing as hetero atom(s) any of nitrogen, oxygen and sulfur atoms, or a 1–20C alkyl, alkenyl or alkynyl group. The $Ar^{41}$ and $R^{42}$ groups each may have a substituent group, such as an alkyl group, an alkoxy group, an alkylthio group, an acyl group or a substituted amino group (the substituent of which includes alkyl, alkenyl, alkynyl, aryl and heterocyclic groups). $R^{44}$, $R^{45}$ and $R^{46}$ are each a hydrogen atom or a substituent group, such as an alkyl group, an alkoxy group, an alkylthio group, an alkenyl group, an acyl group, a sulfonyl group, an alkoxycarbonyl group, a carbonamido group or a cyano group. $Z^4$ is any of the rings derived from the acidic nuclei represented by formulae (B) to (G) respectively.

The more desirable combinations in formula (XII) are embodied in formula (XIV). The favorable combinations in formula (XIV) are described below: $R^{54}$, $R^{55}$ and $R^{56}$ are each a hydrogen atom or a substituent group, such as an alkyl group, an alkoxy group, an alkylthio group, an alkenyl group, an acyl group, a sulfonyl group, an alkoxycarbonyl group, a carbonamido group or a cyano group. $Z^5$ is any of the rings represented by formulae (B) to (G) respectively. $R^{57}$ and $R^{58}$ are each an alkyl group, an alkoxy group, an alkylthio group, an acyl group or a substituted amino group (the substituent of which includes an alkyl group, an alkenyl group, an alkynyl group, an aryl group or a heterocyclic group). And L is a group comprising one nucleus or at least two linked nuclei (polymerized nuclei), preferably a monomeric to eicosameric group, the nucleus or nuclei of which are selected from the family consisting of aniline, benzene, thiophene, pyrrole, furan, selenophene, naphthalene, anthracene, pyridine, pyridazine, pyrimidine, azulene, carbazole, arylenevinylene, aryleneethynylene, arylenephenylene and triarylamine (the arylene or aryl moiety of which is a group derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole or oxadiazole). Such a nucleus or nuclei may further be combined with an oxygen, nitrogen, sulfur or methylene linkage.

The more desirable combinations in formula (XIII) are embodied in formula (XV). The favorable combinations in formula (XV) are described below: $R^{62}$ represents a 6–30C monocyclic or bicyclic aryl group (e.g., phenyl, naphthyl), a 5 or 6-membered aromatic heterocyclic group containing as hetero atom(s) any of nitrogen, oxygen and sulfur atoms, or a 1–20C alkyl, alkenyl or alkynyl group. The $R^{62}$ group may have a substituent group, and such a substituent and $R^{67}$ are each an alkyl group, an alkoxy group, an alkylthio group, an acyl group or a substituted amino group (the substituent of which includes alkyl, alkenyl, alkynyl, aryl and heterocyclic groups) $R^{64}$, $R^{65}$ and $R^{66}$ are each a hydrogen atom or a substituent group, such as an alkyl group, an alkoxy group, an alkylthio group, an alkenyl group, an acyl group, a sulfonyl group, an alkoxycarbonyl group a carbonamido group or a cyano group. And $Z^6$ is any of the rings represented by formulae (B) to (G) respectively.

The more desirable combinations in formula (XIV) are embodied in formula (XVI). The favorable combinations in formula (XVI) are described below: $R^{74}$ represents a hydrogen atom or a substituent group, such as an alkyl group, an alkoxy group, an alkylthio group, an alkenyl group, an acyl group, a sulfonyl group, an alkoxycarbonyl group, a carbonamido group or a cyano group. $Z^7$ represents atoms forming a 5- to 7-membered ring, which may be fused together with another ring. Suitable examples of such rings include rings generally employed as acidic nuclei of merocyanine dyes. $R^{77}$ and $R^{78}$ are each an alkyl group, an alkoxy group, an alkylthio group, an acyl group or a substituted amino group (the substituent of which includes alkyl, alkenyl, alkynyl, aryl and heterocyclic groups). And L is a group comprising one nucleus or at least two linked nuclei (polymerized nuclei), preferably a monomeric to eicosameric group, the nucleus or nuclei of which are selected from the family consisting of aniline, benzene, thiophene, pyrrole, furan, selenophene, naphthalene, anthracene, pyridine, pyridazine, pyrimidine, azulene, carbazole, arylenevinylene, aryleneethynylene, arylenephenylene and triarylamine (the arylene or aryl moiety of which is a group derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole or oxadiazole). Such a nucleus or nuclei may further be combined with an oxygen, nitrogen, sulfur or methylene linkage.

The desirable combinations in formula (XVI) are represented by formula (XVII). Therein, suitable $R^{84}$, $R^{87}$, $R^{88}$ and L have the same meanings as $R^{74}$, $R^{77}$, $R^{78}$ and L in formula (XVI) respectively, and the acidic nucleus is a ring represented by formula (A). The more desirable combinations in formula (XVII) are described below: $R^{84}$ is a hydrogen atom, a 1–20C alkyl group, a 1–20C alkenyl group, a 1–20C acyl group, a 1–20C sulfonyl group, a 1–20C alkoxycarbonyl group, a 1–20C carbonamido group or a cyano group. $R^{87}$ and $R^{88}$ are each a 1–20C alkyl group, a 1–20C alkoxy group or a 1–20C substituted amino group (the substituent of which includes alkyl, alkenyl, alkynyl, aryl and heterocyclic groups). The acidic nucleus is a ring represented by formula (B), (C), (D), (E), (F) or (G), particularly preferably a 1,3-indanedione nucleus, a 2,4,6-triketohexahydropyrimidine nucleus (including its thioketone body), a pyrazolone nucleus, an isooxazolinone nucleus, an oxazolinone nucleus, a furanone nucleus, an oxyindole nucleus, a 1-indanone nucleus, an imidazolidone nucleus, a 1,2,3,6-tetrahydropyridine-2,6-dione nucleus, a benzothiophene-3-one nucleus, an oxobenzothiophene-3-one nucleus, a dioxobenzothiophene-3-one nucleus, a coumaranone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus. And L is a group comprising one nucleus or at least two linked nuclei (polymerized nuclei), preferably a monomeric to eicosameric group, the nucleus or nuclei of which are selected from the family consisting of aniline, benzene, thiophene, pyrrole, furan, selenophene, naphthalene, anthracene, pyridine, pyridazine, pyrimidine, azulene, carbazole, arylenevinylene, aryleneethynylene, arylenephenylene and triarylamine (the arylene or aryl moiety of which is a group derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole or oxadiazole). Such a nucleus or nuclei may further be combined with an oxygen, nitrogen, sulfur or methylene linkage.

The desirable combinations in formula (XVIII) are described below: $R^{94}$ is a hydrogen atom, a 1–20C alkyl group, a 1–20C alkenyl group, a 1–20C acyl group, a 1–20C sulfonyl group, a 1–20C alkoxycarbonyl group, a 1–20C carbonamido group or a cyano group. $R^{97}$ and $R^{98}$ are each a 1–20C alkyl group, a 1–20C alkoxy group or a 1–20C substituted amino group (the substituent of which includes alkyl, alkenyl, alkynyl, aryl and heterocyclic groups). The acidic nucleus is a ring represented by formula (B), (C), (D), (E), (F) or (G). And L is a group derived from a monomer to a polymer, preferably a monomer to an eicosamer, of aniline, benzene, thiophene, pyrrole, furan, selenophene, naphthalene, anthracene, pyridine, pyridazine, pyrimidine, azulene, carbazole, arylenevinylene, aryleneethynylene, arylenephenylene or triarylamine (the arylene or aryl moiety of which is a group derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole or oxadiazole). Such a group may further have an oxygen, nitrogen, sulfur or methylene linkage.

In more desirable combinations, $R^{94}$ is a hydrogen atom, a 1–20C alkenyl group, a 1–20C acyl group, a 1–20C sulfonyl group, a 1–20C alkoxycarbonyl group, a 1–20C carbonamido group or a cyano group, while $R^{97}$ and $R^{98}$ are each a 1–20C alkyl group, a 1–20C alkoxy group or a 1–20C substituted amino group (the substituent of which includes alkyl, alkenyl, alkynyl, aryl and heterocyclic groups). The acidic nucleus is a 1,3-indanedione nucleus, a 2,4,6-triketohexahydropyrimidine nucleus (including its thioketone body), a pyrazolone nucleus, an isooxazolinone nucleus, an oxazolinone nucleus, a furanone nucleus, an oxyindole nucleus, a 1-indanone nucleus, an imidazolidone nucleus, a 1,2,3,6-tetrahydropyridine-2,6-dione nucleus, a benzothiophene-3-one nucleus, an oxobenzothiophene-3-one nucleus, a dioxobenzothiophene-3-one nucleus, a coumaranone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus. And L is a group comprising one nucleus or at least two linked nuclei (polymerized nuclei), preferably a monomeric to eicosameric group, the nucleus or nuclei of which are selected from the family consisting of aniline, benzene, thiophene, pyrrole, furan, selenophene, naphthalene, anthracene, pyridine, pyridazine, pyrimidine, azulene, carbazole, arylenevinylene, aryleneethynylene, arylenephenylene and triarylamine (the arylene or aryl moiety of which is a group derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole or oxadiazole). Such a nucleus or nuclei may further be combined with an oxygen, nitrogen, sulfur or methylene linkage.

In particularly desirable combinations, $R^{94}$ is a hydrogen atom, a 1–10C alkenyl group, a 1–10C acyl group, a 1–10C sulfonyl group, a 1–10C alkoxycarbonyl group, a 1–10C carbonamido group or a cyano group, while $R^{97}$ and $R^{98}$ are each a 1–10C alkyl group, a 1–10C alkoxy group or a 1–20C substituted amino group (the substituent of which includes alkyl, alkenyl, alkynyl, aryl, thiophenyl, pyrrolyl, furanyl, selenophenyl, naphthyl, anthrayl, pyridyl, pyridazinyl, pyrimidyl, azulenyl and carbazolyl groups). The acidic nucleus is a 1,3-indanedione nucleus, a 2,4,6- triketohexahydropyrimidine nucleus (including its thioketone body), a pyrazolone nucleus, an isooxazolinone nucleus, an oxazolinone nucleus, a 1-indanone nucleus, a furanone nucleus, an oxyindole nucleus, an imidazolidone nucleus, a 1,2,3,6-tetrahydropyridine-2,6-dione nucleus, a benzothiophene-3-one nucleus, an oxobenzothiophene-3-one nucleus, a dioxobenzothiophene-3-one nucleus, a coumaranone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus. And L is a group derived from one nucleus or two to six linked nuclei, the nucleus or nuclei of which are selected from the family consisting of aniline, benzene, thiophene, pyrrole, furan, selenophene, naphthalene, anthracene, pyridine, pyridazine, pyrimidine, azulene, carbazole, arylenevinylene, aryleneethynylene, arylenephenylene and triarylamine (the arylene or aryl moiety of which is a group derived from benzene, thiophene, pyrrole, furan, selenophene, imidazole, pyrazole, pyridine, pyrazine, pyridazine, triazole, triazine, indole, indazole, purine, thiazoline, thiazole, thiadiazole, oxazoline, oxazole or oxadiazole). Such a nucleus or nuclei may further be combined with an oxygen, nitrogen, sulfur or methylene linkage.

Examples of a compound represented by formula (I) are illustrated below, but it should be understood that these examples are not to be construed as limiting the scope of the invention in any way.

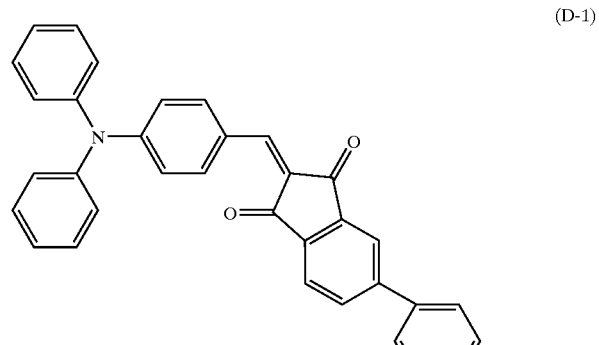
(D-1)

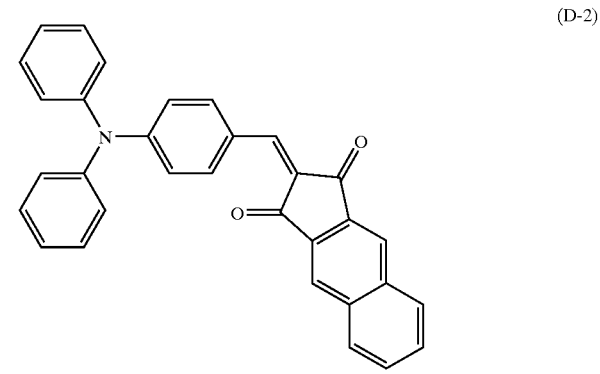
(D-2)

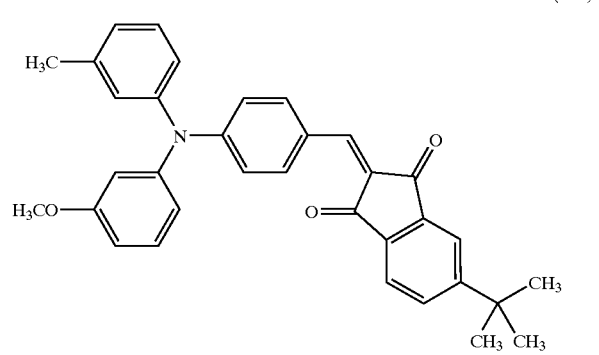
(D-3)

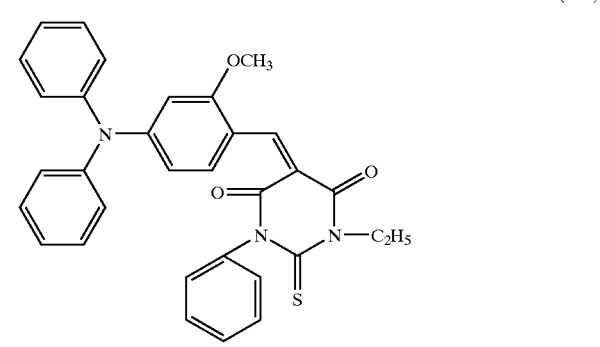
(D-4)

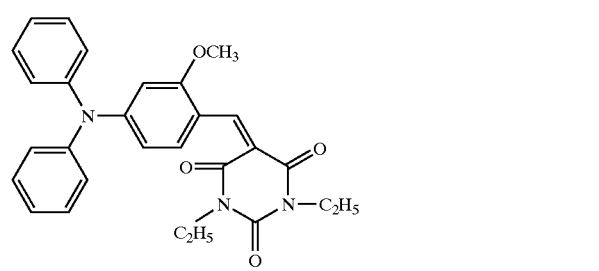
(D-5)

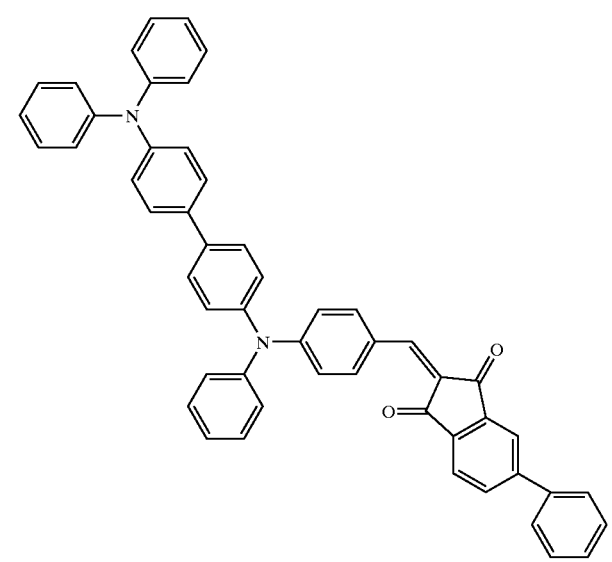
(D-6)

-continued
(D-7)
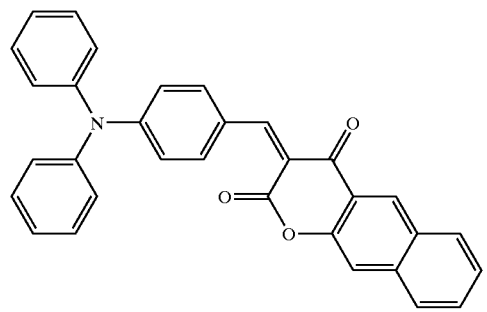
(D-8)
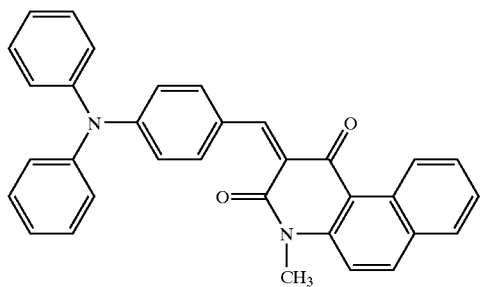
(D-9)
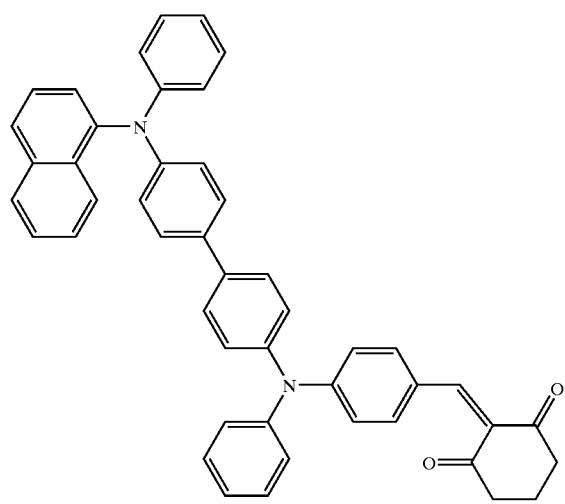
(D-10)
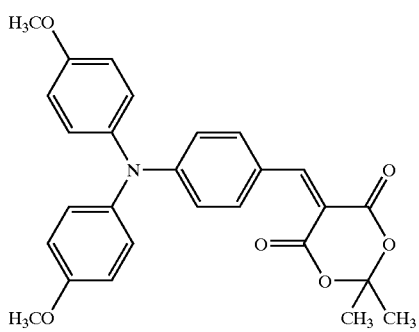
(D-11)
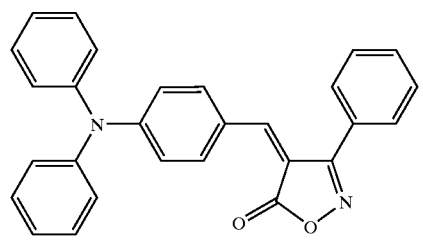
(D-12)
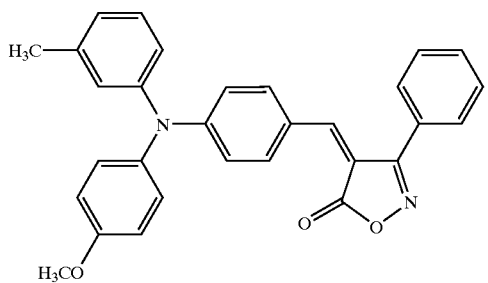
(D-13)
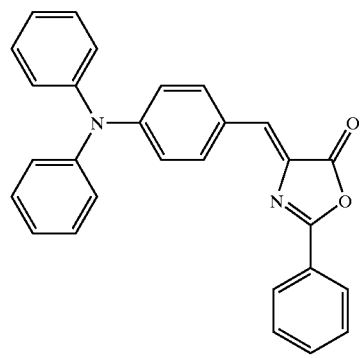
(D-14)
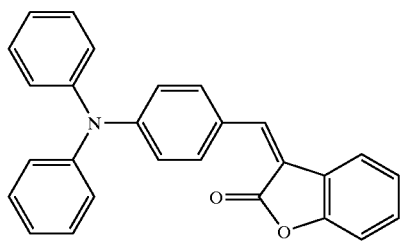

-continued
(D-15)
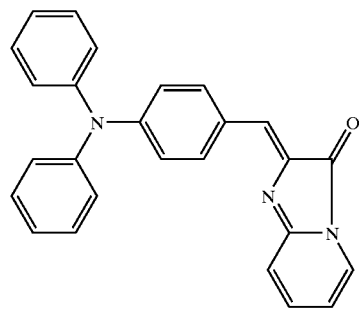
(D-16)
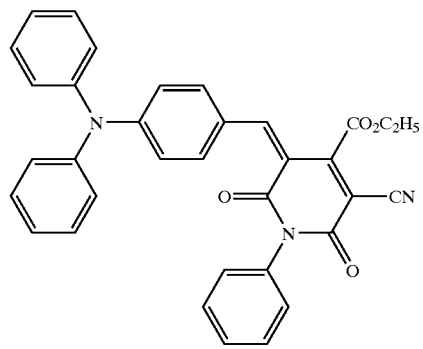
(D-17)
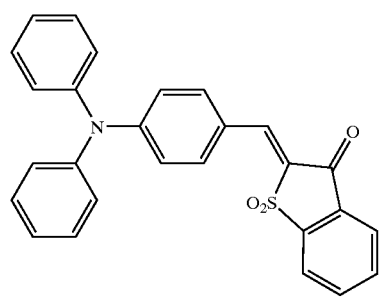
(D-18)
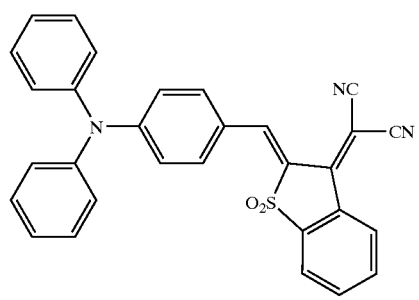
(D-19)
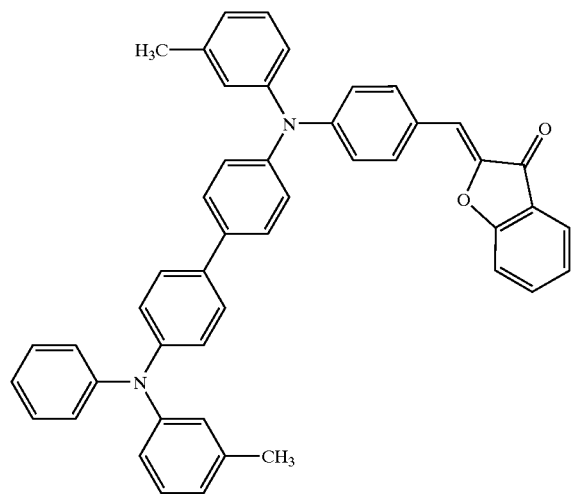
(D-20)
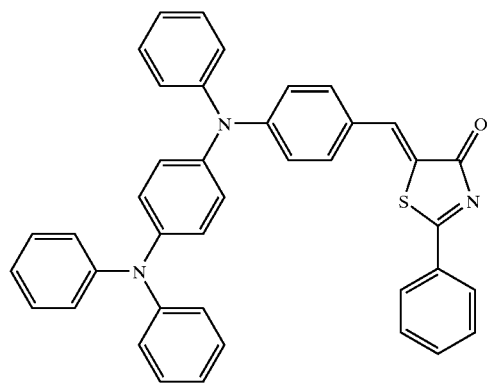
(D-21)
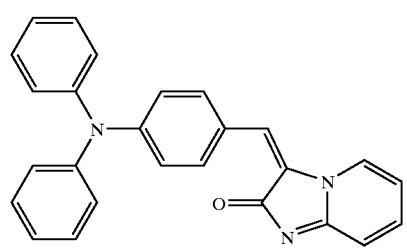
(D-22)
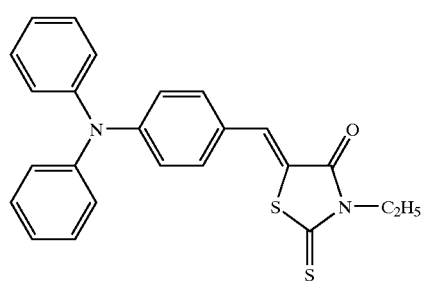

(D-23)
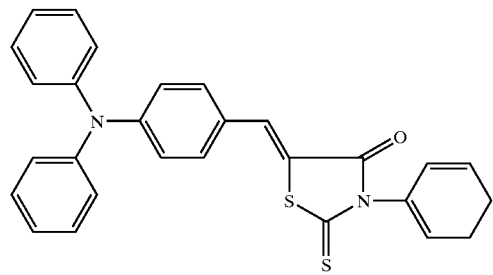
(D-24)
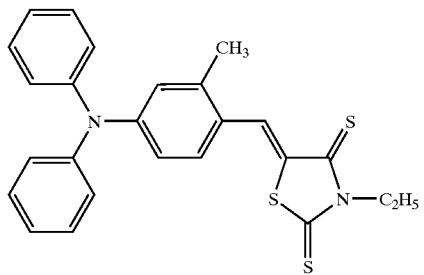
(D-25)
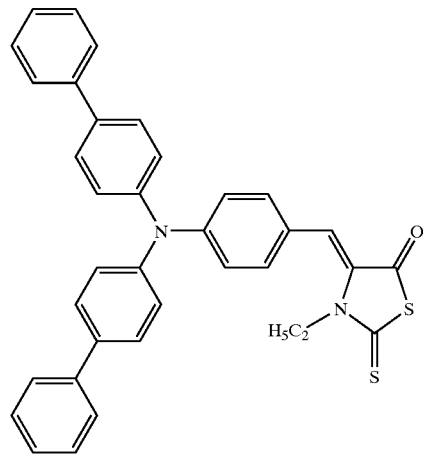
(D-26)
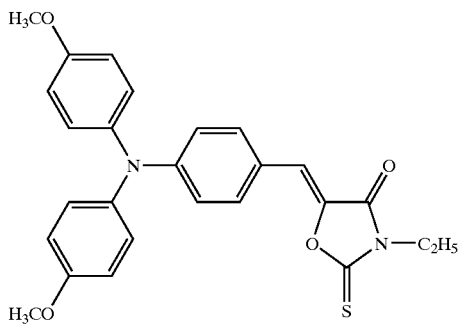
(D-27)
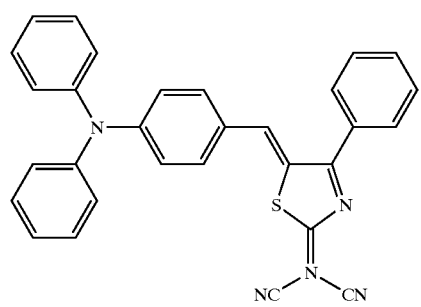
(D-28)
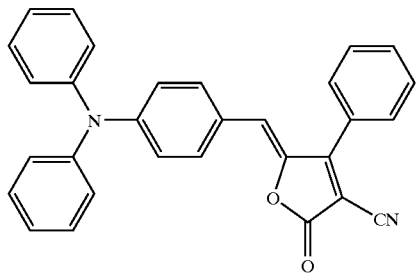
(D-29)
(D-30)
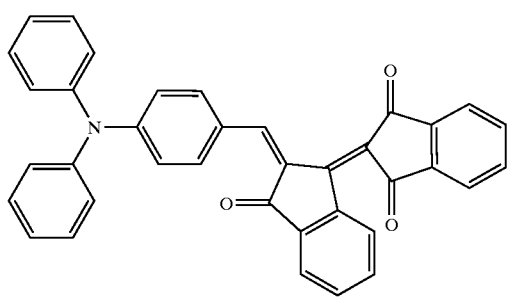

-continued
(D-31) 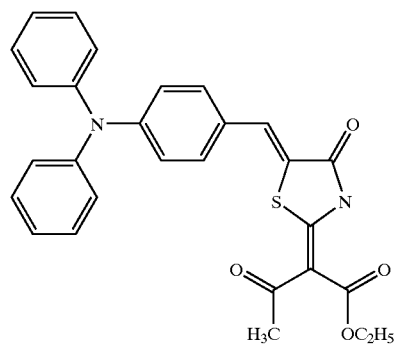
(D-32) 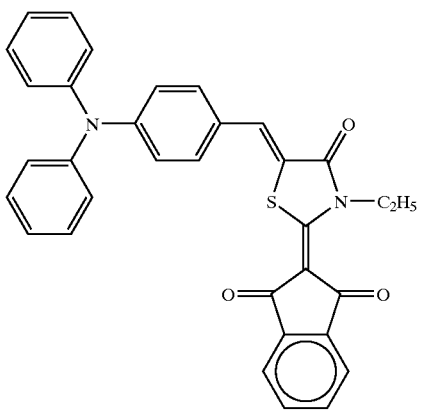
(D-33) 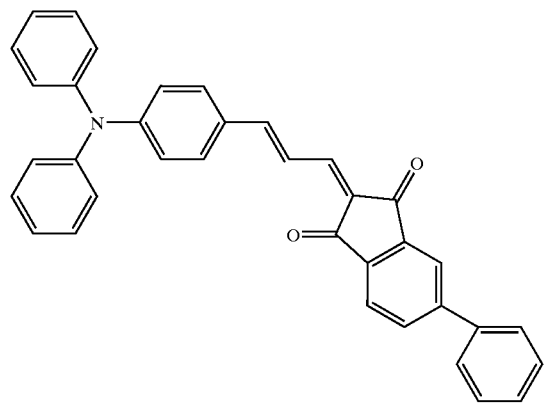
(D-34) 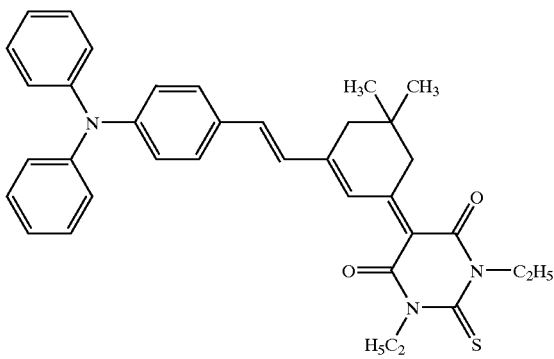
(D-35) 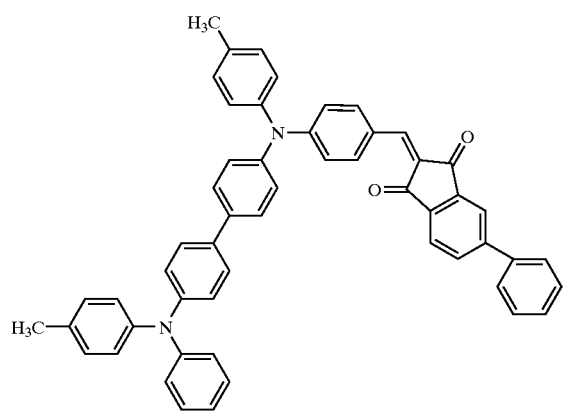
(D-36) 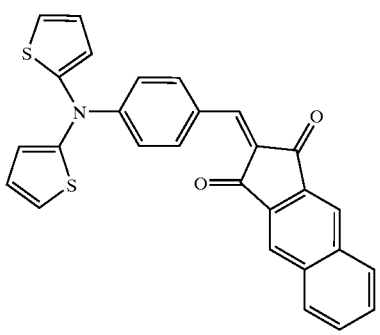
(D-37) 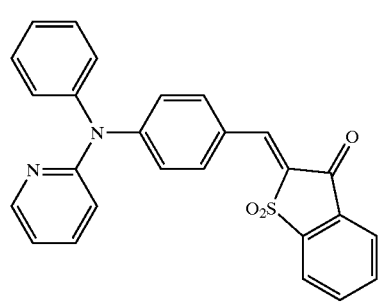
(D-38) 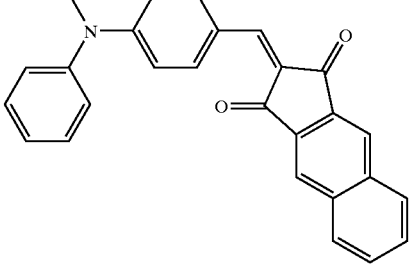
Weight average molecular weight: 50.000 on a polystyrene basis -continued
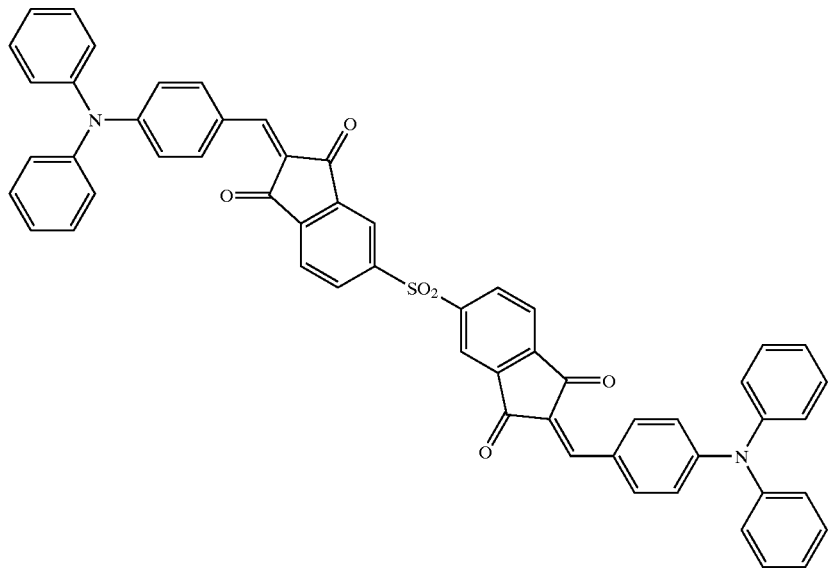
(D-39)
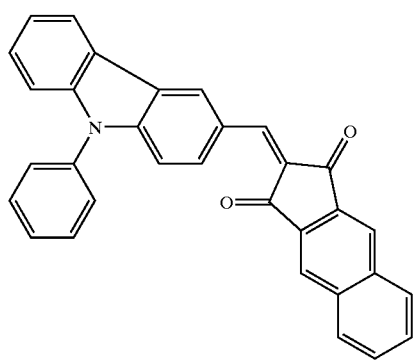
(D-40)
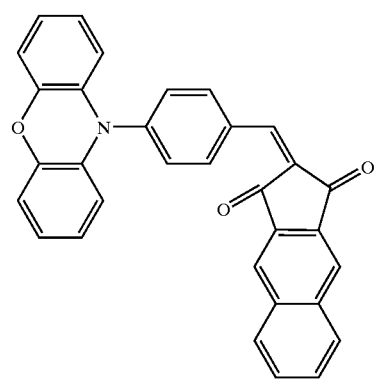
(D-41)
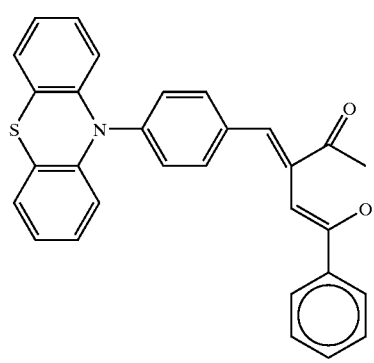
(D-42)
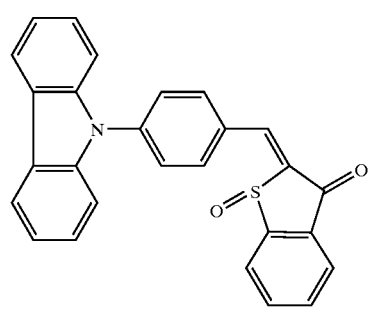
(D-43)
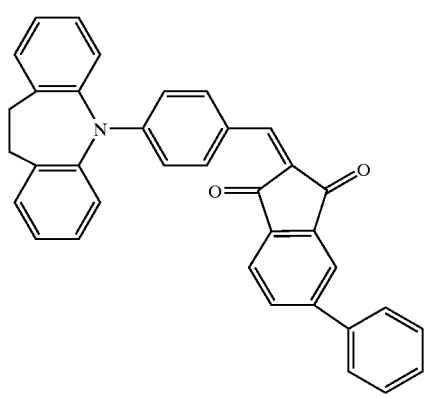
(D-44)
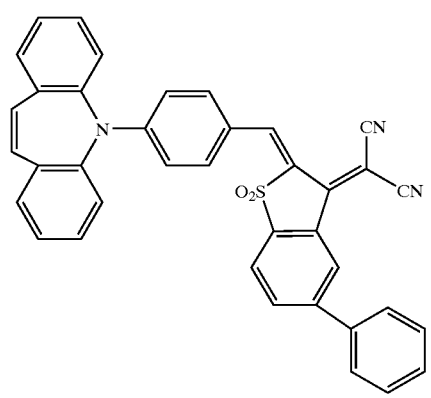
(D-45)

-continued
(D-46)
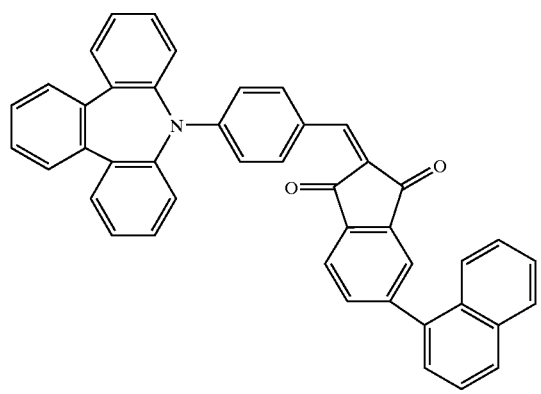
(D-47)
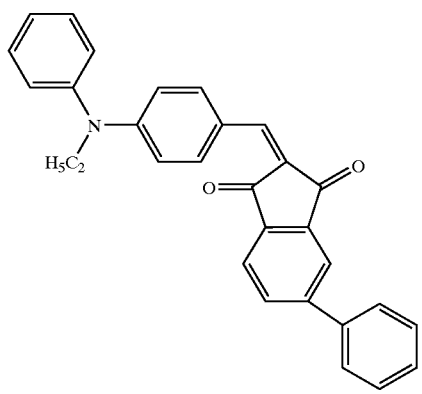
(D-48)
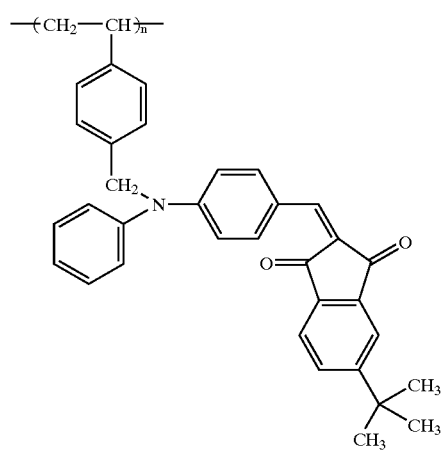
Weight average molecular weight:
500.000
(D-49)
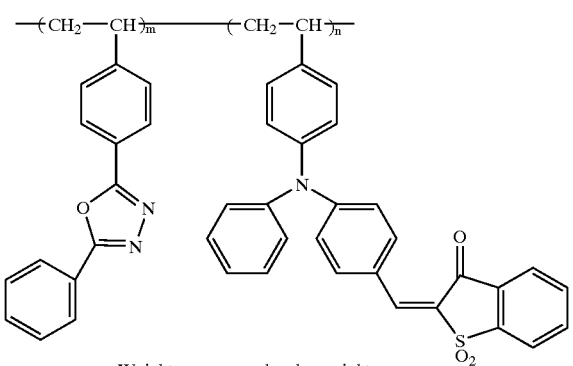
Weight average molecular weight:
100.000
m:n = 1:1 (weight ratio)
(D-50)
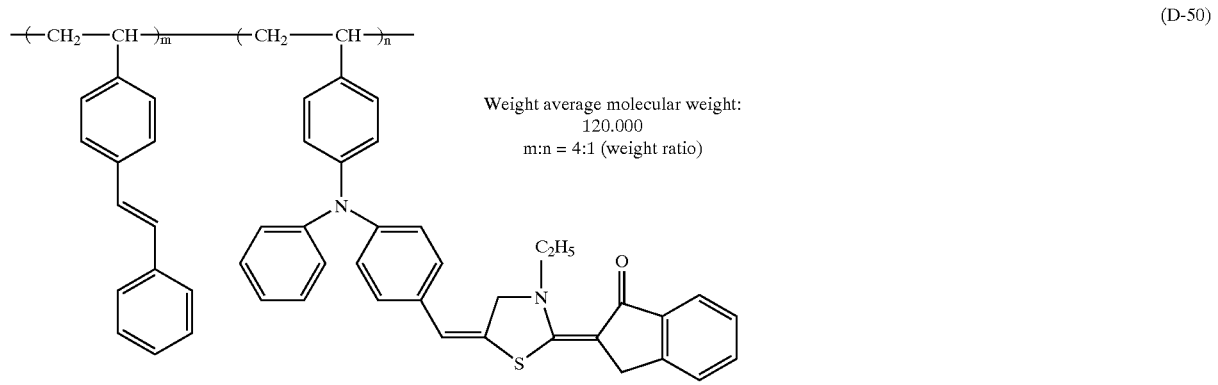
Weight average molecular weight:
120.000
m:n = 4:1 (weight ratio)

-continued
(D-51)
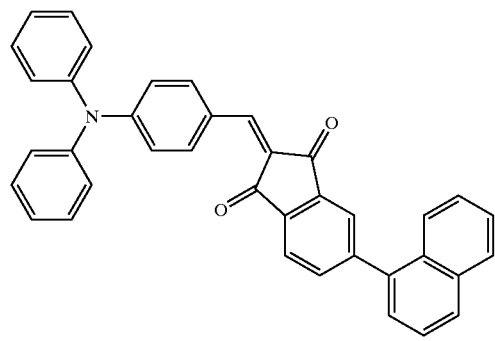
(D-52)
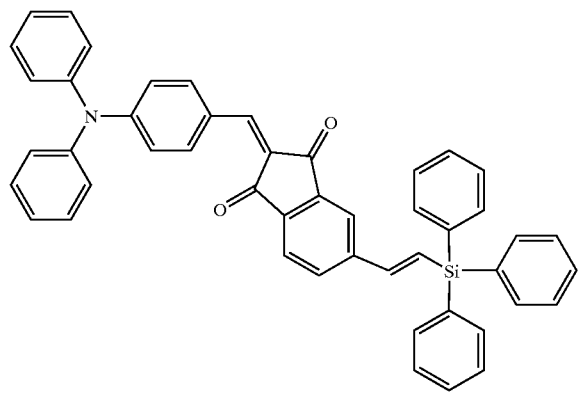
(D-53)
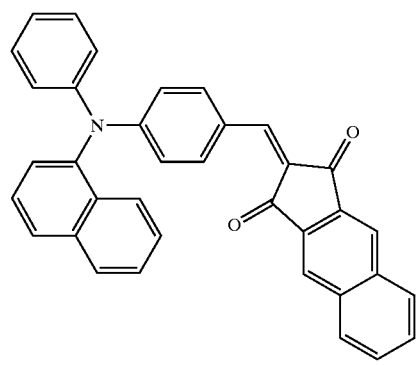
(D-54)
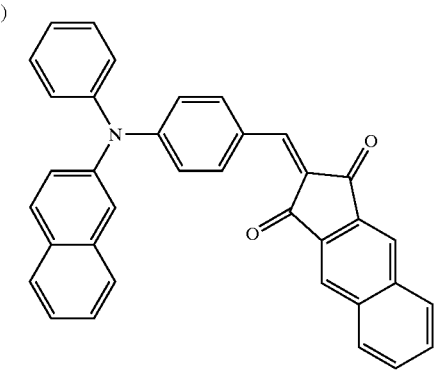
(D-55)
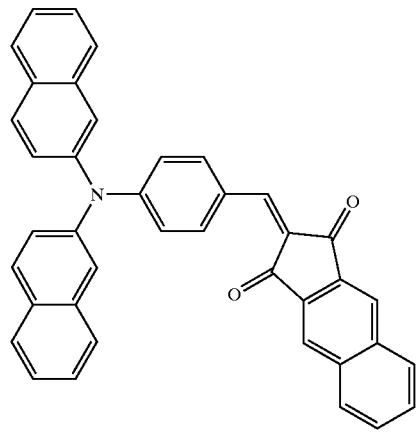
(D-56)
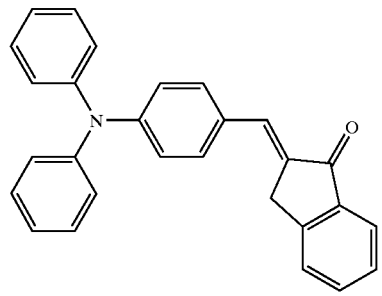
(D-57)
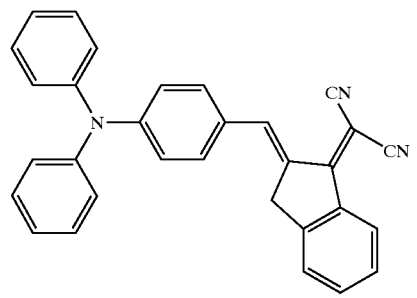
(D-58)
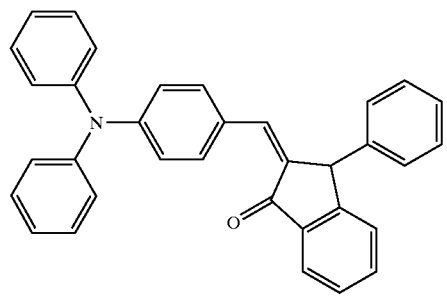

-continued
(D-59)
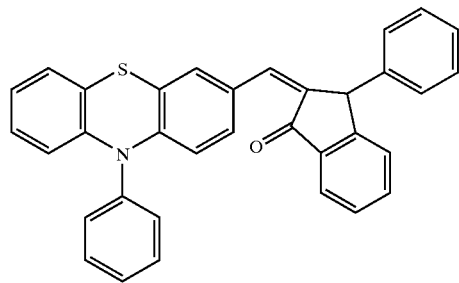
(D-60)
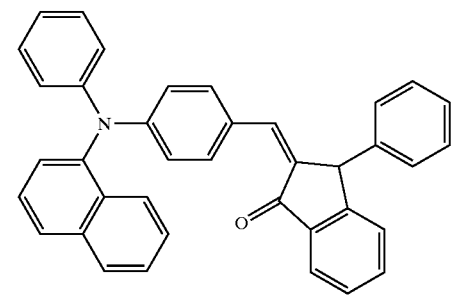
(D-61)
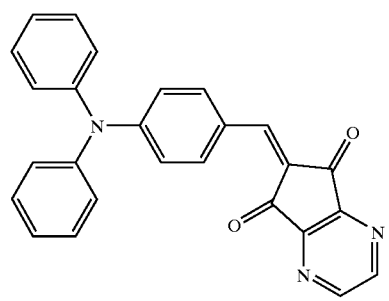
(D-62)
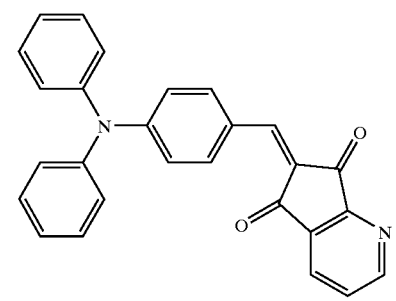
(E-1)
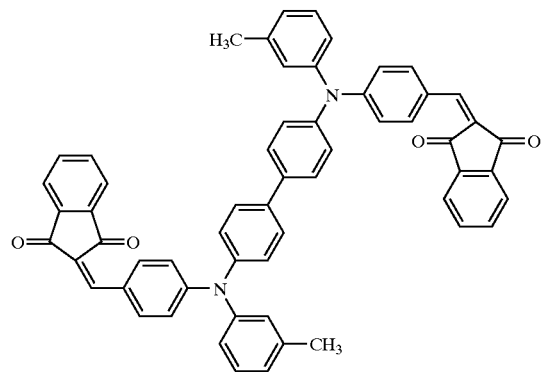
(E-2)
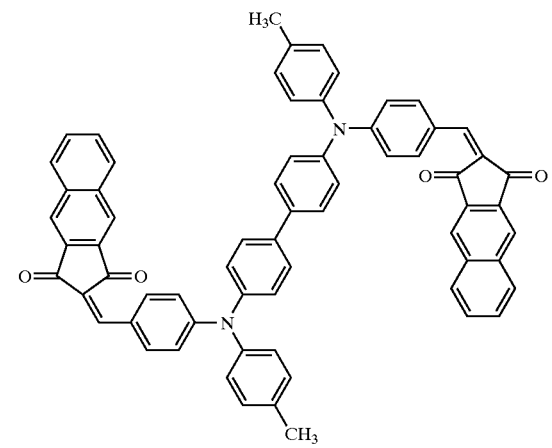
(E-3)
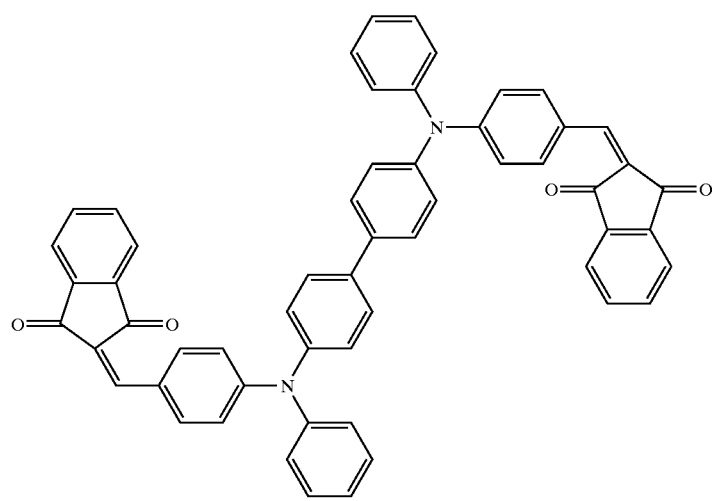

-continued
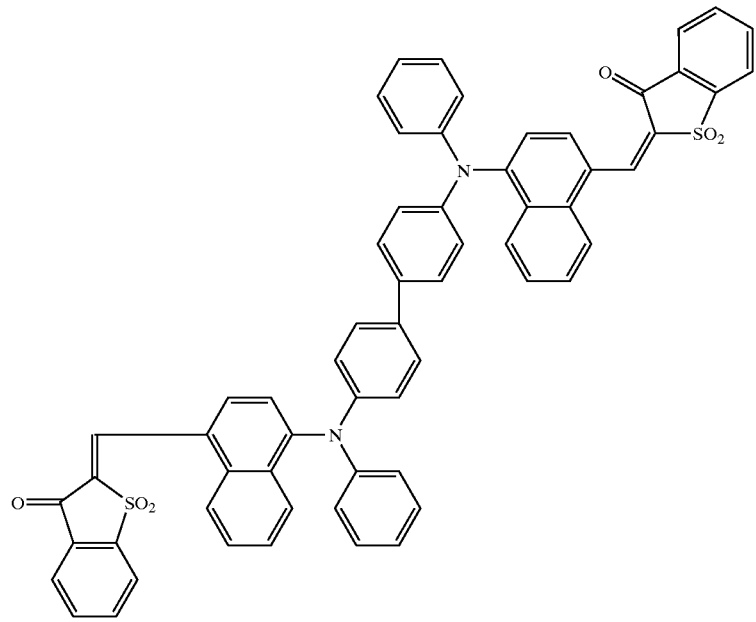
(E-4)
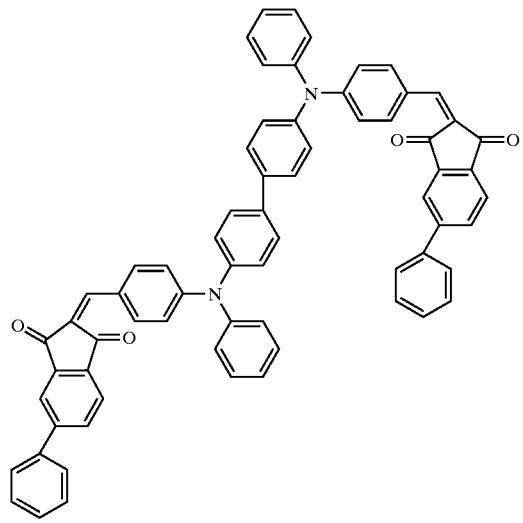
(E-5)
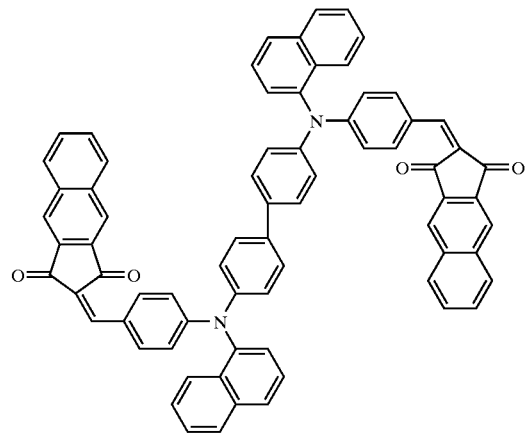
(E-6)

-continued
(E-7)
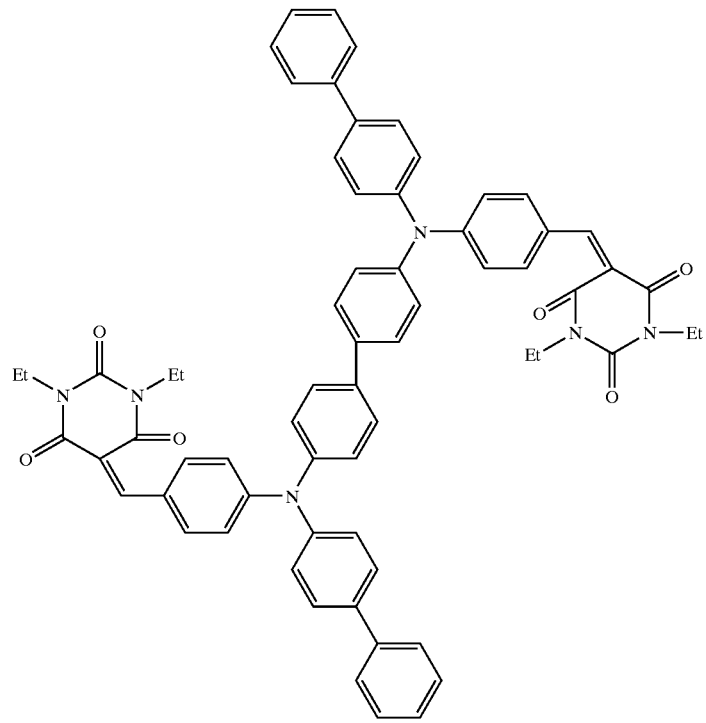
(E-8)
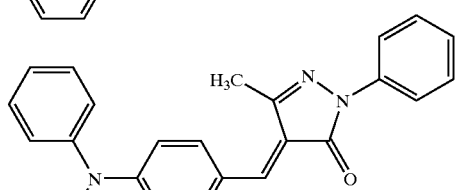
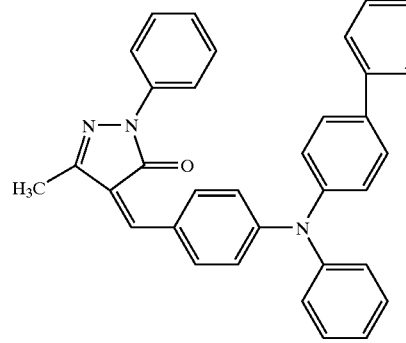
(E-9)
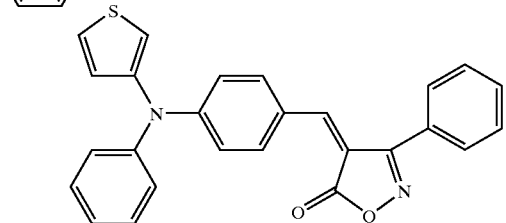
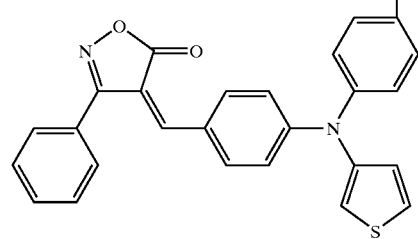

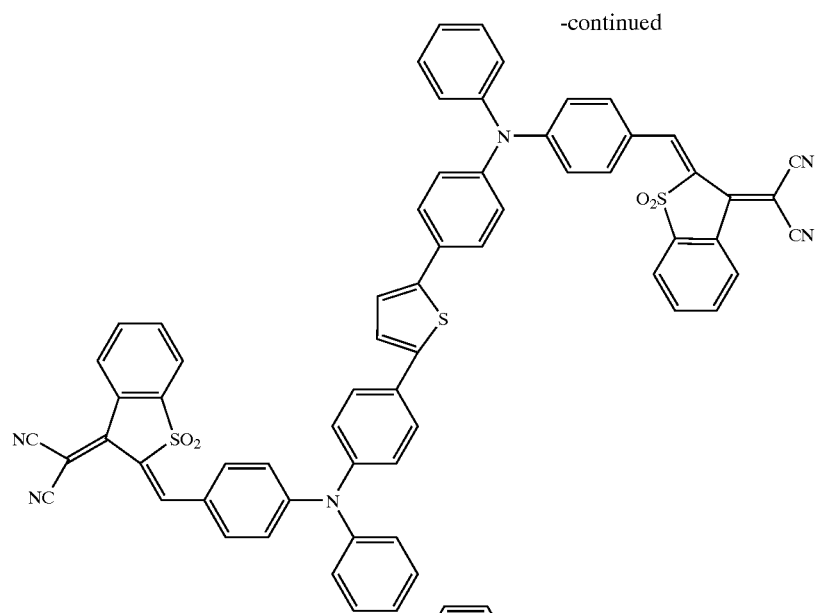
(E-10)
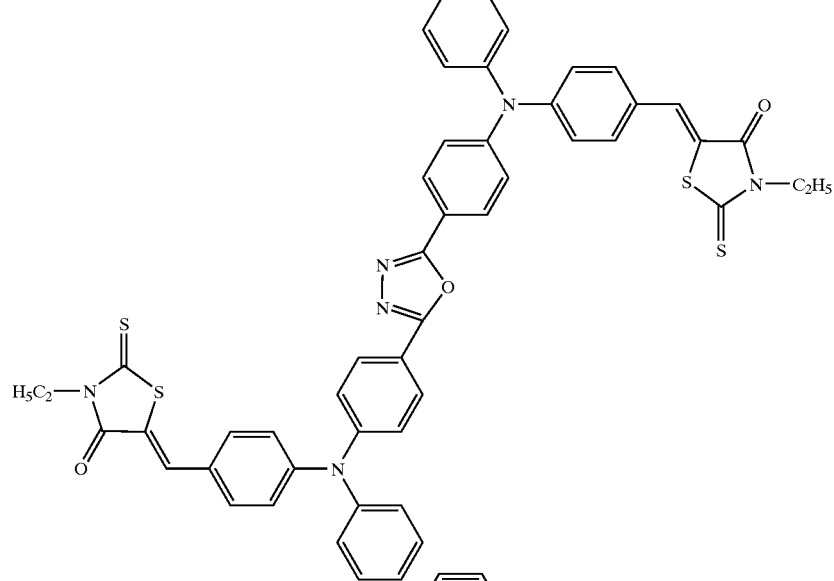
(E-11)
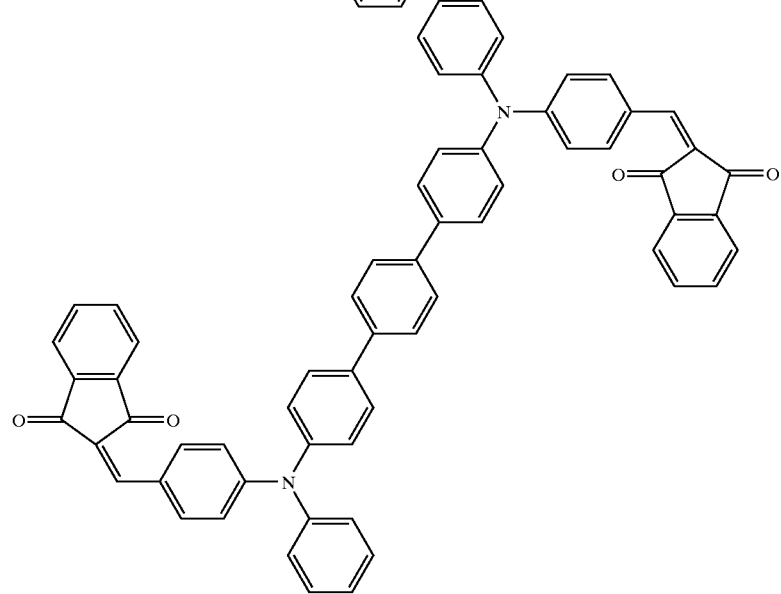
(E-12)

-continued
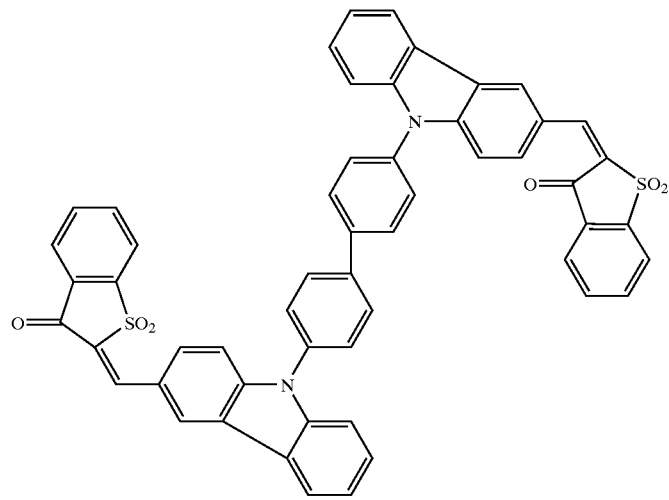
(E-13)
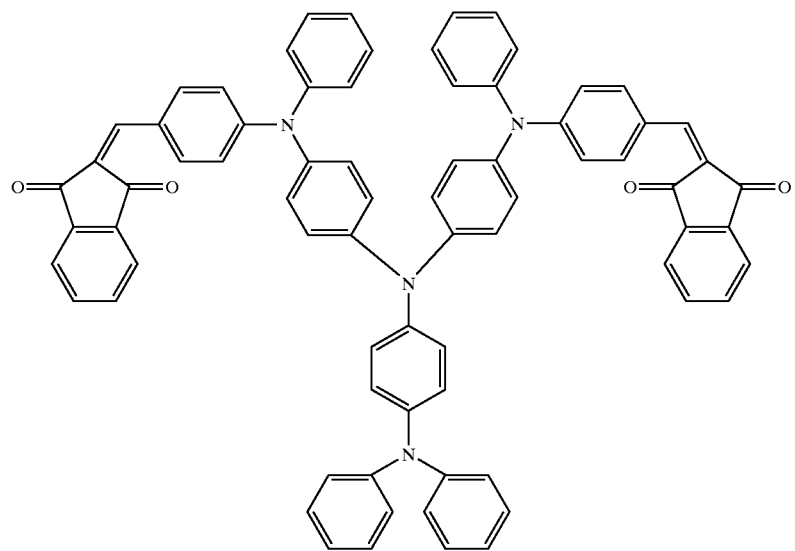
(E-14)

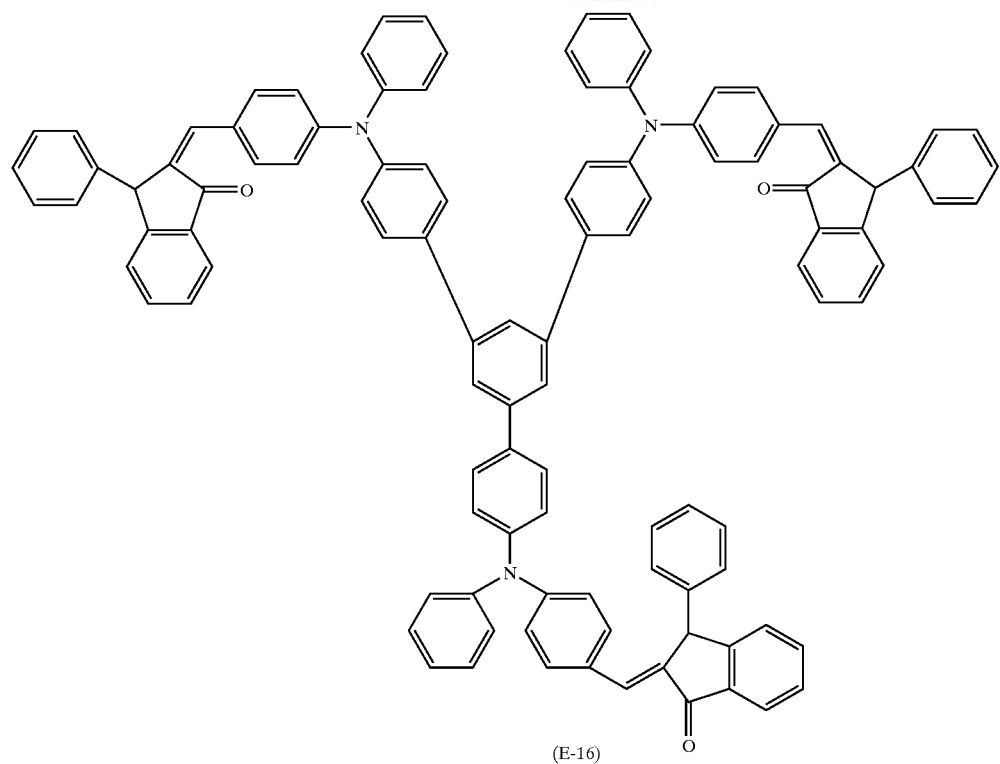
(E-15)
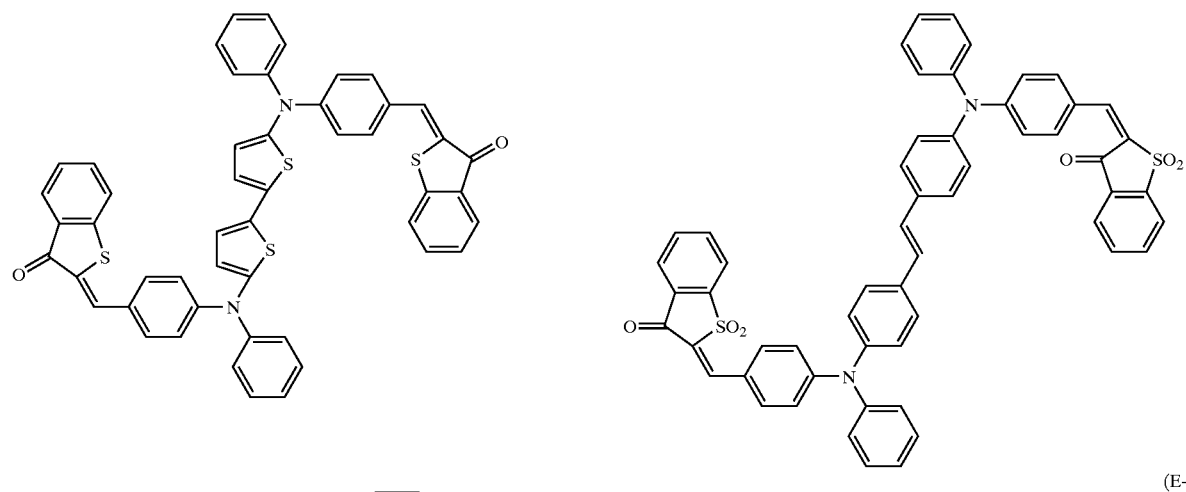
(E-16)  (E-17)
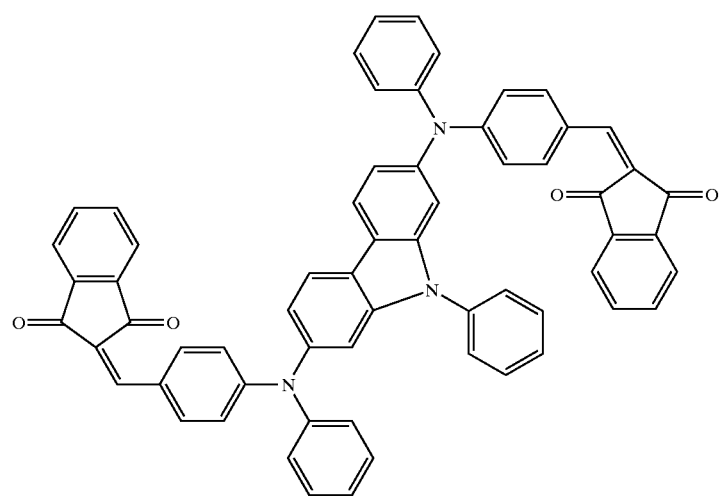
(E-18)

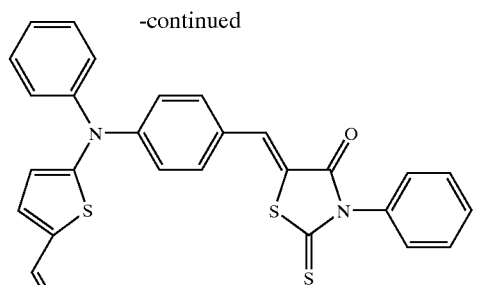
(E-19)
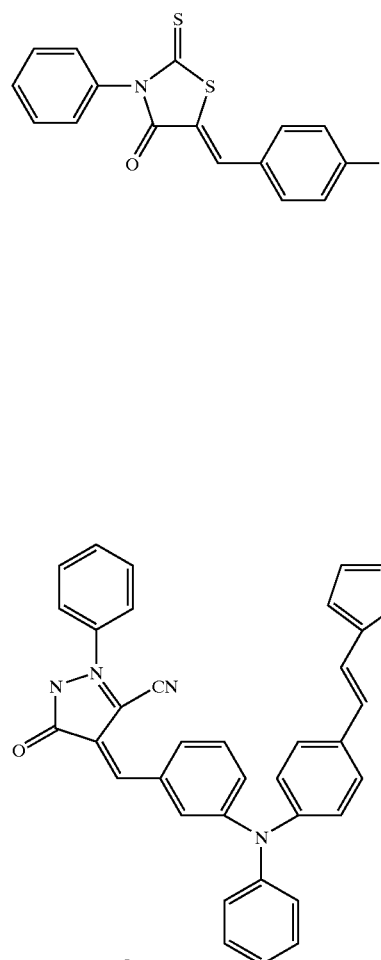
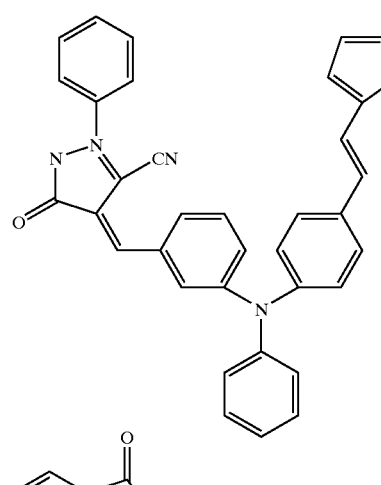
(E-20)
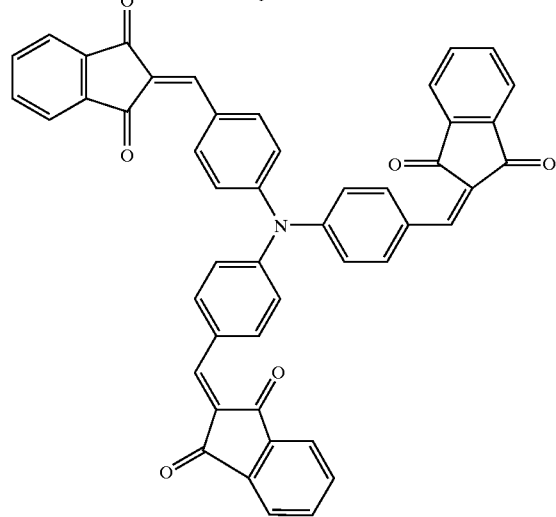
(E-21)

-continued
(E-22)
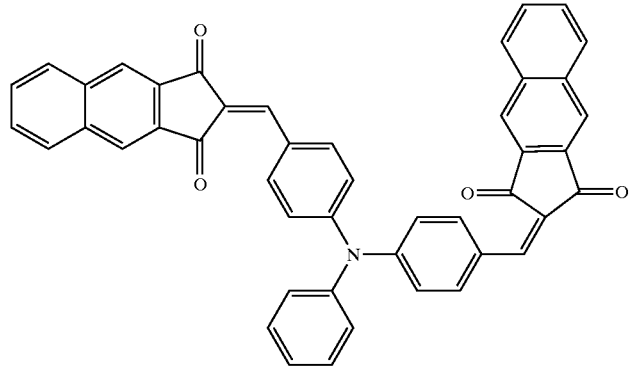
(E-23)
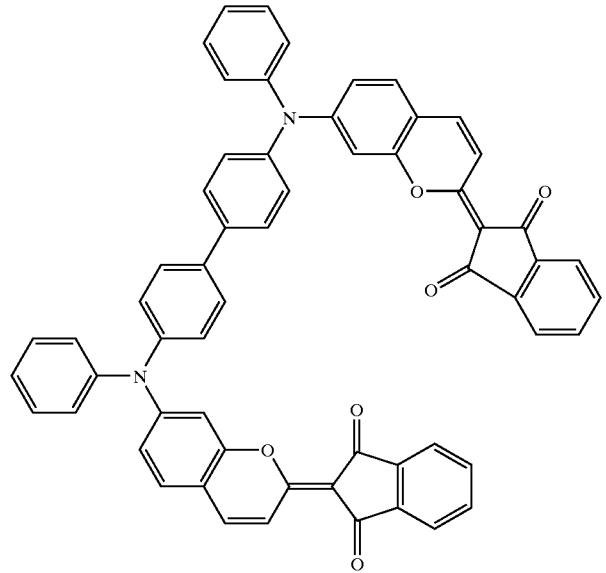
(E-24)
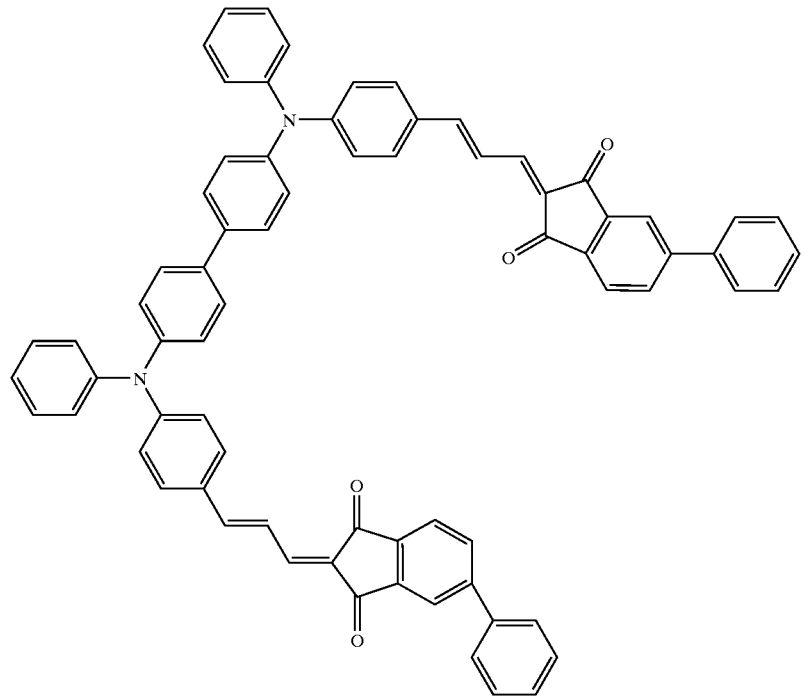

-continued
(E-25)
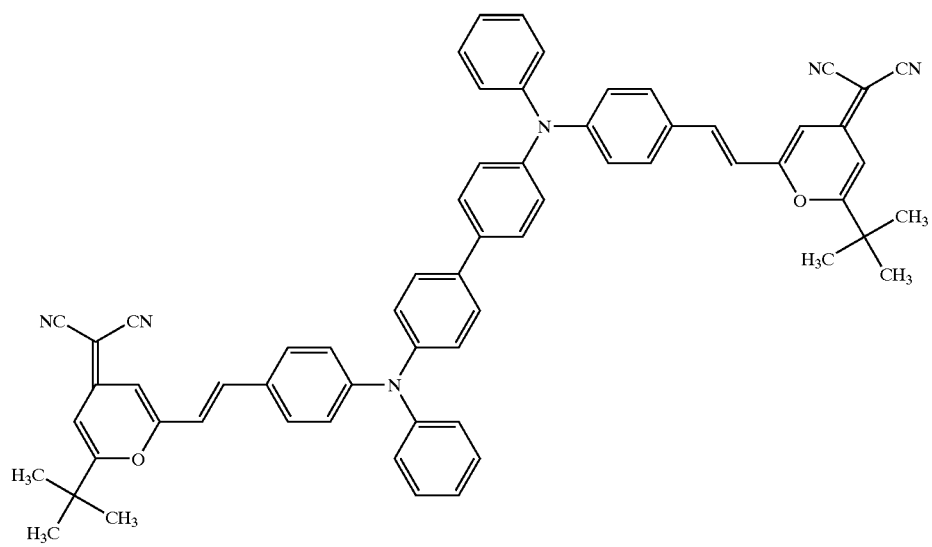
(E-26) (E-27)
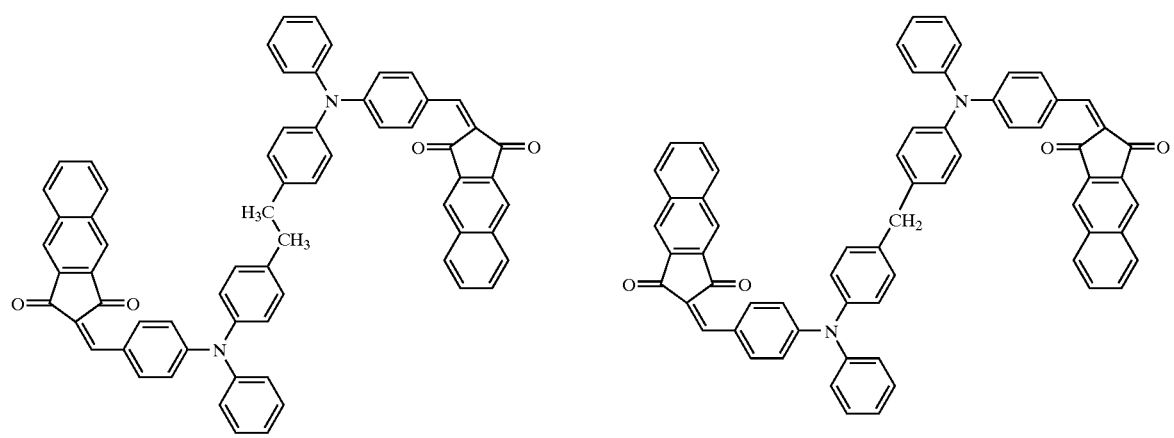
(E-28) (E-29)
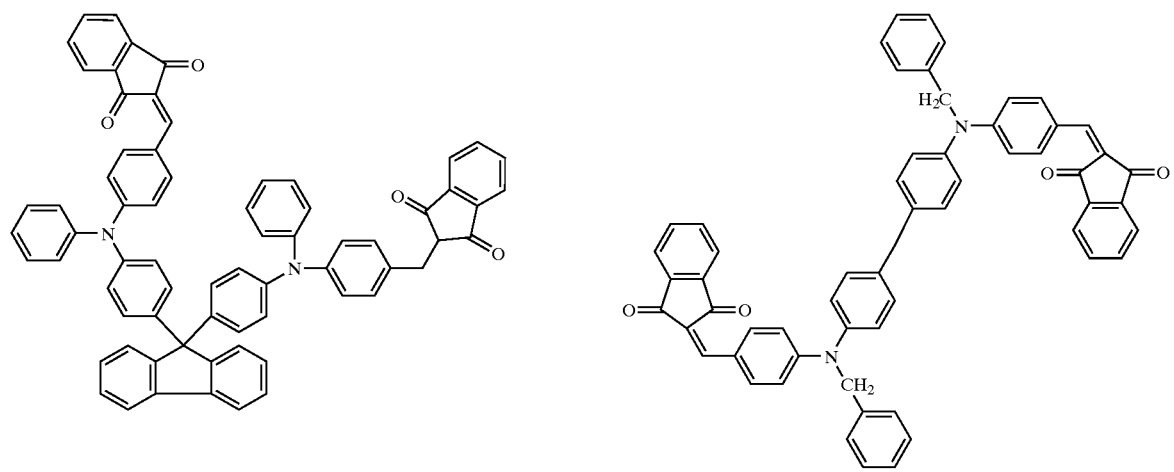

-continued
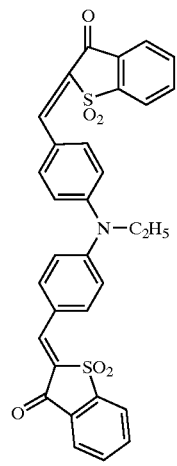
(E-30)
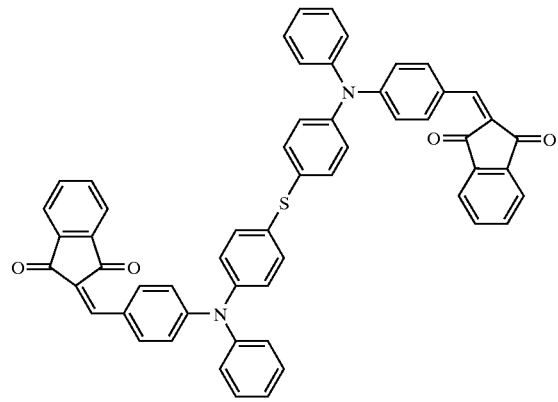
(E-31)
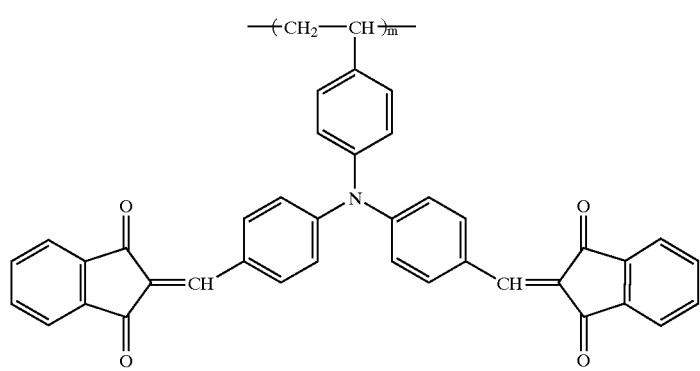
(E-32)
Weight average molecular weight: 42,000 on a polystyrene basis
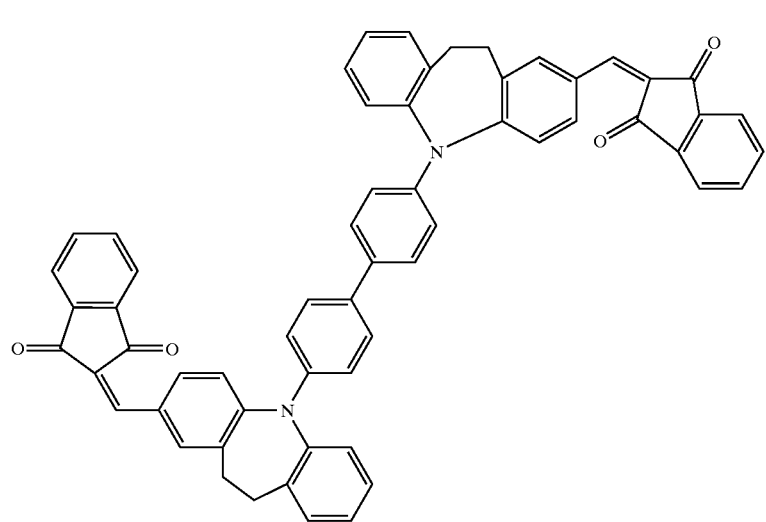
(E-33)

(E-34)
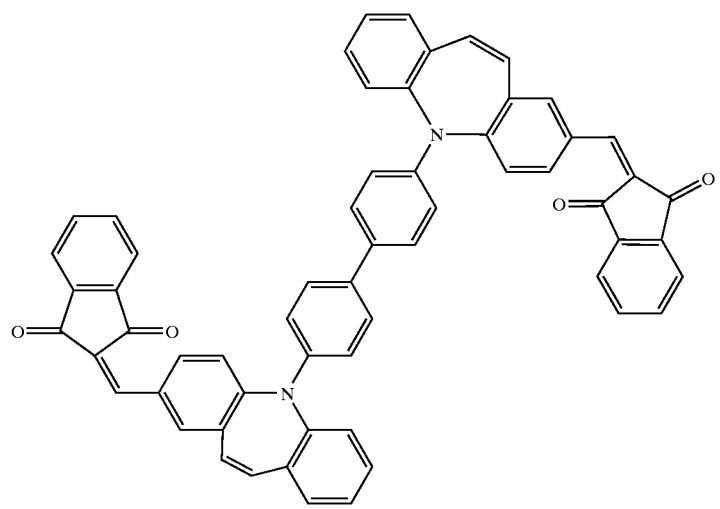
(E-35)
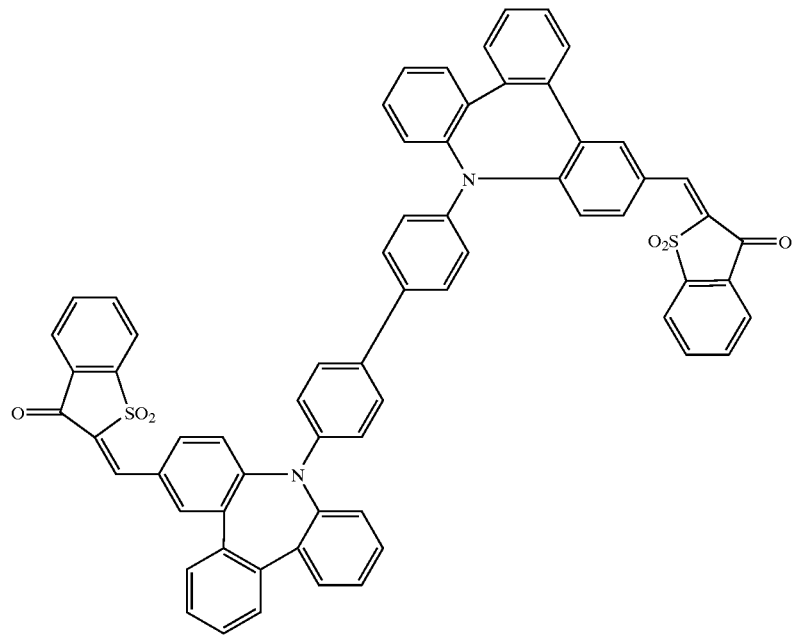
(E-36)
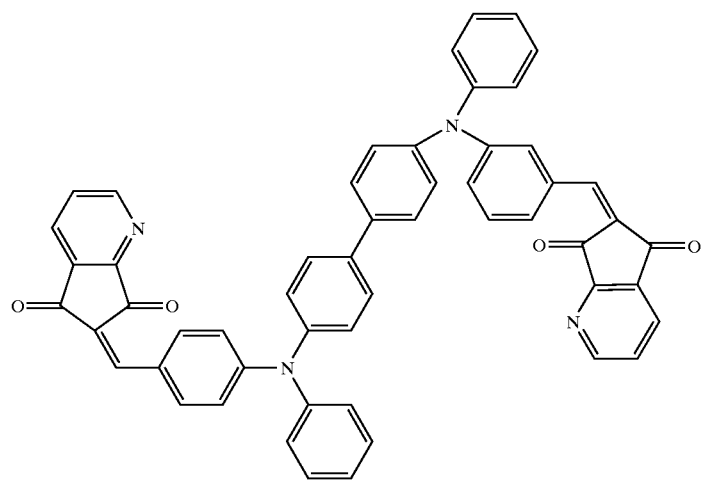

Syntheses of some of the present compounds represented by formula (I) are illustrated below.

Although various methods can be employed for synthesizing compounds represented by formula (I), the case of the method in which one aryl group of an arylamine compound is formylated and then made to react with an active methylene compound in the presence of a base is taken for illustration.

SYNTHESIS EXAMPLE 1

Synthesis of Compound (D-1) exemplified hereinbefore:

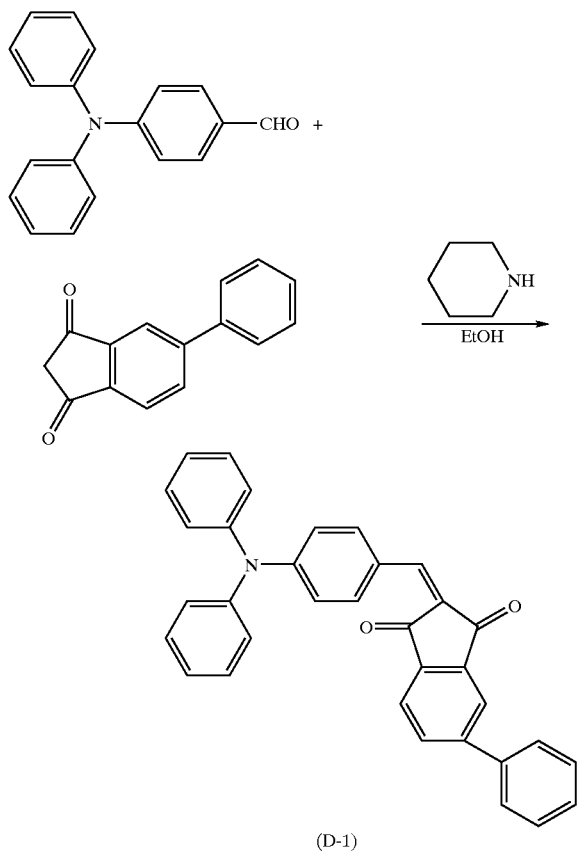

(D-1)

In 50 ml of ethanol, 2.7 g of 4-(N,N-diphenylamino)-benzaldehyde and 2.2 g of 5-phenylindane-1,3-dione were dissolved. Thereto, 1.0 g of piperidine was added, and heated under reflux for 3 hours. The resulting reaction solution was allowed to stand at room temperature, and crystals separated out during the standing. The crude crystals obtained was purified by column chromatography on silica gel, and then recrystallized from an ethanol-chloroform mixture to yield the desired product Compound (D-1). The product showed the absorption maximum λmax at 493 nm ($ClCH_2CH_2Cl$) and the melting point at 178–181° C.

SYNTHESIS EXAMPLE 2

The desired Compound (D-2) was synthesized using the same method as in Synthesis Example 1. The synthesis product showed the absorption maximum λmax at 512 nm and the melting point at 254–255° C.

SYNTHESIS EXAMPLE 3

The desired Compound (D-5) was synthesized using the same method as in Synthesis Example 1. The synthesis product showed the absorption maximum λmax at 468 nm.

SYNTHESIS EXAMPLE 4

The desired Compound (D-17) was synthesized using the same method as in Synthesis Example 1. The synthesis product showed the absorption maximum λmax at 484 nm.

SYNTHESIS EXAMPLE 5

The desired Compound (D-22) was synthesized using the same method as in Synthesis Example 1. The synthesis product showed the absorption maximum λmax at 469 nm.

SYNTHESIS EXAMPLE 6

The desired Compound (D-23) was synthesized using the same method as in Synthesis Example 1. The synthesis product showed the absorption maximum λmax at 471 nm.

SYNTHESIS EXAMPLE 7

The desired Compound (D-51) was synthesized using the same method as in Synthesis Example 1. The synthesis product showed the absorption maximum λmax at 492 nm.

SYNTHESIS EXAMPLE 8

The desired Compound (D-52) was synthesized using the same method as in Synthesis Example 1. The synthesis product showed the absorption maximum λmax at 495 nm.

SYNTHESIS EXAMPLE 9

The desired Compound (D-53) was synthesized using the same method as in Synthesis Example 1. The synthesis product showed the absorption maximum λmax at 507 nm.

SYNTHESIS EXAMPLE 10

The desired Compound (D-56) was synthesized using the same method as in Synthesis Example 1. The synthesis product showed the absorption maximum λmax at 426 nm.

SYNTHESIS EXAMPLE 11

The desired Compound (D-57) was synthesized using the same method as in Synthesis Example 1. The synthesis product showed the absorption maximum λmax at 527 nm.

SYNTHESIS EXAMPLE 12

The desired Compound (D-58) was synthesized using the same method as in Synthesis Example 1. The synthesis product showed the absorption maximum λmax at 432 nm.

SYNTHESIS EXAMPLE 13

The desired Compound (D-59) was synthesized using the same method as in Synthesis Example 1. The synthesis product showed the absorption maximum λmax at 451 nm.

SYNTHESIS EXAMPLE 14

The desired Compound (D-60) was synthesized using the same method as in Synthesis Example 1. The synthesis product showed the absorption maximum λmax at 428 nm.

Then, the electroluminescent (EL) device comprising an arylamine compound according to the invention (hereinafter referred to as the present compound) is illustrated below.

SYNTHESIS EXAMPLE 15

The desired Compound (E-2) was synthesized in accordance with the following reaction scheme:

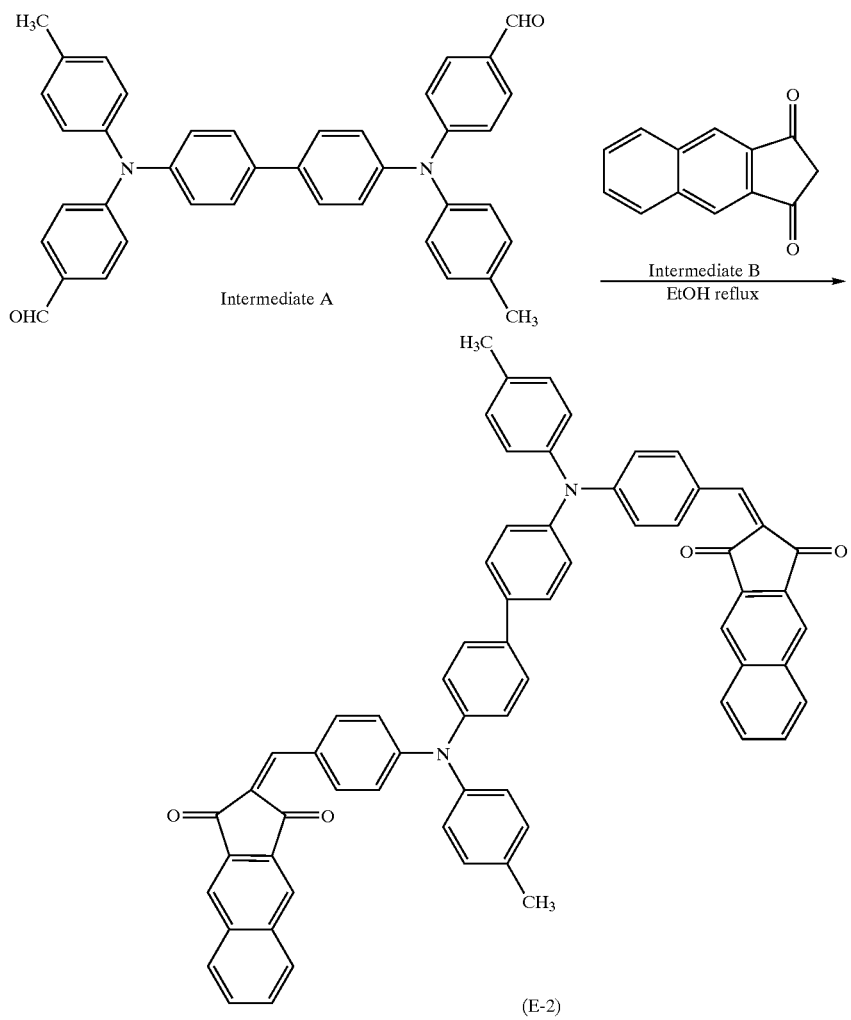

(E-2)

In 50 ml of ethanol, 2.3 g of Intermediate A and 0.8 g of Intermediate B were dissolved, and heated under reflux for 6 hours. The reaction solution was allowed to stand at room temperature, and thereby crystals were precipitated therefrom. These crude crystals were filtered off, and purified by chromatography on silica gel. Further, they were recrystallized from an ethanol-chloroform mixture to yield the desired product, or Compound (E-2).

Then, the electroluminescent (EL) device comprising an amine compound according to the invention (which is also referred to as the present compound) is illustrated below.

The organic layers of an EL device comprising the present compound have no particular restrictions as to the formation method. Various methods, such as a resistance heating-utilized vapor deposition method, an electron-beam heating method, a sputtering method, a molecular lamination method, a coating method and an ink jet method can be adopted. In particular, the resistance heating-utilized vapor deposition method and the coating method are favorable methods from the viewpoints of the characteristics imparted to the device and the efficiency in producing the device.

The present luminescent device is a device having a luminescent layer or two or more thin layers of organic compounds, including a luminescent layer, between a pair of electrodes, an anode and a cathode. The thin layers the device may have in addition to the luminescent layer are, e.g., a hole injection layer, a hole transfer layer, an electron injection layer, an electron transfer layer and a protective layer. The aforementioned layers each may have another function also. For forming each layer, various materials can be employed.

The anode supplies holes to a hole injection layer, a hole transfer layer and a luminescent layer. As a material for the anode, metals, alloys, metal oxides, electrically conductive materials and mixtures thereof, preferably materials having a work function of at least 4 eV, can be used. Examples of such materials include conductive metal oxides, such as tin oxide, zinc oxide, indium oxide and indium tin oxide (ITO), metals such as gold, silver, chromium and nickel, mixtures or laminates of those metals and conductive metal oxides, inorganic conductive materials such as copper iodide and copper sulfide, organic conductive materials such as polyaniline, polythiophene and polypyrrole, and laminates of those materials and ITO. Of the materials recited above, the conductive metal oxides are favored over the others. In particular, ITO is used to advantage from the viewpoint of productivity, conductivity and transparency. The suitable thickness of the anode, though can be selected depending on the anode material, is generally from 10 nm to 5 μm, preferably 50 nm to 1 μm, particularly preferably 100 nm to 500 nm.

The anode has on a soda lime glass, alkali-free glass or transparent resin substrate an anode material formed into a layer. In a case of using a glass substrate, alkali-free glass is preferred from the viewpoint of reduction in ions eluted from the glass. When soda glass is used as the substrate, it is desirable that the barrier coat, such as silica, be provided on the glass. The thickness of the substrate has no particular limitation as long as the substrate can ensure mechanical strength for the anode. For instance, the suitable thickness of a glass substrate is generally at least 0.2 mm, preferably at least 0.7 mm. The methods suitable for making the anode vary with the material used. In the case of ITO, for example, the film formation can be carried out using an electron-beam heating method, a sputtering method, a resistance heating-utilized vapor deposition method, a chemical reaction method (e.g., sol-gel method) or the method of coating a dispersion of indium tin oxide. Washing and other treatments for the anode enable the device to get a reduction in operating potential and improve in light-emitting efficiency. In the case of an anode using ITO, it is effective for the anode to receive UV-ozone treatment or plasma treatment.

The cathode supplies electrons to an electron injection layer, an electron transfer layer and a luminescent layer. In selecting the cathode, the adhesiveness to the electron injection, electron transfer or luminescent layer adjacent to the cathode, ionization potential and the stability are taken into consideration. As a material for the cathode, metals, alloys, metal halides, metal oxides, electrically conductive materials and mixtures thereof can be employed. Examples of such materials include alkali metals (e.g., Li, Na, K) and the fluorides thereof, alkaline earth metals (e.g., Mg, Ca) and the fluorides thereof, gold, silver, lead, aluminum, Na—K alloy or the mixture thereof, Li—Al alloy or mixture, Mg—Ag alloy or mixture, and rare earth metals (e.g., In, Yb). Of these materials, the materials having a work function of at most 4 eV are favored over the others. In particular, aluminum, Li—Al alloy or mixture, and Mg—Ag alloy or mixture are used to advantage. The cathode structure may be a single-layer of the compound or mixture as recited above or a laminate of the compounds and/or mixtures as recited above. The suitable thickness of the cathode, though can be selected depending on the cathode material, is generally from 10 nm to 5 $\mu$m, preferably 50 nm to 1 $\mu$m, particularly preferably 100 nm to 1 $\mu$m. Informing the cathode, various known methods, such as an electron-beam heating method, a sputtering method, a resistance heating-utilized vapor deposition method and a coating method, can be adopted. The metals as recited above may be evaporated independently, or two or more thereof may be evaporated simultaneously. Further, it is possible to evaporate a plurality of metals at the same time to form an alloy electrode, or to evaporate the previously prepared alloy. It is advantageous to the luminescent device that both anode and cathode have low sheet resistance, specifically several hundreds $\Omega/\square$ at the highest.

The material usable for a luminescent layer is a material capable of forming a layer which can function so as to receive both hole injection from the anode, the hole injection layer or the hole transfer layer and electron injection from the cathode, the electron injection layer or the electron transfer layer when the electric field is applied thereto, permit the charges injected therein to move and enable the emission of light by providing a place for recombining the holes and the electrons. As the material as defined above, the present amine compounds can be contained in the luminescent layer. In addition, other materials hitherto known to be luminescent, such as benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, perylene derivatives, perinone derivatives, oxadiazole derivatives, aldazine derivatives, pyraridine derivatives, cyclopentadiene derivatives, bisstyrylanthracene derivatives, quinacridone derivatives, pyrrolopyridine derivatives, thiadiazolopyridine derivatives, styrylamine derivatives, aromatic dimethylidyne derivatives, various metal complexes represented by metal or rare earth complexes of 8-quinolinol derivatives, and polymeric compounds such as polythiophene, polyphenylene and polyphenylene-vinylene, may also be used in the luminescent layer. Although the luminescent layer has no particular restrictions as to the thickness, the suitable thickness thereof is generally from 1 nm to 5 $\mu$m, preferably 5 nm to 1 $\mu$m, particularly preferably 10 nm to 500 nm.

As to the method of forming the luminescent layer, there is no particular restrictions, but various methods including a resistance heating-utilized vapor deposition method, an electron-beam heating method, a sputtering method, a molecular lamination method, a coating method (e.g., a spin coating, cast coating or dip coating method), an ink jet method and an LB method can be adopted. Of these methods, resistance heating-utilized vapor deposition and coating methods are favored over the others.

The materials for the hole injection layer and the hole transfer layer may be any materials so long as they have any one of the functions as an injector of the holes from the anode, a transfer or of holes and a barrier against electrons injected from the cathode. Examples of materials hitherto known to have one of such functions include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, and conductive polymers or oligomers, such as poly(N-vinylcarbazole) derivatives, aniline copolymers and thiophene oligomers or polythiophene. The thickness of the hole injection layer and the hole transfer layer each, though it has no particular limitation, is generally from 1 nm to 5 $\mu$m, preferably 5 nm to 1 $\mu$m, particularly preferably 10 nm to 500 nm. Each of the hole injection layer and the hole transfer layer may have a single-layer structure constituted of one or more of the materials recited above or a multiple-layer structure made up of at least two layers having the same composition or different compositions.

As a method of forming a hole injection layer and a hole transfer layer, a vacuum evaporation method, an LB method, an ink jet method and a method of coating a compound capable of injecting or transferring holes in the form of a solution or dispersion in an appropriate solvent (using, e.g., a spin coating, cast coating or dip coating method) can be adopted. In the case of a coating method, the compound can be dissolved or dispersed in the presence of a resin component (binder polymer). Examples of such a resin component include polyvinyl chloride, polycarbonate, polystyrene, polymethyl methacrylate, polybutyl methacrylate, polyester, polysulfone, polyphenylene oxide, polybutadiene, poly(N-vinylcarbazole), hydrocarbon resin, ketone resin, phenoxy resin, polyamide, ethyl cellulose, polyvinyl acetate, ABS resin, polyurethane, melamine resin, unsaturated polyester resin, alkyd resin, epoxy resin and silicone resin.

The materials for the electron injection layer and the electron transfer layer may be any materials so long as they have any one of the functions as an injector of the electrons from the cathode, a transfer or of electrons and a barrier against holes injected from the anode. Examples of compounds known to have such a function include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodimide derivatives, fluorenylidenemethane derivatives, distyrylpyrazine derivatives, heterocyclic tetracarboxylic acid anhydrides such as naphthaleneperylene, phthalocyanine derivatives, and various metal complexes represented by metal complexes of 8-quinolinol derivatives, metallophthalocyanine and metal complexes containing benzoxazole or benzothiazole ligands. The thickness of the electron injection layer and the electron transfer layer each, though it has no particular limitation, is generally from 1 nm to 5 μm, preferably 5 nm to 1 μm, particularly preferably 10 nm to 500 nm. Each of the electron injection layer and the electron transfer layer may have a single-layer structure constituted of one or more the compounds as recited above, or a multiple-layer structure made up of at least two layers having the same composition or different compositions.

As a method of forming the electron injection layer and the electron transfer layer, a vacuum evaporation method, an LB method, an ink jet method and a method of coating the compound(s) capable of injecting or transferring electrons in the form of a solution or dispersion in an appropriate solvent (using, e.g., a spin coating, cast coating or dip coating method) can be adopted. In a case of adopting the coating method, the electron-injecting or transferring compounds can be dissolved or dispersed in the presence of a resin component. Examples of a resin component usable therein include the same resins as employed for the hole injection and transfer layers.

The materials for a protective layer may be any substances so long as they have a function capable of inhibiting the invasion of a device deterioration promoter, such as moisture or oxygen, into the device. Examples of such a substance include metals, such as In, Sn, Pb, Au, Cu, Ag, Al, Ti and Ni; metal oxides, such as MgO, SiO, $SiO_2$, $Al_2O_3$, GeO, NiO, CaO, BaO, $Fe_2O_3$, $Y_2O_3$ and $TiO_2$; metal fluorides, such as $MgF_2$, LiF, $AlF_3$ and $CaF_2$; polyethylene, polypropylene, polymethyl methacrylate, polyimide, polyurea, polytetrafluoroethylene, polychlorotrifluoroethylene, polydichlorodifluoroethylene, copolymer of chlorotrifluoroethylene and dichlorodifluoroethylene, copolymers prepared by polymerizing a mixture of tetrafluoroethylene and at least one comonomer, and fluorine-containing copolymers having cyclic structures on the main chain; a water-absorbing substance having a water absorption rate of at least 1%; and a moistureproof substance having a water absorptivity of at most 0.1%.

The protective layer also has no particular restriction as to the formation method, but any of a vacuum evaporation method, a sputtering method, a reactive sputtering method, a molecular beam epitaxy (MBE) method, a cluster ion beam method, an ion plating method, a plasma polymerization method (high frequency excitation ion plating method), a plasma chemical vapor deposition (CVD) method, a laser CVD method, a heat CVD method, a gas source CVD method, a coating method and an ink jet method can be adopted for the formation thereof.

The present invention will now be illustrated in more detail by reference to the following examples. However, the invention should not be construed as being limited to these examples.

EXAMPLE 1

A transparent substrate having indium tin oxide (ITO) formed into a 150 nm-thick layer on a glass substrate measuring 25 mm×25 mm×0.7 mm in size (produced by Tokyo Sanyo Shinku K.K.) was etched and cleaned. Onto this substrate kept at room temperature, an about 40 nm-thick N,N'-bis(3-methylphenyl)-N,N'-diphenylbenzidine (TPD) film, an about 40 nm-thick film of a compound selected from the compounds set forth in Table 1 and an about 20 nm-thick tris(8-hydroxyquinolinato) aluminum (Alq) film were evaporated in that order under a vacuum of $10^{-3}$ to $10^{-4}$ Pa. On the organic thin film lamination thus formed, a patterned mask (for adjusting each emission area to 5 mm×5 mm) was set and further, inside the vacuum evaporator, Mg and Ag were deposited simultaneously in a Mg/Ag ratio of 10/1 to form a metallic film having a thickness of 250 nm, followed by deposition of a 300 nm-thick Ag film.

The thus produced organic luminescent device was made to luminesce by applying thereto a DC constant voltage by means of a source measure unit, Model 2400, made by Toyo Technica Co., Ltd. The luminance and wavelength of the luminescence obtained were measured with a luminometer BM-8 made by Topcon Co. and a spectrum analyzer PMA-11 made by Hamamatsu Photonics Co. respectively. The measurement results are shown in Table 1.

TABLE 1

| Device No. | Compound | Luminance (cd/m²) | Driving potential (V) | Luminescent wavelength λmax (nm) | CIE chromaticity coordinates (x, y) | Dark spots |
|---|---|---|---|---|---|---|
| 101 | Comparative Compound A | 210 | 14 | 600 | (0.55, 0.45) | x |
| 102 | Comparative Compound B | 100 | 14 | 645 | (0.62, 0.40) | x |
| 103 | Comparative Compound C | 500 | 12 | 546 | (0.45, 0.51) | Δ |
| 104 | Comparative Compound D | 800 | 12 | 612 | (0.57, 0.41) | ○ |
| 105 | Present Compound D-1 | 1300 | 12 | 614 | (0.61, 0.38) | ⊙ |
| 106 | Present Compound D-2 | 1200 | 14 | 648 | (0.65, 0.34) | ⊙ |
| 107 | Present Compound D-17 | 1100 | 13 | 646 | (0.62, 0.37) | ⊙ |
| 108 | Present Compound D-59 | 2700 | 12 | 610 | (0.60, 0.40) | ⊙ |
| 109 | Present Compound D-58 | 8500 | 12 | 536 | (0.35, 0.58) | ⊙ |

The symbols in Table 1 signify the following:
⊙: No dark spots can be confirmed by visual observation.
○: There are few dark spots.
Δ: There are many dark spots.
x: There are a great many dark spots.

The structural formulae of Comparative Compounds used are as follows:

Comparative Compound A

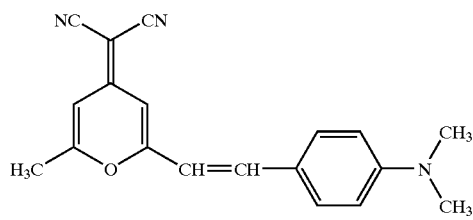

(DCM)

Comparative Compound B

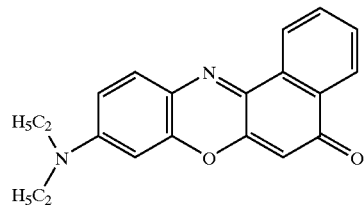

Comparative Compound C

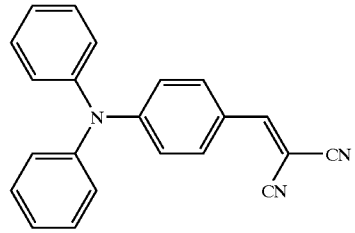

(The Compound Described in *J. Appl. Phys.*, (1998), 83, (8), 4403)

Comparative Compound D

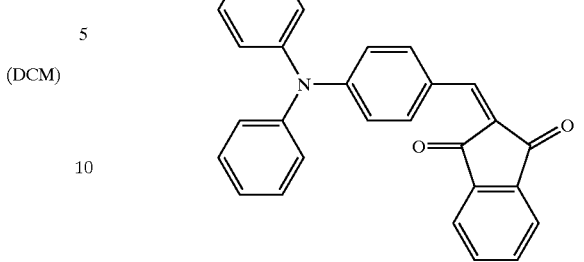

(The Compound Disclosed in JP-A-8-97465)

As can be seen from the results set forth in Table 1, the luminescent devices having luminescent layers made up of the present compounds alone gave off luminescence of high luminance at various wavelengths. This indicates that the present compounds are useful as a luminescent material enabling the planar luminescence of even quality. Moreover, the present compounds were found to ensure excellent durability. In particular, when the luminescent layer was formed using the present compound corresponding to the compound having a substituent group or a condensed ring on the 1,3-indandione nucleus of Comparative Compound D, which is described as an electron transferring material in JP-A-8-97465, the present compounds of such structures sharpened the tone and shifted the luminescence wavelength to the longer side to ensure high color purity in the luminescence, and further showed excellent durability. In addition, it was demonstrated that the present compounds having 3-phenyl-1-indanone as their respective acidic nuclei enabled the luminescence of particularly high luminance in the orange to yellow region.

EXAMPLE 2

After etching and cleaning an ITO substrate in the same manner as in Example 1, a TPD film having a thickness of about 40 nm was evaporated onto the ITO substrate, and further thereonto a compound selected from the compounds set forth in Table 2 and Alq (tris(8-hydroxyquinolinato) aluminum) were evaporated simultaneously at evaporation speeds of 0.04 Å/sec and 4 Å/sec respectively to form a film of about 60 nm. And then, a cathode was deposited in the same manner as in Example 1. The thus made luminescent devices were evaluated by the same method as in Example 1. The evaluation results obtained are shown in Table 2.

TABLE 2

| Device No. | Compound | Luminance (cd/m$^2$) | Driving potential (V) | Luminescent wavelength λmax (nm) | CIE chromaticity coordinates (x, y) |
|---|---|---|---|---|---|
| 201 | Comparative Compound A | 250 | 15 | 605 | (0.51, 0.48) |
| 202 | Comparative Compound B | 150 | 17 | 635 | (0.64, 0.33) |
| 203 | Comparative Compound C | 600 | 16 | 600 | (0.53, 0.48) |
| 204 | Comparative Compound D | 700 | 16 | 605 | (0.53, 0.44) |
| 205 | Present Compound D-1 | 900 | 16 | 625 | (0.60, 0.40) |
| 206 | Present Compound D-2 | 900 | 16 | 638 | (0.61, 0.37) |
| 207 | Present Compound D-17 | 800 | 16 | 630 | (0.60, 0.39) |

As can be seen from the results shown in Table 2, the use of the present compounds as doping dyes enabled the luminescence of high luminance and the production of planar luminescent materials of even quality. Further, it was found that the luminescent materials utilizing the present compounds as doping dyes had excellent durability.

EXAMPLE 3

On the ITO substrate etched and cleaned in the same manner as in Example 1, a solution containing 40 mg of poly(N-vinylcarbazole), 12 mg of 2-(4-biphenylyl)-5-(4-tert-butylphenyl)-1,3,4-oxadiazole (PBD) and 0.5 mg of a compound selected from the compounds set forth in Table 3 in 3 ml of 1,2-dichloroethane was spin-coated. The thickness of the organic thin film thus formed was about 120 nm. On the organic thin film, a cathode was formed in the same manner as in Example 1. The thus made luminescent devices were evaluated by the same method as in Example 1. The results obtained are shown in Table 3.

4-oxadiazole, 10 mg of 1,1,4,4-tetraphenylbutadiene, 0.5 mg of DCM and 0.1 mg of the present Compound D-1 in 3 ml of 1,2-dichloroethane was spin-coated. Thereon, a cathode was vacuum-deposited in the same manner as in Example 1.

The thus made device was examined for luminescent characteristics by applying DC voltage between the ITO electrode as anode and the Mg:Ag electrode as cathode. At the driving voltage of 15 V, the device gave off the white luminescence (luminance: 1300 cd/m$^2$) of (x, y)=(0.35, 0.36) on the CIE chromaticity coordinates. Thus, the present compound has proved to be effective for white luminescence.

EXAMPEL 6

A transparent substrate having a 150 nm-thick ITO layer on a glass base measuring 25 mm×25 mm×0.7 mm in size (produced by Tokyo Sanyo Shinku K.K.) was etched and cleaned. Onto this substrate kept at room temperature, an about 40 nm-thick N,N'-bis(3-methylphenyl)-N,N'-diphenylbenzidine (TPD) film, an about 40 nm-thick film of

TABLE 3

| Device No. | Compound | Luminance (cd/m$^2$) | Driving potential (V) | Luminescent wavelength $\lambda$max (nm) | CIE chromaticity coordinates (x, y) |
|---|---|---|---|---|---|
| 301 | Comparative Compound A | 220 | 17 | 600 | (0.53, 0.46) |
| 302 | Comparative Compound B | 120 | 17 | 645 | (0.62, 0.37) |
| 303 | Comparative Compound C | 300 | 16 | 580 | (0.51, 0.48) |
| 304 | Comparative Compound D | 350 | 16 | 612 | (0.55, 0.43) |
| 305 | Present Compound D-1 | 550 | 17 | 614 | (0.60, 0.39) |
| 306 | Present Compound D-2 | 500 | 17 | 645 | (0.62, 0.36) |
| 307 | Present Compound D-17 | 480 | 16 | 635 | (0.61, 0.39) |

As can be seen from the results shown in Table 3, the devices using the present compounds enabled the luminescence of high luminance under low driving voltage though they were made by the coating method generally providing low luminance to luminescent devices, compared with those using the comparative compounds.

EXAMPLE 4

Onto the ITO substrate etched and cleaned in the same manner as in Example 1, a TPD film having a thickness of about 40 nm was evaporated and then a film of the present Compound D-2 was evaporated in a thickness of about 80 nm, followed by vacuum deposition of the same cathode as in Example 1.

As to the result of examinations made in the same way as in Example 1, the thus made device showed the luminance of 50 cd/m$^2$ under the driving voltage of 15 V, and the red luminescence having high color purity of (0.65, 0.34), expressed in the CIE chromaticity coordinates (x, y), and its $\lambda$max at 631 nm was observed. Thus, the present compound has proved to be useful as an electron injecting and transfer agent besides acting as a luminescent substance.

EXAMPLE 5

On the ITO substrate etched and cleaned in the same manner as in Example 1, a solution containing 40 mg of poly(N-vinylcarbazole), 12 mg of 2,5-BIS(1-naphthyl)-1,3, a compound selected from the compounds set forth in Table 4 and an about 20 nm-thick tris(8-hydroxyquinolinato) aluminum (Alq) film were evaporated in that order under a vacuum of 10$^{-3}$ to 10$^{-4}$ Pa. On the organic thin film lamination thus formed, a patterned mask (for adjusting each emission area to 5 mm×5 mm) was set and further, inside the vacuum evaporator, Mg and Ag were deposited simultaneously in a Mg/Ag ratio of 10/1 to form a metallic film having a thickness of 250 nm, followed by deposition of a 300 nm-thick Ag film.

The thus prepared organic luminescent device was made to produce luminescence by applying thereto a DC constant voltage by means of a source measure unit, Model 2400, made by Toyo Technica Co., Ltd. The luminance and the wavelength of luminescence thus generated were measured with a luminometer BM-8 made by Topcon Co. and a spectrum analyzer PMA-11 made by Hamamatsu Photonics Co. respectively, thereby evaluating characteristics in the early stages. Further, the state of planar luminescence was observed after each device was made to produce luminescence for 100 hours by the operation at a constant current of 5 mA in an atmosphere of nitrogen. Furthermore, the thermal storage stability was evaluated by storing each device for 24 hours at 80° C. in an atmosphere of nitrogen, causing the device to produce luminescence and then observing the state of its luminous surface. The measurement results are shown in Table 4.

TABLE 4

| Device No. | Compound | Luminance (cd/m²) | Operating potential (V) | Luminescent wavelength λmax (nm) | CIE chromaticity coordinates (x, y) | Dark spots after producing luminscenc for 100 hours | Dark spots after 24-hours storage at 80° C. |
|---|---|---|---|---|---|---|---|
| 401 | Comparative Compound C | 500 | 12 | 546 | (0.45, 0.51) | x | x |
| 402 | Comparative Compound D | 800 | 12 | 612 | (0.57, 0.41) | Δ | x |
| 403 | Present Compound E-2 | 1200 | 14 | 645 | (0.65, 0.34) | ⊙ | Δ |
| 404 | Present Compound E-27 | 1500 | 15 | 640 | (0.64, 0.35) | ⊙ | Δ |

Comparative compounds C and D are the same as those used in Example 1.
The symbols in Table 4 signify the following:
⊙:No dark spots can be found by visual observation.
Δ:There are few dark spots.
x:There are many dark spot.

The results shown in Table 4 indicate that the use of the present compounds each as the only constituent of a luminescent layer enabled the resultant luminescent device to acquire satisfactory color purity (expressed in CIE chromaticity) and produce luminescence of high luminance. Further, few black spots were observed in the luminescent devices using the present compounds even after the devices continued to luminesce for many hours. This observation result proves that the present compounds ensured excellent durability for the luminescent devices. In addition, the luminescent devices prepared using the present compounds exhibited excellent planar luminescence and thermal storage stability.

EXAMPLE 7

Onto the ITO substrate etched and cleaned in the same manner as in Example 6 was evaporated a TPD film having a thickness of about 40 nm. Further thereonto, a compound selected from the compounds set forth in Table 5 and tris(8-hydroxyquinolinato)aluminum (Alq) were evaporated simultaneously at evaporation speeds of 0.04 Å/sec and 4 Å/sec respectively to form a film of about 40 nm. Furthermore thereonto was evaporated an Alq film having a thickness of about 20 nm, followed by evaporation of the same cathode as in Example 6. The thus prepared EL devices were evaluated by the same method as in Example 6. The evaluation results obtained are shown in Table 5.

TABLE 5

| Device No. | Compound | Luminance (cd/m²) | Operating potential (V) | Luminescent wavelength λmax (nm) | CIE chromaticity coordinates (x, y) | Dark spots after producing luminscenc for 100 hours |
|---|---|---|---|---|---|---|
| 501 | Comparative Compound C | 600 | 16 | 600 | (0.53, 0.46) | Δ |
| 502 | Comparative Compound D | 830 | 16 | 605 | (0.53, 0.44) | Δ |
| 503 | Present Compound E-2 | 950 | 16 | 635 | (0.61, 0.37) | ⊙ |
| 504 | Present Compound E-27 | 1060 | 16 | 630 | (0.60, 0.38) | ⊙ |

The Comparative Compounds C and D are the same as those used in Example 1.

As can be seen from the results shown in Table 5, the use of the present compounds as dopants enabled the luminescence of high luminance and the production of planar luminescent materials of even quality. Further, it has proved that the luminescent materials containing the present compounds as dopants had excellent durability.

EXAMPLE 8

On the ITO substrate etched and cleaned in the same manner as in Example 6 was spin-coated a solution containing 40 mg of poly(N-vinylcarbazole), 12 mg of 2-(4-biphenylyl)-5-(4-tert-butylphenyl)-1,3,4-oxadiazole (PBD) and 0.5 mg of a compound selected from the compounds set forth in Table 6 in 3 ml of 1,2-dichloroethane. The thickness of the organic thin film thus formed was about 120 nm. Onto the organic thin film, a cathode was evaporated in the same manner as in Example 6. The thus prepared EL devices were evaluated by the same method as in Example 6. The results obtained are shown in Table 6.

TABLE 6

| Device No. | Compound | Luminance (cd/m²) | Operating potential (V) | Luminescent wavelength λmax (nm) | CIE chromaticity coordinates (x, y) |
|---|---|---|---|---|---|
| 601 | Comparative Compound C | 300 | 16 | 580 | (0.51, 0.48) |
| 602 | Comparative Compound D | 350 | 16 | 612 | (0.55, 0.43) |
| 605 | Present Compound E-2 | 570 | 16 | 640 | (0.62, 0.36) |
| 606 | Present Compound E-27 | 600 | 17 | 635 | (0.61, 0.37) | the Comparative Compounds C and D are the same as those used in Example 1.

As can be seen from the results shown in Table 6, the devices using the present compounds enabled the luminescence of high luminance under low operating voltage though they were made by the coating method generally providing low luminance to luminescent devices, compared with those using the comparative compounds.

EXAMPLE 9

Onto the ITO substrate etched and cleaned in the same manner as in Example 6, a film of the present Compound E-2 having a thickness of about 60 nm was evaporated. Then, a Alq film having a thickness of about 40 nm was evaporated thereonto. Further thereon, the same cathode as in Example 6 was formed by vacuum deposition.

The evaluation results of the thus made device are as follows: The luminance under the operating voltage of 15 V was 550 cd/m², and the red luminescence having high color purity of (0.63, 0.35), expressed in the CIE chromaticity coordinates (x, y), and its λmax at 640 nm was observed. Thus, the present compound has proved to be useful as an electron injection and transfer agent besides acting as a luminescent substance.

EXAMPLE 10

Onto the ITO glass substrate etched and cleaned in the same manner as in Example 6, a N,N'-bis(1-naphthyl)-N, N'-diphenylbenzidine (NPD) film having a thickness of about 40 nm, a Compound D-2 film having a thickness of about 20 nm, a Bathocuproine film having a thickness of about 10 nm and an Alq film having a thickness of about 30 nm were evaporated in that order. Further thereon, the same cathode as in Example 6 was formed by vacuum deposition.

The evaluation results of the thus made device are as follows: The luminance under the operating voltage of 14 V was 1520 cd/m², and the red luminescence having high color purity of (0.63, 0.35), expressed in the CIE chromaticity coordinates (x, y), and its λmax at 643 nm was observed.

EXAMPLE 11

On the ITO glass substrate etched and cleaned in the same manner as in Example 6, a solution containing 40 mg of poly(N-vinylcarbazole), 12 mg of 2,5-bis(1-naphthyl)-1,3, 4-oxadiazole, 10 mg of 1,1,4,4-tetraphenylbutadiene and 0.1 mg of the present Compound D-2 in 3 ml of 1,2-dichloroethane was spin-coated. Thereon, a cathode was vacuum-deposited in the same manner as in Example 1.

The thus made device was examined for luminescent characteristics by applying thereto a DC voltage while using the ITO electrode as anode and the Mg:Ag electrode as cathode. At the operating voltage of 15 V, the device gave off the white luminescence (luminance: 1200 cd/m²) of (x, y)=(0.36, 0.35) on the CIE chromaticity coordinates. Thus, the present compound has proved to be effective for white luminescence.

ADVANTAGES OF THE INVENTION

When each of the particular amine compounds represented by formula (I) according to the present invention forms one constituent film of an EL device by themselves, the constituent film enables the EL device to exhibit luminescence of high luminance, especially red electroluminescence of high luminance and high color purity, compared with the films of conventional luminescent dyes, and can ensure excellent quality and high durability for planar luminescent devices. Further, the use of the present amine compound in an EL device of non-dope type enables the production of devices of almost even quality to carry an advantage of reducing the production cost. Moreover, even when the present organic EL devices are made by a coating method known to generally provide devices of low luminance, they can have excellent luminescent characteristics.

What is claimed is:

1. A luminescent device comprising at least one organic layer between electrodes, said at least one organic layer comprising at least one compound represented by formula (XIII):

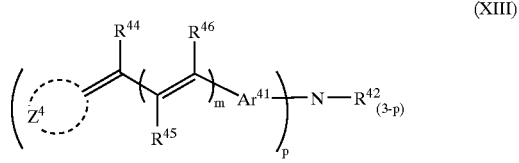

(XIII)

wherein $Ar^{41}$ represents an arylene group or a divalent heterocyclic group; $R^{42}$ represents an aryl group, a heterocyclic group or an aliphatic hydrocarbon group; $R^{44}$, $R^{45}$ and $R^{46}$ each represent a hydrogen atom or a substitutent group; $Z^4$ represents atoms forming a 5, 6 or 7-membered ring; m represents 0, 1 or 2; p represents 2 or 3, and two or three combinations made with $Ar^{41}$, $R^{42}$, $R^{44}$, $R^{45}$, $R^{46}$, $Z^4$ and m are the same or different.

2. The luminescent device of claim 1, wherein the compound of formula (XIII) is a compound represented by the following formula (XV):

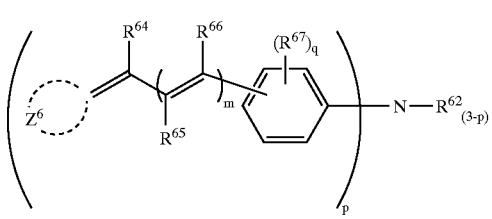

wherein $R^{62}$ represents an aryl group, a heterocyclic group or an aliphatic hydrocarbon group; $R^{64}$, $R^{65}$ and $R^{66}$ each represent a hydrogen atom or a substituent group; $R^{67}$ represents a substituent group; q represents an integer of 0 to 4, and when q is 2, 3 or 4 the $R^{67}$ groups are the same or different; $Z^6$ represents atoms forming a 5, 6 or 7-membered ring; m represents 0, 1 or 2; p represents 2 or 3, and two or three combinations made with $R^{62}$, $R^{64}$, $R^{65}$, $R^{66}$, $R^{67}$, $Z^6$, m and q are the same as or different from one another.

3. A luminescent device comprising at least one organic layer between electrodes, said at least one organic layer comprising at least one compound represented by formula (XVII):

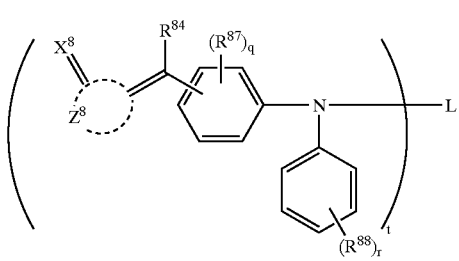

wherein $R^{84}$ represents a hydrogen atom or a substituent group; $R^{87}$ and $R^{88}$ each represent a substituent group; q represents an integer of 0 to 4, and when q is 2, 3 or 4 the $R^{87}$ groups are the same or different; r represents an integer of 0 to 5, and when r is 2, 3, 4 or 5 the $R^{88}$ groups are the same or different; $Z^8$ represents atoms forming a 5, 6 or 7-membered ring; $X^8$ represents an oxygen atom, a sulfur atom, N—$R^{A1}$ or $CR^{A2}R^{A3}$; $R^{A1}$, $R^{A2}$ and $R^{A3}$ each represent a hydrogen atom or a substituent group; t represents an integer of at least 2, and one combination made with $R^{84}$, $R^{87}$, $R^{88}$, $Z^8$, $X^8$, q and r is the same as or different from another combination made therewith; and L represents a t-valent linkage group.

4. The luminescent device of claim 3, wherein $Z^8$ represents 1,3-indanedione nucleus, a pyrazolone nucleus, an isooxazolinone nucleus, an oxaolinone nucleus, a furanone nucleus, an oxyindole nucleus, a 1-indanone nucleus, an imidazolidone nucleus, a benzothiophene-3-one nucleus, an oxobenzothiophene-3-one nucleus, a dioxobenzothiophene-3-one nucleus, a coumaranone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus.

5. The luminescent device of claim 4, wherein $Z^8$ represents 1,3-indanedione nucleus, a dioxobenzothiophene-3-one nucleus, a coumaranone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus.

6. The luminescent device of claim 5, wherein L represents phenylene, biphenylene or triphenylene.

7. The luminescent device of claim 5, wherein t represents 2 or 3.

8. The luminescent device of claim 3, wherein L represents phenylene, biphenylene or triphenylene.

9. The luminescent device of claim 3, wherein t represents 2 or 3.

10. A styrylamine compound comprising a structure represented by formula (XVIII):

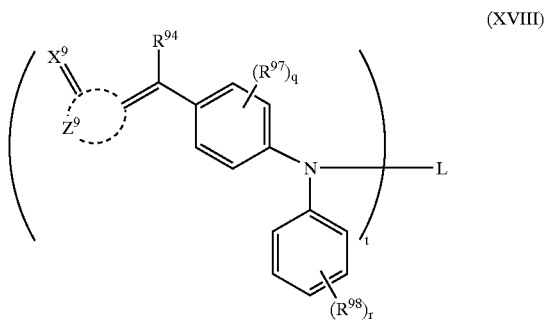

wherein $R^{94}$ represents a hydrogen atom or a substituent group; $R^{97}$ and $R^{98}$ each represent a substituent group; q represents an integer of 0 to 4, and when q is 2, 3 or 4 the $R^{97}$ groups are the same or different; r represents an integer of 0 to 5, and when r is 2, 3, 4 or 5 the $R^{98}$ groups are the same or different; $Z^9$ represents atoms forming a 5, 6 or 7-membered ring; $X^9$ represents an oxygen atom, a sulfur atom, N—$R^{A1}$ or $CR^{A2}R^{A3}$; $R^{A1}$, $R^{A2}$ and $R^{A3}$ each represent a hydrogen atom or a substituent group; t represents an integer of at least 2, and one combination made with $R^{94}$, $R^{97}$, $R^{98}$, $Z^9$, $X^9$, q and r is the same as or different from another combination made therewith; and L represents a t-valent linkage group.

11. The styrylamine compound of claim 10, wherein $Z^9$ represents 1,3-indanedione nucleus, a pyrazolone nucleus, an isooxazolinone nucleus, an oxazolinone nucleus, a furanone nucleus, an oxyindole nucleus, a 1-indanone nucleus, an imidazolidone nucleus, a benzothiophene-3-one nucleus, an oxobenzothiophene-3-one nucleus, a dioxobenzothiophene-3-one nucleus, a coumaranone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus.

12. The styrylamine compound of claim 11, wherein $Z^9$ represents 1,3-indanedione nucleus, a dioxobenzotbiophene-3-one nucleus, a coumaranone nucleus, a 2-thio-2,4-thiazolidinedione nucleus, a 2-thio-2,4-oxazolidinedione nucleus, a 2-thio-2,5-thiazolidinedione nucleus or a 2,4-thiazolidinedione nucleus.

13. The styrylamine compound of claim 12, wherein L represents phenylene, biphenylene or triphenylene.

14. The styrylamine compound of claim 12, wherein t represents 2 or 3.

15. The styrylamine compound of claim 10, wherein L represents phenylene, biphenylene or triphenylene.

16. The styrylamine compound of claim 10, wherein t represents 2 or 3.

* * * * *